United States Patent [19]

Scherer et al.

[11] Patent Number: 5,790,841
[45] Date of Patent: Aug. 4, 1998

[54] METHOD FOR PLACEMENT OF CLOCK BUFFERS IN A CLOCK DISTRIBUTION SYSTEM

[75] Inventors: Alisa M. Scherer, Sunnyvale; Frederick Weber, San Jose, both of Calif.

[73] Assignee: Advanced Micro Devices, Inc., Austin, Tex.

[21] Appl. No.: 632,966

[22] Filed: Apr. 15, 1996

[51] Int. Cl.$^6$ .................................................. G06F 1/10
[52] U.S. Cl. ............................................................ 395/558
[58] Field of Search ........................... 395/558; 364/488, 364/491

[56] References Cited

U.S. PATENT DOCUMENTS 5,172,330  12/1992  Watanabe et al. .................. 364/491
5,467,033  11/1995  Yip et al. ............................. 326/93
5,564,022  10/1996  Debnath et al. .................. 395/558 X Primary Examiner—Thomas M. Heckler
Attorney, Agent, or Firm—Skjerven, Morrill, MacPherson, Franklin & Friel LLP; Edward C. Kwok; Glen B. Choi

[57] ABSTRACT

A method for routing clock signals in an integrated circuit provides a hierarchical routing scheme in which the lowest level clock buffers are first placed row by row in preallocated locations and routed to the input pins of standard cells receiving the output clock signals of these clock buffers. Under the method, the number of clock buffers to be placed in each row is computed according to estimates of their load capacitances and expected wiring lengths within a window. The output buffers of the same clock signal are gridded or strapped together to minimize clock skew. A second level of clock buffers are then assigned to drive the lowest level buffers. The hierarchy can be extended to any number of higher levels, until clock signals are routed for the entire integrated circuit. The higher level clock signals can also be strapped or gridded to minimize clock skew.

9 Claims, 3 Drawing Sheets

1

METHOD FOR PLACEMENT OF CLOCK BUFFERS IN A CLOCK DISTRIBUTION SYSTEM

CROSS REFERENCE TO APPENDIX INCLUDING COMPUTER PROGRAM LISTINGS

Appendices A–H, which are integral parts of the present disclosure, include a listing of a computer program and its related data in one embodiment of this invention. This computer program listing contains material which is subject to copyright protection. The copyright owner, NexGen Microsystems Inc., which is also the Assignee of the present patent application, has no objection to the facsimile reproduction by anyone of the patent document or the present disclosure, as it appears in the Patent and Trademark Office patent files or records, but otherwise reserves all copyrights whatsoever.

BACKGROUND OF THE INVENTION

1. Field of the Invention

The present invention relates to integrated circuit designs. In particular, the present invention relates to the design of a distribution system for clock signals in an integrated circuit.

2. Discussion of the Related Art

"Clock skew" is a measure of uncertainty in the arrival times of a clock signal transition at different locations of a synchronous logic circuit, such as a microprocessor. Clock skews are undesirable since they adversely impact the operating frequency attainable by the logic circuit. Consequently, clock skews should be minimized. Clock skew can arise, for example, from RC delays in the interconnect wires between circuit elements, mismatches in the capacitive loads presented to clock buffers, and mismatches of driver sizes in clock buffers distributing the clock signals.

In the prior art, the clock distribution system (i.e. the placement of clock buffers and the routing of clock signals) in a full-custom microprocessor is often hand-crafted to minimize clock skew. Clearly, such procedure is time-consuming.

As the complexity of microprocessors grows, microprocessor designs have become "semi-custom". In a semi-custom design, building blocks such as macros (e.g. regularly placed memory cells), arrayed logic elements (e.g. elements in data paths and register files) and standard cells (e.g. "random" logic) are used. Such building blocks are typically developed with automatic tools, such as logic synthesis, automatic placement and routing tools, which render the design task highly automated and efficient. However, as the design tasks are automated, hand-crafting the clock distribution system has become highly complex and impractical.

Clock distribution in a semi-custom design must take into account the nature of the various building blocks in the circuit. For example, within a custom macro block, the designer can still carefully place each transistor, route the wires for the clock signals and, where necessary, provide careful buffering of clock signals. In such a design, the designer can specify a "zero-skew" point, which is typically an entry point of the clock signal into the macro. Because the designer maintains control over placement and routing of the clock signals, clock skews within a custom macro block can usually be controlled by design decisions.

Arrayed logic elements, which are highly regular and with planned wiring locations built-in, allow a disciplined clock signal distribution strategy, as the total clock loading for the array and appropriate placements of clock buffers can be fairly accurately determined. Often, however, such arrayed logic element are placed and routed by automated tools. Such tools must be carefully directed to achieve the desired routing of clock signals.

Logic circuits built from standard cells belong to the most difficult class of circuits to route clock signals. Standard cell designs are primarily generated using a logic synthesis tool. In such a design, the designer provides the logic synthesis tool with a set of logic equations which express the desired logic circuit functionally. The synthesis tool then generates the implementation of the logic circuit, selecting circuit elements (e.g. logic gates) from a standard cell library. Various optimization techniques are typically applied to achieve such objectives as high cell density and gate minimization. Thus, the designer usually has no accurate means for predicting the sizes and locations of the capacitive loads driven by the clock signals, so that the number of clock buffers needed to adequately drive these capacitive loads and their optimal placements are not known in advance. Further, even for minor modification of the circuit, the logic synthesis tool often generates a radically different circuit topology for the circuit, such that a different clock distribution network may be required with each modification.

Because macros, arrayed logic and standard cells can often all be found in a semi-custom circuit, such as a microprocessor integrated circuit, it is desirable to have an automatic design tool which takes into account the different natures of these building blocks in placing clock buffers and routing clock signals, so as to achieve minimal clock skew in the integrated circuit.

SUMMARY OF THE INVENTION

The present invention provides a method for assigning clock buffers and routing clock signals to various regions of an integrated circuit with minimal clock skew. According to the present invention, a preassigned clock buffer area is allocated to each of various regions of an integrated circuit. In accordance to one aspect of the present invention, a method is provided which is particularly suited to assigning clock buffers in an area where the logic circuit is implemented by standard cells. According to this method, for each clock signal to be routed and for each row of the standard cells, the following steps are carried out: (a) identifying those standard cells receiving the clock signal, (b) associating an input capacitance with each of the identified standard cells, (c) for each identified standard cell, deriving a wire capacitance associated with the identified standard cell, the wire capacitance being derived by estimating a length of wire necessary to electrically couple the clock signal from the assigned buffer area to the identified standard cell, and (d) deriving a row capacitance by summing all of the input capacitances and the wire capacitances within the row of standard cells. Then, this method selects, in a predetermined order, each row of the standard cells, and performs, for the selected row of standard cells, the steps of (a) determining a window capacitance by summing row capacitances for selected rows of standard cells neighboring the selected row of standard cells, (c) determining a number of clock buffers to assign to the selected row of standard cells by dividing the window capacitance by the preferred load and a number derived from the number of the neighboring rows of standard cells, and (d) placing the number of clock buffers within the assigned buffer area.

The method of the present invention can be performed in conjunction with a sliding window moving from a row closest to one side of the area towards the opposite side of the area. In that approach, a predetermined number of neighboring rows of standard cells are included in the sliding window for each row of standard cells for which a clock buffer placement is considered. According to another aspect of the present invention, the output terminals of the clock buffers are strapped by wires running orthogonal to the standard cell rows. In one embodiment, the row capacitance is computed taking into consideration the per row capacitance of the strapping wire.

According to another aspect of the present invention, the method is also applicable to circuits implemented by arrayed logic or macros. In such a region where standard cells may not necessarily be included, the method of the present invention allocates an assigned buffer area, as before, and for each instance receiving the clock signal, whether the instance is built from macro or arrayed logic, the method (a) estimates an input capacitance of the instance associated with the clock signal, and (b) estimates a wire capacitance based on a length of wire needed to couple the clock signal from the assigned buffer area to the instance. In such a region, the clock buffers are assigned based on the sum of the input capacitances of all the instances and estimates of the wire capacitances for connecting the clock buffers to the instances, and dividing such sum by the preferred load. By including in the method different approaches to buffer assignments for different regions of the circuit built using different building blocks, e.g. macros, arrayed logic and standard cells, the present invention allows the clock buffers in each region to be substantially equally loaded, so that clock skew can be uniform, regardless of the building block technology used in each region.

The method can be used to create a hierarchical clock distribution system, in which the clock buffers in the various assigned buffer areas throughout the chip are driven by a higher level set of clock buffers. According to that aspect of the present invention, the higher level clock buffers are assigned to a second level assigned buffer area. The number of clock buffers assigned to such second level assigned buffer area is computed by the number of lower level clock buffers that are to be driven, divided by the preferred load.

According to another aspect of the present invention, each level in the hierarchical clock distribution system are strapped together to minimize clock skew. Further, where the clock signals includes an operating clock and one or more test clocks, the operating clocks are routed between the test clocks, so as to be isolated from signal lines that are active during the time the operating clock is also active, thereby minimizing noise in the circuit.

The present invention is better understood upon consideration of the detailed description below and the accompanying drawings.

DETAILED DESCRIPTION OF THE PREFERRED EMBODIMENTS

The present invention provides a method and an automatic tool for (I) analyzing a logic circuit implemented by any combination of custom macros, arrayed logic elements, and standard cells, so as to estimate the expected capacitive loads of clock signals, (ii) determining the number of clock buffers necessary to drive these capacitive loads, so as to minimize clock skews, and (iii) causing the placements of such clock buffers and routing their output signals throughout the logic circuit. The method of the present invention uses a hierarchy of clock buffers to provide a distribution system for clock signals.

Figure 1:
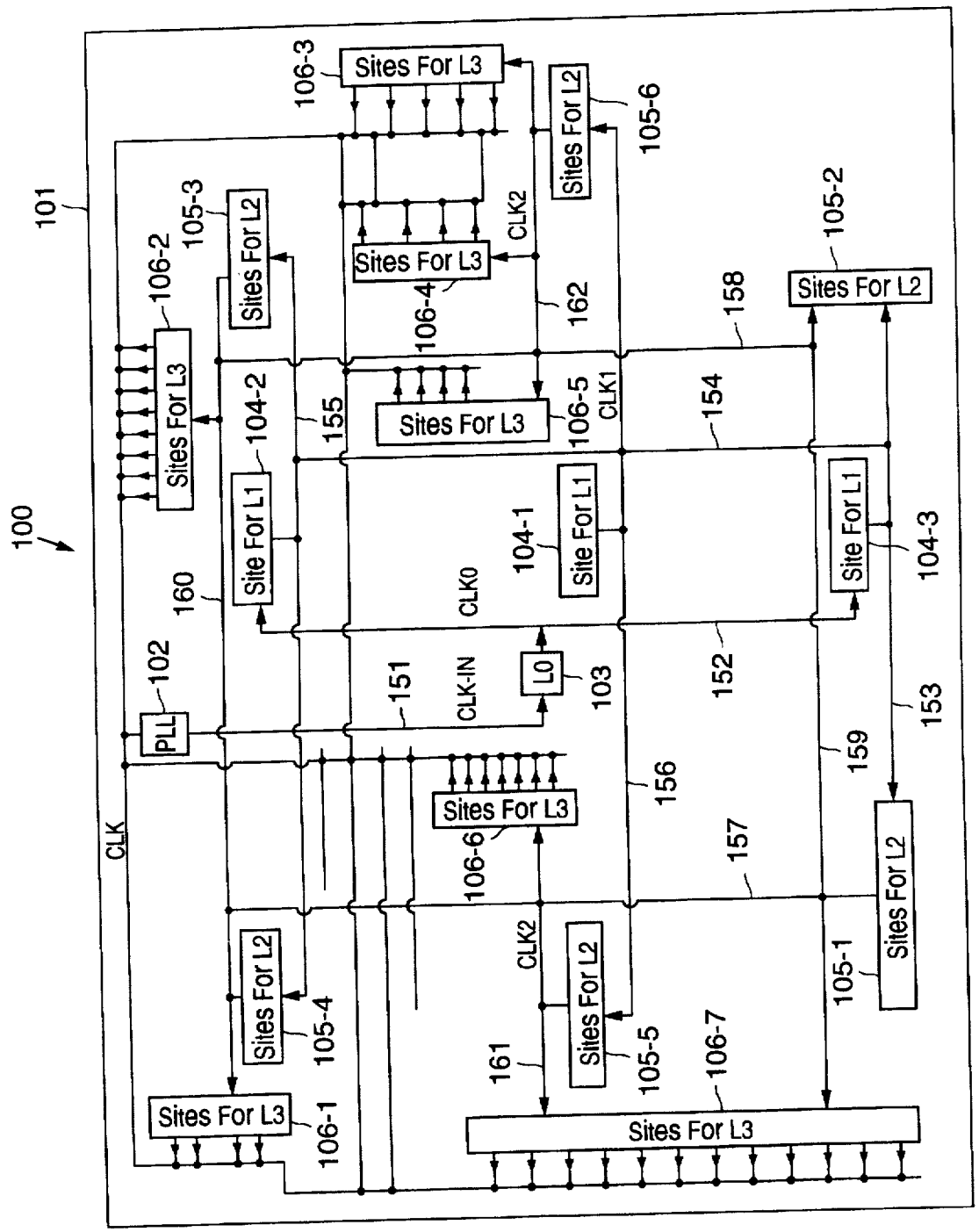
FIG. 1 shows a clock distribution system 100, implemented on an integrated circuit 101, in accordance with the present invention.

FIG. 1 illustrates the present invention by a clock distribution system 100, which is implemented in an integrated circuit 101. As shown in FIG. 1, integrated circuit 101 includes a phase-locked loop circuit 102, which provides a clock signal "CLK_IN" on a metal trace 151. Metal trace 151 is coupled to clock buffers 103. Although not shown, phase-locked loop circuit 102 receives an external reference clock signal as a time base. Clock buffers 103 together provide an amplified signal "CLK0" on metal trace 152, running in a direction orthogonal to metal trace 151. Signal CLK0 is coupled by metal trace 152 to clock buffers 104-1, 104-2 and 104-3. In turn, clock buffers 104-1, 104-2 and 104-3 together provide an amplified output signal "CLK1" on metal traces 156, 155, and 153, which are shorted or gridded by metal trace 154. Gridding allows the signal wavefront of clock signal "CLK1" to be as uniform as possible at all recipient locations of the signal, thereby minimizing clock skew. To this end, clock buffers 104-1 to 104-3 are preferably matched to each other in their respective drive characteristics. Using a large number of small identical clock buffers is one method for achieving uniformity. For convenience, clock buffers 104-1 to 104-3 are referred to as "level 1 buffers". Metal traces 153–156 couple clock signal "CLK1" to clock buffers 105-1 to 105-6. Clock buffers 105-1 to 105-6 together provide an amplified output signal "CLK2" on metal traces 159–162, which are shorted or gridded by metal traces 157–158, running orthogonally to metal traces 159–162, to become a single electrical node. Clock buffers 105-1 to 105-6 are referred to as "level 2 buffers". Finally, clock signal CLK2 are coupled by metal traces 157–162 to clock buffers 106-1 to 106-7 ("level 3 buffers") for distribution to all clocked elements of integrated circuit 101, e.g. flip-flops, registers and counters. Each of the level 3 buffers is responsible for driving the clock signal to clocked elements located within its respective specifically allocated area of integrated circuit 101. In this embodiment, although not necessary, all levels of clock buffers are gridded. In some applications, gridding at the lowest level may be sufficient to achieve the desired wavefront uniformity at the clocked elements. Although FIG. 1 shows four levels of clock buffers: a level 0 buffer (i.e. clock buffers 103), level 1 buffers, level 2 buffers and level three buffers, any number of levels of clock buffers can be implemented within the scope of the invention.

Clock distribution system 100 can be achieved by a method of the present invention to be discussed next. This method can be implemented in a computer program to work compatibly with conventional computer-aided design tools, such as logic synthesis tools, and cell placement and routing tools. An embodiment of the present invention is described in conjunction with a program ClockRoute2, which is implemented in a scripting language "Perl". The Perl language is well-known among those skilled in the art. The source code for ClockRoute2 is included herein as Appendix A. Subroutines that are discussed in the description below can all be found in Appendix A. Perl interpreters can be found in many computers running an implementation of the Unix operating system. The Unix operating system is also well-known among those skilled in the art.

Figure 3:
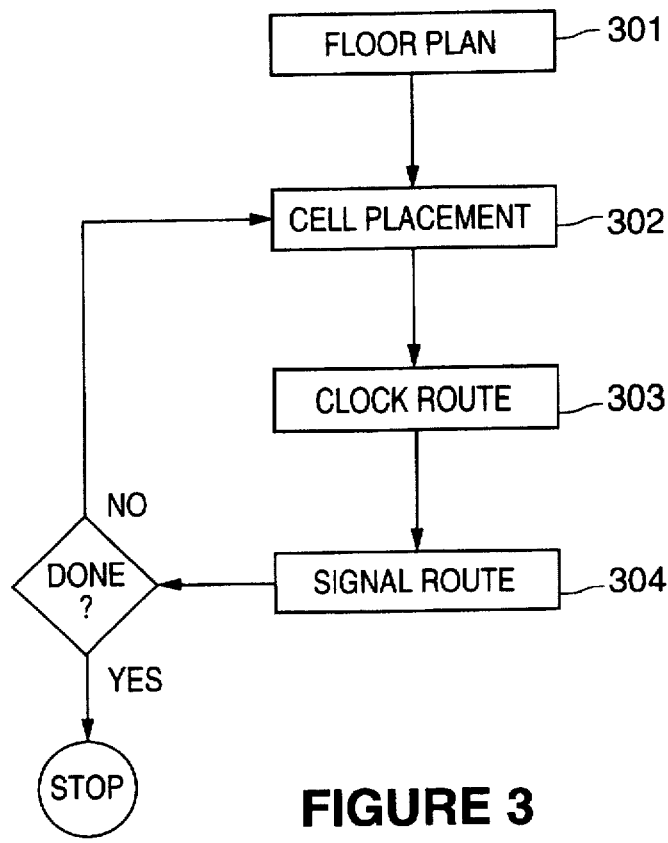
FIG. 3 illustrates one method of using program ClockRoute2 in conjunction with a standard cell design.

Program ClockRoute2 can be used in conjunction with a conventional automatic routing tool, such as Cell3, available from Cadence Design Systems, Inc., San Jose, Calif. For example, FIG. 3 illustrates how program ClockRoute2 can be used in the design activities of an integrated circuit which includes standard cells. First, a floor planning step 301 divides the "silicon real estate" of the integrated circuit into a number of regions, each including a preassigned clock buffer area. Division of the integrated circuit into regions is often determined by both the functionality required and the technology used. For example, one region may be allocated to an array of on-chip memory, which is to be separately considered from another region for control logic, since a memory circuit is often implemented by a custom macro and control logic is usually implemented by standard cells. In this example, floor planning step 301 also includes allocating room for routing wide metal traces for routing output signals of level 2 buffers and for strapping the input and output terminals of level 3 buffers. In the present example, all clock signals are routed using two metallization levels, referred to as "M4" and "M5". Typically, such metallization levels are required to be routed in orthogonal directions. For convenience, the direction along traces in M4 is referred to as "horizontal", and the direction along traces in M5 is referred to as "vertical". In this embodiment, wide M4 traces are used to route signals between level 2 buffers and level 3 buffers. Input and output terminals of Level 3 buffers are strapped by M5 metal traces.

After floor planning step 301 appropriately divides the integrated circuit, at step 302, a placement program is run to place standard cells into appropriate regions allocated by floor planning step 301. Prior to routing signals among the standard cells placed, program ClockRoute2 is called at step 303 to calculate, for each region, the number of actual clock buffers required, and to place them. As discussed below, program ClockRoute2 also places wires to connect the placed level 2 buffers and the level 3 buffers to the planned M4 and M5 traces provided at floor planning step 301. Step 303 also assigns M4 traces from the planned M5 traces to clocked elements of the instances placed in placement step 302. Because ClockRoute2 assign M4 and M5 traces prior to a router routes signals among the standard cells, clock signals are given precedence in the use of the integrated circuit's routing resources.

At step 304, a routing tool (e.g. Cell3) is called to automatically route signals among the standard cells and the clock buffers. The designer is then given a chance to evaluate the result of the routing. If any further modification is required, as is sometimes necessary, e.g. if additional requirement needs to be imposed on certain signals, steps 302–304 can be repeated until a satisfactory routing result is achieved.

Program ClockRoute2 receives three input files: (I) a control file, which provides input control data to program ClockRoute2, (ii) a "def" file, which lists the instances of pins, vias, components, and nets in the design, including their placement locations and cell types, and (iii) a "verilog" file, which provides the netlist of the design described in the "def" file. The verilog file is provided in the "Verilog" hardware description language, which is also well-known among those skilled in the art. An example verilog file is included herein as Appendix D for reference. The input verilog file includes dummy clock buffer cells. As discussed above, under the present invention, these dummy clock buffer cells are substituted by instantiation of actual clock buffer cells by program ClockRoute2, according to its estimation of wire and cell capacitances required to be driven by the clock buffers.

Program ClockRoute2 provides three output files: (I) a log file which reports errors and summary statistics and figures of merit, such as the number of buffers placed and the average capacitance driven by these buffers; (ii) a modified "verilog" file which includes the actual clock buffers which program ClockRoute2 substitutes for the dummy clock buffer cells in the input verilog file; (iii) an "Addwire" file, which lists addwire directives for instructing the routing tool Cell3 to route both the clock signals from the actual clock buffers to the instantiated cells of the "def" file and metal traces for gridding purposes; and (iv) a modified "def" file including the instances of the added clock buffers and vias. The Addwire file is in a format understood by the routing tool Cell3. Of course, upon consulting this detailed description, one skilled in the art would be able to modify program ClockRoute2 to accept the input files in other conventional hardware description language formats, to work with any conventional routing tool, and to provide output files in other conventional hardware description language formats.

Figure 2:
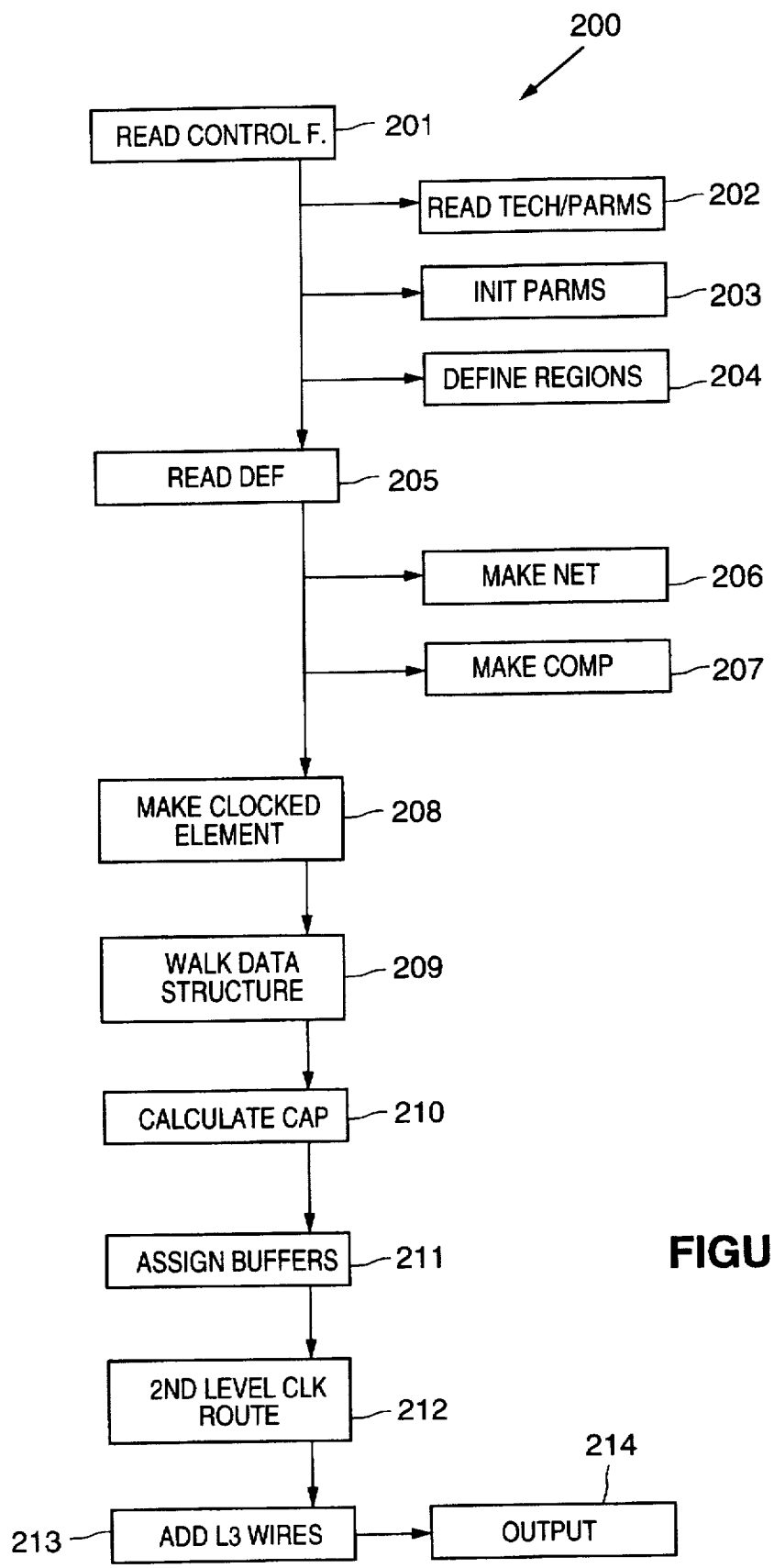
FIG. 2 is a flow diagram 200 illustrating the control flow of a program ClockRoute2, which is an embodiment of the present invention.

FIG. 2 is a flow diagram 200 illustrating the control flow of program ClockRoute2. In this example, to focus on the present invention, only two levels of clock buffering (level 2 buffers and level 3 buffers) are discussed. However, it would be apparent to those skilled in the art from this illustrative example of program ClockRoute2 that additional levels of clock buffering can be provided using the same principles discussed herein.

As shown in FIG. 2, at step 201, program ClockRoute2 parses the input control file. An example of the input control file is provided in Appendix C. The control file is read by the subroutine ReadControlFile. Subroutine ReadControlFile supports two types of directives: (a) global, and (b) clock regional. Global directives are applicable to the entire design. Clock regional directives are applicable only within a defined "box" or "clock region". The several types of defined clock regions are discussed below. Global directive supported include the following directives: "Techfile", "ParmFile", "Buffer", "ClockDriveMult", "Grid", "RowHeight", "RowLookahead", "M4Cap", "M4Mult", "M5Cap", "M5Mult", "M5Width", "Orientation", "L2Master", "L3Master", "BufCap", "AllowClock", "DeleteCells", "BlockedCell", "M5Offset", "AddWire", "C4Row", "M4Row". Clock regional directives are set forth along with each clock region defined by the "ClockBox", "SPBox", and "L2Box" directives. The "ClockBox" directive is usually used to define clock regions for standard cell blocks. The "SPBox" directive is typically used to route clock signals in arrayed logic blocks. Higher level clock regions are specified by the "L2Box" directive. Within a clock region defined by ClockBox, the following directives are supported: "Buf", "NumBuf", "NoBuffer", "Load", "RowPreWire", "NoWire", "RowStrapToEdge", "NoStrap", "RightStrap", and "LeftStrap". Within a clock region defined by "SPBox" ("special region"), the directive "Place" is supported. Within the clock region defined by directive "L2Box" ("second level region"), the directives "Wireload", "Buf", "NumBuf", and "NumRow" are supported.

The "TechFile" and the "ParmFile" directives references a technology and a parameter file, respectively. The technology file contains the per unit length capacitances for minimum-width metal traces in the metallization levels. A parameter file contains the capacitances for the cells specified in the file. Typically, there may be a number of parameter files, but one technology file. At step 202, subroutine ReadControlFile calls subroutine ReadTechFile to read the technology file. Similarly, subroutine ReadControlFile calls subroutine ReadParm to read a parameter file.

ReadControlFile initializes parameters used in subsequent capacitance estimation and clock signal routing as it reads the remaining global directives at step 203. The directive "Buffer" defines the clock buffer to be used. Directive "Buffer" receives the name of the buffer cell, the optimal load capability, the names of the input and output signals in the cell definition, the input capacitance for the cell, and other dimensional attributes of the buffer cell. In the example control file of Appendix C, the "Buffer" directive specifies a buffer cell "L3CKBUF" to be 1800 data base unit wide and having a 0.7 pF optimal drive capability. The directive "ClockDriveMult" allows program ClockRoute2 to use, in conjunction with a specified signal, a specified factor to scale the buffer cell's optimal drive value when the buffer cell is used to drive the specified clock signal. ClockDriveMult is useful, for example, for a design with scan test capability. In such a design, as shown in the control file of Appendix C, the scan clock SC1, which is only used during testing, can be scaled by the factor 4. In other words, in that example, buffer cell L3CKBUF would have an optimal drive capability of 2.8 pF for clock signal SC1 and 0.7 pF for clock signal PH1. The ClockDriveMult directive conserves routing resources for by allowing selected clock signals to be driven at a higher skew tolerance. For example, while clock signal PH1 is expected to operate at a clock rate exceeding 150 MHz , scan clock SC1 may operate only at a rate of 10 MHz, and thus can tolerate a much higher clock skew.

The directives "Grid" and "RowHeight" respectively specify the spacing between grid points in database units and the height of a standard cell in that design, also in database units. For example, in Appendix C, grid points are specified to be 180 data base units apart, and each standard cell is 3240 data base units tall. The directive "RowLookahead" defines a "window", specified by a number of rows of standard cells, within which program ClockRoute2 takes into consideration all capacitances seen by a clock signal in computing for the assignments of actual clock buffers at any given time. The control file of Appendix C, for example, specifies a RowLookAhead of 2, representing a window including only two rows of standard cells, or 6560 data base units in the y-coordinates.

The directives "M4Cap", "M4Mult", "M5Cap", "M5Mult" define respectively the per unit length capacitance for a minimum-width metal trace in M4, a multiplier to scale the value of M4Cap, the per unit length capacitance for a minimum-width metal trace in M5 and a multiplier to scale the value of M5Cap. M4Mult and M5Mult are provided to allow capacitances be calculated based on wires that are wider than minimum-width. In this detailed description, the terms "wire" and "metal trace" are used interchangeably, unless particularly noted.

The directive "M5Width" specifies the width of an M5 strap to be used with the input and output signals of a clock buffer. In the example of Appendix C, a M5Width of 260 data base units is specified. The directive "Orientation" defines the orientation of the clock buffer cell, with respect to the ground rail of the "bottom" standard cell row. In this detailed description, the terms "top" and "bottom" refer to the greatest y-coordinate and the least y-coordinate, respectively. Current orientations supported are (I) "N", which is the orientation of a standard cell with the ground rail at the bottom, (ii) "S", which is an "N" standard cell reflected about the X-axis, (iii) "FN", which is the "N" standard cell reflected about the Y-axis, and (iv) "FS", which is the "S" standard cell reflected about the Y-axis. All cells in a standard cell row, including any clock buffer cell, should have the same orientation. A cell placed in an incorrect orientation risks shorting the power rails.

The "L2Master" and "L3Master" directives define the names of the dummy clock buffer cells for level 2 buffers and level 3 buffers, respectively. For example, in the control file of Appendix C, dummy buffer cells "Buf_MASTER_CLK3", "Buf_MASTER_SC13", and "Buf_MASTER$_{13}$SC23" represents preassigned buffer areas for placing level 3 buffers of clock signals "PH1", "SC1", and "SC2" respectively. The "BufCap" directive specifies the input capacitance to be used with the clock buffer cell. The "AllowClock" directive, which receives as arguments the names of a pin and a cell, allows a clock signal to connect to the specified pin of the specified cell. The "DeleteCells" directive deletes, from the "def" file, cells with names matching a regular expression (e.g. in the control file of Appendix C, the regular expression "EROM_ROMBIST_SUB_297U1n" is used, where n is any string of numerals). The "BlockedCell" directive defines a cell for special handling. In this implementation, special handling requires AddWire statements to be confined to the top or bottom of the cell, and prevents routing of any strapping or prewires (discussed below) within the cell (i.e. no routing of clock signals over the cell).

The directive "M5offset" defines a value to be used when offsetting an M5 metal trace. The directive "AddWire" specifies a wire to be added. "AddWire" can be specified with either the "viasat" or the "noviasat" keyword, both inside and outside a clock region. When specified with the "viasat" keyword, the wire added by the AddWire directive will also be shorted by vias to all metal traces the added metal trace crosses which carry the same signal. The "C4Row" directive defines rows where M5 wires turn to avoid "C4 pads"[1]. No strapping or prewires can thus be added to a row specified by directive "C4Row". The directive "M4Row" defines where M4 (i.e. "horizontal") strapping to the locations of input and output pins of the level 2 buffers occur. M4Row also associates a clock set with each of the input and output pin locations. A clock set defines the vertical order, with respect to a power rail, in which the clock signals in the clock set should appear. For example, in the control file of Appendix C, the M4Row statement specifies M4 straps in rows 0 and 1 (i.e. 3240) for the input and output terminals of level 2 buffers, respectively, with an offset of 720 for the input clock set {SC1_1 PH1_1 SC2_1} and an offset of 945 for the output clock set {SC1_2, PH1_2, SC2-2}.

[1] C4 pads are special structures in this implementation formed in M5 to allow the integrated circuit to be bonded to a "flip chip" package. C4 pads are neither necessary nor related to the practice of the present invention.

Figure 4:
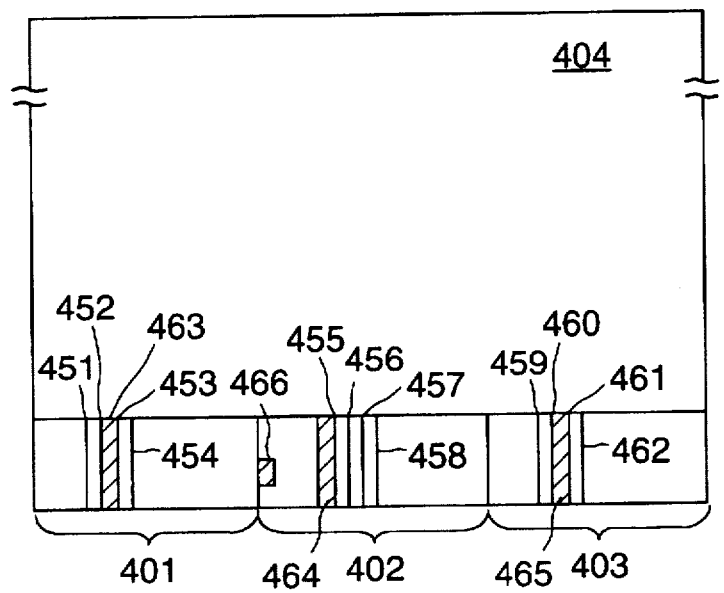
FIG. 4 depicts an example of locations for four ClockBoxes, 401-404.

Upon completing initialization, ReadControlFile reads in the clock regions at step 204 (FIG. 2). As mentioned above, three kinds of clock regions can be specified: ClockBox, SPBox and L2box. Each kind of clock region can be specified by location. In addition, an SPBox can be specified by instance name, as in the example of the control file of Appendix B. FIG. 4 shows the locations of the four Clock-Boxes and an L2Box in the example of Appendix C. In program ClockRoute2, each clock region is specified by a name and its lower-left and upper-right x- and y-coordinates. Thus, in the example of Appendix C, Clockbox ClockBox1 is provided lower-left coordinates of (0,0) and upper-right coordinates (150000, 16200), which is shown qualitatively (i.e. not to scale) in FIG. 4 as clock region 401. Likewise, ClockBox2, ClockBox3 and ClockBox4 are shown in FIG. 4 as clock regions 402, 403 and 404 respectively. As specified, ClockBox1, ClockBox2 and ClockBox3 each have a height of five rows of standard cells. L2Box l2box1 of Appendix C, having lower-left and upper-right coordinates (0,0) and (445680, 16200), overlaps clock regions 402, 403 and 404. In FIG. 4, M5 metal traces 451 and 452 are provided in clock region 401 for strapping the input terminals PH1_2 and SC1_2 for the clock buffers of clock signals PH1 and SC1. Likewise, M5 traces 453 and 454 are provided for strapping the output terminals PH1 and SC1 of the clock buffers of signals PH1 and SC1. M5 traces 451-454 are specified by directive "ClockWire", which defines, for a specified clock signal, the center x-coordinates of M5 traces for strapping the input and output pins of the clock buffers. In the same manner, M5 traces 455-458, 459-462 are provided for strapping of input and output terminals of the clock buffers of clock regions 402 and 403. In clock region 401, the shaded area 463 between M5 traces 452 and 453 represents the preassigned buffer area, i.e. dummy buffer cells, for placing the clock buffers. The location of the preassigned buffer area is specified by the "Buf" directive. Similarly, shaded areas 464 and 465 represent the preassigned buffer area for clock regions 402 and 403. These preassigned buffer areas, although shown in FIG. 4 to between the M5 traces in clock regions 401 and 403, and to the left of the M5 traces in clock region 402, can be located anywhere within the clock region. Area 466 is the area of the preassigned buffer area for level 2 buffers of L2Box l2box1.

In a ClockBox, the clock buffer rows are arrayed vertically, each row providing a number of sites specified by the "NumBuf" directive. When a buffer is placed within the allocated site, the input pin of the clock buffer instance is then strapped by an M4 trace to the M5 metal trace strapping the input clock signal. Likewise, the output pin of the clock buffer instance is strapped by an M4 metal trace to the corresponding M5 metal trace of the output clock signal. Actual connection to the input and output pins are performed by the router, such as place and route tool Cell3 mentioned above.

The "RowPreWire" directive instructs program ClockRoute2 to place a wire at specified row intervals for routing a specified clock signal. Wires specified by the "RowPreWire" directives are the allowed M4 wires for coupling the M5 trace driven by the output terminals of clock buffers and the clocked elements driven by the clock signal. For example, in the control file of Appendix C, the RowPreWire directive in Clockbox1 specifies for clock signal PH1 an M4 wire every two rows. In this embodiment, since each standard cell row provides 18 routing tracks, the RowPreWire directive essentially specifies one track per 36 tracks to be used for routing clock signal PH1. As mentioned above, gridding of clock signals are desirable. Gridding is accomplished by the "RowStrapToEdge" directive which specifies the periodic row interval at which M4 wires extending to the edges of the clock region are provided. In ClockBox1 of Appendix C, the RowStrapToEdge directive specifies that such M4 straps that run across the clock region are provided every four rows. By extending these straps to the edge of the clock region, and by properly specifying such M4 straps in adjacent clock regions, the same clock signal in different clock regions are strapped together.

The directives "NoBuffer", "NoWire" and "NoStrap" specify, respectively, a location (NoBuffer) or a range of locations (NoWire and NoStrap), at which no buffer, no wire and no strap can be placed. The directive "LeftStrap" ("RightStrap") specifies a range of y-coordinates between which straps extend only to the left (right) edge of the ClockBox. "LeftStrap" and "RightStrap" are useful directive when an adjacent clock region does not provide a strap to the edge abutting the present clock region, so that it would not be necessary that the current clock region extends an M4 strap to that edge. In those instances, the M4 trace extends as far as the last clocked element in the row. The "Load" directive specifies the input capacitance of a pin in an instance within the ClockBox. The input capacitance could be a numerical value in picoferads or the name of a parameter file storing the input capacitance value. The "Load" directive is particularly useful for providing the input capacitance of a custom macro.

Special clock regions ("SPBoxes") can be specified by either location or instance name, using the "SPBox" directive. With respect to an SPBox, the program ClockRoute2 calculates and assigns the necessary number of buffers, but does not generate any routing or strapping directives to the routing tool. In an SPBox, the designer retains control for handcrafting the clock distribution system within the SPBox. Of course, the user can also include AddWire statements, which would be passed along to the router. For example, in Appendix C, a M3 metal trace is added to the net of signal InEromBox, extending between coordinates (20200, 0) and (20,200, 9720). The "Place" directive defines a location at which a clock buffer is placed.

The "L2Box" directive defines the area over which clock buffers are to be assigned to drive clock buffers of a lower level. Typically, the designer would specify a dummy buffer cell site in the L2Box, using the "Buf" directive, the number of rows ("NumRow" directive) in the L2Box and the number of clock buffers per row ("NumBuf" directive). The capacitances of M4 traces, provided by the floor planning step, for the input and output terminals of level 2 buffers are provided to program ClockRoute2 by the "WireLoad" directives.

As subroutine ReadControlFile reads the control file, appropriate value-checking is performed. For example, for the "NoWire" directive, the y-coordinate arguments are checked against the y-coordinate extent of the ClockBox to ensure that the "NoWire" directive is properly specified within the boundaries of the ClockBox. Further, additional useful parametric values are derived, where appropriate. For example, when a ClockBox is defined, the number of rows within the box is calculated based on the coordinate arguments supplied in the ClockBox directive and the row height obtained from a previous RowHeight directive.

Having read the control file, program ClockRoute2, at step 205, reads the "def" file. The "def" file for this example is provided in Appendix B. As mentioned above, the "def" file lists the instances of pins, vias, components, and nets in the design, including their placement locations and cell types. As shown in the "def" file of Appendix B, a list of components are set forth between the keywords "COMPONENTS" and "END COMPONENTS". Likewise, the nets are set forth between the keywords "NETS" and "END NETS", with the list of instances on each signal net set forth after a "-" and the signal name. The "def" file is read by the subroutine "ReadDef". Subroutine ReadDef creates data structures for the nets and the components, respectively, at steps 206 and 207, calling the subroutines ProcessClockNet, ProcessSPNet and ProcessComponents.

For each instance listed in a net of the "def" file, an entry is created in either the array "OnNet" (for a net in a ClockBox) or the array "SPNet" (for a net in an SPBox), to contain a signal name (i.e. the name of the net) and the name of the pin at which the signal is associated. If the entry is already in existence, i.e. the instance has already appeared in a previously encountered net, the signal name and the pin name are appended to the existing entry. The arrays OnNet and SPNet, which are created by string operations in subroutines ProcessClockNet and ProcessSPNet respectively, are indexed by the instance name. Subroutine ProcessComponents creates three arrays for the components or instances of the design: "CompType", "CompX" and "CompY". Each of these arrays is indexed by an instance name. Corresponding entries of CompType, CompX and CompY, record the instance type and the lower-left x-coordinate and y-coordinates of an instance. Subroutine ProcessComponents also checks the orientation of each cell and marks those cells specified in a BlockedCell directive.

At step 208, program ClockRoute2 calls subroutine RemoveNonClockedElems to remove the dummy buffer cells from the OnNet array, and to place the instances inside all SPBoxes into arrays "SPBoxType" and "SPType", which are each indexed by both the instance name and the signal name. Array SPBoxType stores the name of the SPBox, and the array SPType records the instance type. Subroutine RemoveNonClockElems also creates an array AtY, which is indexed by row (i.e. y-coordinates), for storing a list of instances at each Y position.

At step 209, program ClockRoute2 calls the subroutines ProcessStdCellRows, LimitWiresToAssignedRows and AddStraps to process the data structure created thus far. Subroutine ProcessStdCellRows creates arrays ExtraLoadNet, SPCAP, SPCount, RowMostX, RowGate, RowDevice, BoxDevices and Wirelength. ExtraLoadNet is an array of signal names, indexed by instance name and pin name, for each instance and pin for which a capacitance is defined by a "Load" directive. Arrays SPCap and SPCount, which are each indexed by a SPBox name and a signal name, are arrays of the total capacitance associated with that signal in that SPBox, and the number of pins for which capacitance is accounted for within that SPBox, respectively. RowMostX, RowGate and RowDevices, which are each indexed by the signal name, row number and ClockBox name, provide for each row (a) the length of the M4 metal trace necessary to route the signal to the furthest cell in the row receiving the signal, (b) the total capacitance associated with the signal, and (c) the number of devices associated with that signal. Array BoxDevices, which is indexed by the signal name and a clock region, contains the total number of devices associated with the signal. Array Wirelength, which is indexed by a clock region and a signal name, contains the total wire lengths associated with the signal in each clock region. Array WireLength is used at this time to report, for each row, the distances between the furthest clocked elements receiving the clock signal.

To create the arrays of subroutine ProcessStdCellRows, subroutine ProcessStdCellRows traverses array AtY in the order increasing row order. For each list of instances at each Y coordinate, subroutine ProcessStdCellRow examines each instance in increasing x-coordinate order. For each pin in each instance, the signal name associated with the pin is entered into array ExtraLoadNet, if a previous "Load" directive defines a extra capacitance for that instance type and pin. If the instance is included in an SPBox, the SPCap and the SPCount arrays are updated, to include the instance's contribution of capacitance and pin count in the SPBox. For each row and signal name, ProcessStdCell (a) notes in the corresponding entry of array RowMostX the x-coordinate of the pin furthest in the x-direction from the dummy buffer cells, (b) accumulates in the associated entry of array RowGate the total capacitance, and (c) accumulates in the corresponding entry of array RowDevices the number of pins encountered. For each clock region and signal, the total number of pins encountered is accumulated in the corresponding entry of array BoxDevices. Finally, for each clock region, the wire lengths associated with each signal is calculated from the data in array RowMostX and the extant of the clock region.

After subroutine ProcessStdCellRows completes, program ClockRoute2 calls subroutine LimitWiresToAssignRows. Subroutine LimitWiresToAssignRows removes, for each signal of each clock region, rows for which routing of the signal is prohibited by a "NoWire" directive, a "C4Row" directive, or which falls on a row between the allowed M4 wires in a "RowPreWire" directive. In subroutine LimitWiresToAssignedRows, a RowLeastX array, similar to the RowMostX array, is updated to provide the least x-coordinate of each wire. Program ClockRoute2 then calls subroutine AddStraps to strap (i.e. extend the wires for gridding) the wires of each clock signal and clock region, by updating the corresponding entries in arrays RowLeastX and RowMostX at each row where a RowStrapToEdge, LeftStrap or RightStrap directive defines a strapping.

At step 210, i.e. upon completing execution of subroutine AddStraps, program ClockRoute2 calls subroutine TotalCap to compute the total capacitance in each row associated with each clock region. The results are stored in an array RowCap, which is indexed by the clock region, row number and signal. Each entry in array RowCap is obtained by summing (a) the capacitance in an corresponding entry in RowGate, i.e. the input capacitance associated with the signal, (b) the per row capacitance of the M5 metal trace, i.e. the per row capacitance of the vertical metal trace at the output of the clock buffers, and the total capacitance of the M4 wire computed from the corresponding entries in arrays RowLeastX and RowMostX. The capacitance value for each wire is obtained by multiplying its length to its per unit length capacitance, which provided by the technology file and the M4Mult or M5Mult directives. Finally, for each net, if an extra load value is defined by a "Load" directive for that clock region, the extra load is added to the corresponding entry of array RowCap.

At this point, for each clock region, the total capacitance seen by each clock signal at each row is provided in array RowCap. Program ClockRoute2 then, at step 211, calls subroutine AssignBuffersAndInputViasAndWires ("ABIVW") to assign clock buffers. Subroutine ABIVW defines a sliding window which includes the number of standard cell rows defined in the "RowLookAhead" directive. In each clock region, for each row at which a buffer can be added, i.e. not a row specified in a C4Row directive, subroutine ABIVW determines a number of buffer to be added, using the equation:

$$NumBuf = int\left(\frac{CurrCap}{ClkDrive * Rows\ left} + 0.5\right)$$

where (a) NumBuf is the number of clock buffers to be added to the current row; (b) CurrCap is the remaining capacitance within the window for that signal; (c) ClkDrive is the optimal load for the clock buffer; (d) Rows left is the number of rows left for which clock buffers can be added; and (e) "int" is the function which truncates a real number to the largest integer less than the real number.

In the above equation, the value 0.5 is added to ensure a clock buffer is added when more than half a clock buffer is required. Thus, in this method, the number of clock buffers assigned is such that the average load on each clock buffer is substantially the same (i.e. approximately the optimal load) every where on the integrated circuit. By using a large number of identically sized clock buffers, the present invention avoids clock skew due to device mismatch.

The clock buffers are added horizontally. Subroutine ABIVW then checks if each clock buffer is properly strapped to the M5 wire at the output terminal of the dummy buffer cell. If no strap wire is present to strap to the M5 wire, a new M4 wire is added to provide the strapping. If an M4 wire is already present, but does not extend to the one or more of the added clock buffers, an additional length of M4 metal trace is included in the M4 strap. In either situation, i.e. no strap wire or an inadequate strap wire, the total capacitance for the window is recomputed, using the additional capacitance in the new or extended M4 wire. The number of clock buffers needed to be added to the row is then recomputed. The procedure is repeated until no new wire or extension is required from the last buffer added. In this embodiment, at least one clock buffer is added, if either no buffer is yet present in the current clock region, or if the remaining capacitance is greater than the optimal load for a clock buffer. The added clock buffers are then included in a netlist data structure, for holding references to these clock buffers for output, at a subsequent step, to the modified verilog file.

Subroutine ABIVW then calls subroutine AddInputWiresAndVias. Subroutine AddInputWiresAndVias provides M4 traces to connect the input terminals of a clock buffer to the M5 straps driven by the level 2 buffers. In this embodiment, two signal tracks are provided at both the top and the bottom of each row, the two power rails are located inside these outside tracks, and there are ten signal tracks between the power rails. In M4 rows (i.e. rows at which the floor planning step has allocated metal traces for strapping level 2 buffers), however, the wide M4 straps run between the power rails, so that only one track is available between the power rail, immediately below the upper power rail. Typically, subroutine AddInputWiresAndVias assigns the center track between the rail to the first clock signal, and then assigns to other clock signals the tracks above and below the center track, alternating between tracks above and below the center and in order of increasing distance form the center track. In M4 rows, however, the clock signals are routed in the two tracks below the lower power rail (the tracks above the above and immediately below the upper power rail are reserved for the output wires of the level 3 clock buffers). Subroutine AddInputWiresAndVias then places a via to connect the M5 strap to the added M4 wire[2]. Subroutine AddInputWiresAndVias also calls subroutine ProcessWire to merge the added M4 wire with any previously added overlapping M4 wire of the same track, such as an M4 wire to an adjacent clock buffer. The added and processed wire is then included in a wire data structure, which is used at a subsequent step for outputting to the Addwire file. The window is then advanced one row until the entire clock region is scanned. Summary statistics and error conditions, e.g. more clock buffers are needed than actual room available, are reported for each clock region. Subroutine ProcessPlacedElems is then called to include into the netlist data structure the clock buffers added in the SPboxes by the Place directives.

[2] In this embodiment also, since the vias between M4 and M5 are each wider than a minimum-width M4 trace, to minimize spacing between tracks, the design rules provide that a via, depending on which track it is on, encroaches only the assigned one of the two neighboring tracks. For example, the vias on the center track and the second track above the center track encroach only the track in between. Under this scheme, maximum density of tracks can be achieved.

At step 212, program ClockRoute2 then assigns and routes second level clocking buffers and clock signals, by calling subroutines ProcessL2Buffers. Subroutine ProcessL2Buffers sums, for each L2Box and a clock signal driving a level 3 buffer, the total capacitance within the L2Box associated with that clock signal and places the result into an array L3Cap. Array L3Cap is indexed by an output clock signal of a level 2 clock buffer. To each entry of array L3Cap (i.e. for each clock signal) is then added any addition load value specified in a "WireLoad" directive for that clock signal. The number of clock buffers necessary for that clock signal in that clock region is then computed by the equation:

$$L2NumBuf = int\left(\frac{L3Cap[signal]}{optimal\ load} + 0.5\right)$$

where (a) L3NumBuf is the number of clock buffers to be added in the L2Box; (b) L3Cap[signal] is total capacitance for that clock signal in that L2Box; and (c) optimal load is the optimal load for the level 2 clock buffer.

The added buffers by ProcessL2Buffers are then included in the netlist data structure for subsequent output to the modified verilog file. Subroutine ProcessL2Buffer then calls subroutine PlaceL2Wire to place M5 wires to connect the input and output terminals of the added clock buffers to the M4 straps provided by the floor planning step. These wires are merged by subroutine ProcessL2Wire, which is similar to subroutine ProcessWire described above. The vias between M4 and M5 traces are added by subroutine AddL2Via.

Program ClockRoute2 then calls, at step 213, subroutine AddOutputWiresAndVias, to provide M4 wires to connect the output terminal of the clock buffer and the clocked elements to the M5 straps. The operations of subroutine AddOutputWiresAndVias is substantially the same as subroutine AddInputWiresAndVias described above. Subroutine AddOutputWiresAndVias also calls subroutine ProcessWire to merge the newly added wires. These wires are then included in the wire data structure for generating AddWire directives to the routing tool at the subsequent routing step.

Finally, at step 214, program ClockRoute2 calls subroutines WriteDef, WriteWire and WriteVerilog to provide the modified "def" file, the AddWire file and the modified verilog file respectively. An example of a modified "def" file, an "Addwire" file and a "modified verilog file", output from a run of program ClockRoute2, using the control file, def file and the verilog file of Appendices B–D, are provided as Appendices E, F and G respectively. An output log file of the run is also included herein as Appendix H.

The detailed description above is provided to illustrate the specific embodiments of the present invention and is not intended to be limiting. Numerous variations and modifications are possible within the scope of the present invention. The present invention is defined by the appended claims.

ClockRoute2

```perl
#!/h86/bin/sh_perl
eval 'exec /h86/h86/bin/CPU/bin/perl -U $0 ${1+"$@"}'
    if 0;
# -*-Perl-*-
#####################################################################

# (C) 1994 NexGen Inc. as an unpublished work.  All Rights Reserved.
# The information contained herein is the confidential property of
# NexGen Inc. The use, copying, transfer or disclosure of such information is
# prohibited except by express written agreement with NexGen Inc.

# Check out a read-only copy of every file that has a newer revision
# under RCS.  The test is whether the RCS/*,v file is newer than the
# file already checked out.

#####################################################################

# Auto identification
$program_path = $0;
$program_name = $program_path;
$program_name =~ s:^.*/:;:;
select (stderr); $| = 1; select (stdout);
print stderr "$program_path ", '$Revision: 1.46 $', "\n";
print stderr '$Id: ClockRoute2,v 1.46 1995/04/03 17:40:56 alisa Exp $', "\n";

$path = ".:/";
$L3BufferCap = 0.064;
$doc = 0;
$test = "none";
$via = 0;
$ViaNumber = 0;
$ArgM5offset = 0;
$mapcell = "I";                # remove when the I naming problem goes away
$, = ',';                      # set output field separator
$\ = "\n";                     # set output record separator
chop($cwd = 'pwd');

eval "print stderr \$die='Unknown switch $1\n' if \$$1 eq ''; \$$1=\$2;"
    while ($ARGV[0] =~ /^((A-Za-z_]+)=(.*)/ && shift);   # process any FOO=bar switches
exit 1 if $die;

&DoTest($test) if ($test ne 'none');
&PrintHelp($doc) if ($#ARGV != 2);
print stderr "Reading control file";
&ReadControlFile($RootName = shift);
print stderr "Reading Def file";
&ReadDef($ArgDef = shift);
&RemoveNonClockedElems();
print stderr "Processing standard cell rows";
&ProcessStdCellRows();
&LimitWiresToAssignedRows();
&AddStraps();
```

ClockRoute2

```perl
&TotalCap();
&AssignBuffersAndInputViasAndWires();
&ProcessPlacedElems();
&ProcessL2Buffers();
&AddOutputWiresAndVias();
&WriteDef($Via, $ArgDef, $RootName);
&WriteWire($RootName);
&WriteVerilog($RootName, $ArgVer = shift);
&DieError("Errors detected during run",1) if ($ErrorsSeen);
exit 0;

############################################################### sub DieError {
    local($Msg,$Fatal) = @_;
    print stderr "ERROR: $Msg";
    exit -1 if ($Fatal);
    $ErrorsSeen = 1;
} sub FindFile {
    local($Test, $path, $dir) = @_;
    foreach $dir (split(/:/,$path)) {
        return ($dir) if (-e "$dir/$Test");
    }
    ("");
}

# Read in the control file to establish all the $Arg* variables
sub ReadControlFile {
    local($Root) = @_;
    local($Dir,$N,$X,$Y,$InN);
    local($BoxName) = "";
    local($SPBoxName) = "";
    local($File) = $Root . ".clkctl";
    local($tmp1,$tmp2,$tmp3,$tmp4);
    local($ViaString);

&DieError("Could not find file '$File'",1) if (($Dir = &FindFile($File,$path)) eq "");
    &DieError("Could not open file $File",1) if (!open(f,"$Dir/$File"));
    print "Control File: $File";
    while(<f>) {
        chop;
        next if (/^\s*#/);
        next if (/^\s*$/);
        if (/^\s*AddWire\s+((\S+)\s+((\S+)\s*(\s*((\d+)\s*,\s*((\d+)\s*\)\s*\((\s*((\d+)\s*,\s*((\d+)\s*\)\s*(\$|#)/i) { #default case
            $N = &UC($1); #def needs uppercase
            $N = &UC($1); #def needs uppercase
            &ProcessPlaceWire($N,$2,$3,$4,$5,$6,"noviasat");
            next;
        }
        if (/^\s*AddWire\s+((\S+)\s+((\S+)\s*(\s*((\d+)\s*,\s*((\d+)\s*\)\s*\((\s*((\d+)\s*,\s*((\d+)\s*\)\s*(\$|#)/i) { #viasat case
            $N = &UC($1); #def needs uppercase
```

ClockRoute2

```perl
$ViaString = $7;
&ProcessPlaceWire($N,$2,$3,$4,$5,$6,$7);
&DieError("Not a valid via string in file $Dir/$File line $.",1) if (($ViaString ne "noviasat") && ($ViaString ne "viasat"));
next;
}
if ($BoxName ne "") {
    if (/^\s*)\s*($|#)//) {       # ( extra to make match work
        $BoxName = "";
        next;
    }
    if (/^\s*ClockWire\s+(\S+)\s+(\S+)\s+(\d+)\s+(\d+)\s*($|#)/i) {
        local($ClkInName,$N,$IPos,$OPos) = ($1,$2,$3,$4);
        local($ClkInName) = &UC($N);           # def needs uppercase
        $NetV($ClkInName) = $N;
        &DieError("ClockWire $ClkName already defined in ClockBox $BoxName",0) if (defined $ArgBoxInY($BoxName,$ClkName));
        $NumNets ++ if ($ArgNets !~ /$ClkName:/);
        $ArgNets .= $ClkName . ":" if ($ArgNets !~ /$ClkName:/);
        $ArgNetInV($ClkName) = $ClkInName;
        $ClkInName = &UC($ClkInName);          # Def needs uppercase
        $ArgNetIn($ClkInName) = $ClkName;
        $ArgNetOut($ClkInName) = $ClkName;
        $ArgInNets .= $ClkInName . ":" if ($ArgInNets !~ /$ClkInName:/);
        $ArgBoxInX($BoxName,$ClkName) = $IPos + $ArgMSoffset;
        $ArgBoxOutX($BoxName,$ClkName) = $OPos + $ArgMSoffset;
        &CheckXWirePosInBox($BoxName,$ArgBoxInX($BoxName,$ClkName));
        &CheckXWirePosInBox($BoxName,$ArgBoxOutX($BoxName,$ClkName));
        $ArgAllClocks($ClkName) = 1;
        $ArgNumClocksPerBox($BoxName)++;
        next;
    }
    if (/^\s*Buf\s+(\d+)\s*($|#)/i) {
        &DieError("'Buf' multiply defined in ClockBox $BoxName",0) if (defined $ArgBoxNumBuf($BoxName));
        &CheckXPosInBox($BoxName,$1);
        $ArgBoxBufX($BoxName) = $1;
        next;
    }
    if (/^\s*NumBuf\s+(\d+)\s*($|#)/i) {
        &DieError("'NumBuf' multiply defined in ClockBox $BoxName",0) if (defined $ArgBoxNumBuf($BoxName));
        $ArgBoxNumBuf($BoxName) = $1;
        next;
    }
    if (/^\s*NoBuffer\s+(\d+)\s*($|#)/i) {
        local($Y) = $1;
        $ArgNoBuffer($BoxName,$Y) = 1;
        &CheckRowHeight($Y, "NoBuffer Y parameter");
        &CheckYPosInBox($BoxName,$Y);
        next;
    }
    if (/^\s*Load\s+(\S+)\s+(\S+)\s+(\d+)\s+(\d+)\s+(\S+)\s*($|#)/i) {
        local($Inst,$Pin,$Y,$Pf) = ($1,$2,$3,$4);
        &DieError("Load $Inst $Pin already defined",0) if (defined $ExtraLoad($Inst,$Pin));
        &DieError("Bad load capacitance statement",1) if ($Pf !~ /PARM/i && $Pf !~ /(\d+\.\d+|\d+\.|\d+)/);
```

ClockRoute2

```
$ExtraLoad($Inst,$Pin) = $Pf;
$ExtraLoadBox($Inst,$Pin) = $BoxName;
$ExtraLoadY($Inst,$Pin) = $Y;
$ExtraLoadInst($Inst,$Pin) = $Inst;
$ExtraLoadPin($Inst,$Pin) = $Pin;
&CheckRowHeight($Y, "Load Y parameter");
&CheckYPosInBox($BoxName,$Y);
next;
}
if (/^\s*RowPrewire\s+(\s+)\s+((\d+)\s*($|#)/i) {
    local($N) = $1;
    $N = &UC($N);        # def needs uppercase
    if (defined $ArgRowPrewire($BoxName,$N)) {
        &DieError("Multiple 'RowPrewire' statements for $1 in ClockBox $BoxName in file $Dir/$File line $.",0);
    }
    if ($2 > $ArgRowsInBox($BoxName)) {
        print "WARNING: 'RowPrewire $1' ($2) in $BoxName is > box height ($ArgRowsInBox($BoxName))";
    }
    $ArgRowPrewire($BoxName,$N) = $2;
    next;
}
if (/^\s*NoWire\s+((\d+)\s+((\d+)\s*($|#)/i) {
    $ArgNoWireMinY($BoxName,$1) = $1;
    $ArgNoWireMaxY($BoxName,$1) = $2;
    $ArgNoWireBox($BoxName,$1) = $BoxName;
    &CheckRowHeight($1, "NoWire YMin");
    &CheckRowHeight($2, "NoWire YMax");
    &CheckYPosInBox($BoxName,$1);
    &CheckYPosInBox($BoxName,$2-$ArgRowHeight);
    next;
}
if (/^\s*RowStrapToEdge\s+((\s+)\s+((\d+)\s*($|#)/i) {
    local($N) = $1;        # def needs uppercase
    $N = &UC($N);
    if (defined $ArgRowStrapToEdge($BoxName,$N)) {
        &DieError("Multiple 'RowStrapToEdge' statements for $1 in ClockBox $BoxName in file $Dir/$File line $.",0);
    }
    if ($2 > $ArgRowsInBox($BoxName)) {
        print "WARNING: 'RowStrapToEdge $1' ($2) in $BoxName is > box height ($ArgRowsInBox($BoxName))";
    }
    $ArgRowStrapToEdge($BoxName,$N) = $2;
    next;
}
if (/^\s*NoStrap\s+((\d+)\s+((\d+)\s*($|#)/i) {
    $ArgNoStrapMinY($BoxName,$1) = $1;
    $ArgNoStrapMaxY($BoxName,$1) = $2;
    $ArgNoStrapBox($BoxName,$1) = $BoxName;
    &CheckRowHeight($1, "NoStrap YMin");
    &CheckRowHeight($2, "NoStrap YMax");
    &CheckYPosInBox($BoxName,$1);
    &CheckYPosInBox($BoxName,$2-$ArgRowHeight);
    next;
```

FIG. 5

ClockRoute2

```perl
    }
    if (/^\s*RightStrap\s+(\d+)\s+(\d+)\s*($|#)/i) {
        $ArgRightStrapMinY($BoxName,$1) = $1;
        $ArgRightStrapMaxY($BoxName,$1) = $2;
        $ArgRightStrapBox($BoxName,$1) = $BoxName;
        &CheckRowHeight($1, "RightStrap YMin");
        &CheckRowHeight($2, "RightStrap YMax");
        &CheckYPosInBox($BoxName,$1);
        &CheckYPosInBox($BoxName,$2-$ArgRowHeight);
        next;
    }
    if (/^\s*LeftStrap\s+(\d+)\s+(\d+)\s*($|#)/i) {
        $ArgLeftStrapMinY($BoxName,$1) = $1;
        $ArgLeftStrapMaxY($BoxName,$1) = $2;
        $ArgLeftStrapBox($BoxName,$1) = $BoxName;
        &CheckRowHeight($1, "LeftStrap YMin");
        &CheckRowHeight($2, "LeftStrap YMax");
        &CheckYPosInBox($BoxName,$1);
        &CheckYPosInBox($BoxName,$2-$ArgRowHeight);
        next;
    }
    &DieError("Syntax error at line $. of $Dir/$File: '$_'",1);
}
elsif ($SPBoxName ne "") { # ( extra to make match work
    if (/^\s*)\s*($|#)/) {
        $SPBoxName = "";
        next;
    }
    if (/^\s*Place\s+(\s+)\s*($\s*(\d+)\s*,\s*(\d+)\s*\)\s*\(\s*($|#)/i) {
        $InN = $1;
        $N = $2;
        $X = $3;
        $Y = $4;
        $PlaceNetV($SPBoxName,$X,$Y) = $N;
        $N = &UC($N);                           # Def needs uppercase
        $PlaceNet($SPBoxName,$X,$Y) = $N;
        $PlaceAllNet($SPBoxName,$N) = 1;
        $PlaceXPos($SPBoxName,$X,$Y) = $X;
        $PlaceYPos($SPBoxName,$X,$Y) = $Y;
        $SPBufCount($SPBoxName,$N)++;
        $SPNets .= $N . ":" if ($SPNets !~ /$N:/);
        $ArgNetInV($N) = $InN;
        $InN = &UC($InN);                       # Def needs uppercase
        $ArgNetIn($N) = $InN;
        $ArgInNets .= $InN . ":" if ($ArgInNets !~ /$InN:/);
        next;
    }
    &DieError("Syntax error at line $. of $Dir/$File: '$_'",1);
}
elsif ($L2BoxName ne "") {
    if (/^\s*)\s*($|#)/) {
        $L2BoxName = "";
```

ClockRoute2

```perl
         next;
     }
     if (/^\s*Buf\s*\(\s*(\d+)\s*,\s*(\d+)\s*\)\s*\(\s*(\$|#)/i) {
         &DieError("'Buf' multiply defined in L2Box $L2BoxName",0) if (defined $L2BoxBufX{$L2BoxName});
         &DieError("'Buf' position is not in box $L2BoxName",1) unless (&InBox($1,$2,$L2Boxllx{$L2BoxName},$L2Boxlly{$L2BoxName},$L2Bo
xurx{$L2BoxName},$L2Boxury{$L2BoxName}));
         $L2BoxBufX{$L2BoxName} = $1;
         $L2BoxBufY{$L2BoxName} = $2;
         next;
     }
     if (/^\s*NumRow\s*(\d+)\s*(\$|#)/i) {
         &DieError("'NumRow' multiply defined in L2Box $L2BoxName",0) if (defined $L2BoxNumRow{$L2BoxName});
         $L2BoxNumRow{$L2BoxName} = $1;
         next;
     }
     if (/^\s*NumBuf\s*(\d+)\s*(\$|#)/i) {
         &DieError("'NumBuf' multiply defined in L2Box $L2BoxName",0) if (defined $L2BoxNumBuf{$L2BoxName});
         $L2BoxNumBuf{$L2BoxName} = $1;
         next;
     }
     if (/^\s*WireLoad\s+(\S+)\s+(\S+)\s+(\d+\.\d+|\d+)\s*(\$|#)/i) {
         local($InNet,$NetNameV,$pf) = ($1,$2,$3);
         local($NetName) = &UC($NetNameV);
         &DieError("Bad load capacitance statement",1) if ($pf !~ /(\d+\.\d+|\d+)/);
         $ArgNetInv{$NetName} = $NetNameV;
         $WireLoad{$L2BoxName,$NetName} = $pf;
         $ArgNetIn{$NetName} = $NetName;
         $L2ArgNetInV{$NetName} = $NetNet;
         $InNet = &UC($InNet);                  # def needs uppercase
         $L2ArgNetIn{$NetName} = $InNet;
         $L2ArgInNets .= $InNet . ":" if ($L2ArgInNets !~ /$InNet:/);
         $L2NumNets ++ if ($L2ArgInNets !~ /$InNet:/);
         next;
     }
}
else {
     if (/^\s*TechFile\s+(\S+)\s*(\$|#)/i) {
         &ReadTechFile($1);
         next;
     }
     if (/^\s*ParmFile\s+(\S+)\s*(\$|#)/i) {
         &ReadParm($1);
         next;
     }
     if (/^\s*LefFile\s+(\S+)\s*(\$|#)/i) {
         &ReadLef($1);
         next;
     }
     if (/^\s*ClockDriveMult\s+(\S+)\s+(\d+\.\d+|\d+)\s*(\$|#)/i) {
         &DieError("Multiple 'ClockDriverMult' statements for $1 in $Dir/$File line $.",0)if(defined $ArgClkDrvMult{$1});
         $N = &UC($1);        #def needs uppercase
         $ArgClkDrvMult{$N} = $2;
```

ClockRoute2

```perl
    next;
}
if (/^\s*Buffer\s+(\S+)\s+(\d+\.\d+|\d+)\s+(\d+\.\d+)\s+(\S+)\s+(\S+)\s+(\S+)\s+(\S+)\s*($|#)/i) {
    &DieError("Multiple 'Buffer' statements in $Dir/$File line $.",0) if (defined $ArgBufferName);
    $ArgBufferName = $1;
    $ArgBufferCap = $2;
    $ArgBufferSize = $3;
    $ArgBufferIn = $4;
    $ArgBufferOut = $5;
    $ArgBuffer{"VDD"} = $6;
    $ArgBuffer{"VSS"} = $7;
    $ArgBufferNameLc = &LC($ArgBufferName);
    $ArgBufferName = &UC($ArgBufferName);
    next;
}
if (/^\s*M5Offset\s+(\d+)\s*($|#)/i) {
    $ArgM5offset = $1;
    next;
}
if (/^\s*C4Row\s+(\d+|\d+\.\d+)\s*($|#)/i) {
    $ArgC4Row($1) = 1;
    next;
}
if (/^\s*M4Row\s+(\d+|\d+\.\d+)\s+(\d+|\d+\.\d+)\s+((\s*[(^)]*)\s*\)\s*)+(\d+|\d+\.\d+)\s+(\d+|\d+\.\d+)\s+((\s*[(^)]*)\s*\)\s*)+\s*($|#)/i) {
    $ArgM4Row($1) = 1;
    $ArgM4Row($4) = 1;
    $ArgM4RowPair = $1 . ":" . $4 .";" . $ArgM4RowPair;
    $ArgM4RowOffset($1) = $2;
    $ArgM4RowOffset($4) = $5;
    $tmp1 = $1;
    $tmp3 = $4;
    $tmp2 = &UC($3);
    $tmp4 = &UC($6);
    $tmp2 =~ s/\s*$//;  # remove trailing whitespace
    $tmp4 =~ s/\s*$//;  # remove trailing whitespace
    $ArgM4RowOrder($tmp1) = $tmp2;
    $ArgM4RowOrder($tmp3) = $tmp4;
    next;
}
if (/^\s*M4Row\s+(\d+|\d+\.\d+)\s+(\s*[(^)]*)\s*\)\s*(\d+|\d+\.\d+)\s+(\s*[(^)]*)\s*\)\s*($|#)/i) {
    $ArgM4Row($1) = 1;
    $ArgM4Row($3) = 1;
    $ArgM4RowPair = $1 . ":" . $3 .";" . $ArgM4RowPair;
    $tmp1 = $1;
    $tmp3 = $3;
    $tmp2 = &UC($2);
    $tmp4 = &UC($4);
    $tmp2 =~ s/\s*$//;  # remove trailing whitespace
    $tmp4 =~ s/\s*$//;  # remove trailing whitespace
    $ArgM4RowOrder($tmp1) = $tmp2;
    $ArgM4RowOrder($tmp3) = $tmp4;
```

ClockRoute2

```perl
    next;
}
if (/^\s*AllowClock\s+(\S+)\s*[\s*($|#)/i) {
    $ArgAllowClock{$1,$2} = 1;
    next;
}
if (/^\s*RowLookahead\s+(\d+)\s*($|#)/i) {
    &DieError("Multiple 'RowLookahead' statements in $Dir/$File line $.",0) if (defined $ArgRowLookahead);
    $ArgRowLookahead = $1;
    next;
}
if (/^\s*Grid\s+(\d+)\s*($|#)/i) {
    &DieError("Multiple 'Grid' statements in $Dir/$File line $.",0) if (defined $ArgGrid);
    $ArgGrid = $1;
    next;
}
if (/^\s*RowHeight\s+(\d+)\s*($|#)/i) {
    &DieError("Multiple 'RowHeight' statements in $Dir/$File line $.",0) if (defined $ArgRowHeight);
    $ArgRowHeight = $1;
    next;
}
if (/^\s*M5Width\s+(\d+)\s*($|#)/i) {
    &DieError("Multiple 'M5Width' statements in $Dir/$File line $.",0) if (defined $ArgWireWidth);
    $ArgWireWidth = $1;
    next;
}
if (/^\s*M(4|5)Cap\s+(\S+)\s*($|#)/i) {
    &DieError("Multiple 'M$1Cap' statements in $Dir/$File line $.",0) if (defined $ArgWireCap{$1});
    $ArgWireCap{$1} = $2;
    next;
}
if (/^\s*M(4|5)Mult\s+(\d+\.\d+|\d+)\s*($|#)/i) {
    &DieError("Multiple 'M$1Mult' statements in $Dir/$File line $.",0) if (defined $ArgWireMult{$1});
    $ArgWireMult{$1} = $2;
    next;
}
if (/^\s*BufCap\s+(\d+\.\d+|\d+)\s*($|#)/i) {
    $L3BufferCap = $1;
    next;
}
if (/^\s*L2Master\s+(\S+)\s+(\S+)\s*($|#)/i) {
    $N = &UC($1);    # def needs upper case
    $L2MasterV{$N} = $2;
    $L2Master{$N} = &UC($L2MasterV{$N});
    next;
}
if (/^\s*L3Master\s+(\S+)\s+(\S+)\s*($|#)/i) {
    $N = &UC($1);    # def needs upper case
    $L3MasterV{$N} = $2;
    $L3Master{$N} = &UC($L3MasterV{$N});
    next;
}
```

ClockRoute2

```perl
if (/^\s*Orientation\s+(N|S)\s*(\$|#|/i) {
    $Orientation0 = $1;
    $Orientation0 = "N" if ($Orientation0 eq "n");
    $Orientation0 = "S" if ($Orientation0 eq "s");
    print "orientation is $Orientation0";
    $Orientation1 = "S" if ($Orientation0 eq "N");
    $Orientation1 = "N" if ($Orientation0 eq "S");
    next;
} if (/^\s*ClockBox\s+((\S+)\s*\(\s*(\d+)\s*,\s*(\d+)\s*\)\s*(\(\s*(\d+)\s*,\s*(\d+)\s*\))?\s*(\(\s*(\S)\s*\))?\s*(\(\s*(\S|#)\s*\))?/i) { ( # ) extra
    $BoxName = $1;
    &DieError("ClockBox '$BoxName' multiply defined at line $. of $Dir/$File",0) if (defined $ArgBoxAtlx($BoxName));
    &CheckRowHeight($5 - $3, "ClockBox height");
    &CheckBoxOverlapAgainstExistingBoxes($BoxName,$2,$3,$4,$5);
    $ArgBoxAtlx($BoxName) = $2;
    $ArgBoxAtly($BoxName) = $3;
    $ArgBoxAturx($BoxName) = $4;
    $ArgBoxAtury($BoxName) = $5;
    $ArgRowsInBox($BoxName) = ($5 - $3)/$ArgRowHeight;
    next;
} if (/^\s*SPBox\s+((\S+)\s*(\S+)\s*(\(\s*(\S|#)\s*\))?/i) ( # ) extra
    $SPBoxName = $1;
    &DieError("SPBox '$SPBoxName' already defined at line $. of $Dir/$File",0) if (defined $PlaceIx($SPBoxName));
    $SPBox = 1;
    $SPBoxRegexp($SPBoxName) = $2;
    $Placelx($SPBoxName) = 0;    # dummy value but needed
    $Placelly($SPBoxName) = 0;
    $Placeurx($SPBoxName) = 0;
    $Placeury($SPBoxName) = 0;
    next;
} if (/^\s*SPBox\s+((\S+)\s*(\(\s*(\d+)\s*,\s*(\d+)\s*\))\s*(\(\s*(\d+)\s*,\s*(\d+)\s*\))\s*(\(\s*(\S|#)\s*\))?/i) ( # ) extra
    $SPBoxName = $1;
    &DieError("SPBox '$SPBoxName' already defined at line $. of $Dir/$File",0) if (defined $PlaceIx($SPBoxName));
    $SPBox = 1;
    $SPBoxRegexp($SPBoxName) = "";
    $Placelx($SPBoxName) = $2;
    $Placelly($SPBoxName) = $3;
    $Placeurx($SPBoxName) = $4;
    $Placeury($SPBoxName) = $5;
    next;
} if (/^\s*L2Box\s+((\S+)\s*\(\s*(\d+)\s*,\s*(\d+)\s*\)\s*(\(\s*(\d+)\s*,\s*(\d+)\s*\))\s*(\(\s*(\S|#)\s*\))?/i) ( # ) extra
    $L2BoxName = $1;
    &DieError("L2Box '$L2BoxName' multiply defined at line $. of $Dir/$File",0) if (defined $L2BoxAtlx($L2BoxName));
    &CheckBoxOverlapAgainstExistingL2Boxes($L2BoxName,$2,$3,$4,$5);
    $L2BoxAtlx($L2BoxName) = $2;
    $L2BoxAtly($L2BoxName) = $3;
    $L2Boxurx($L2BoxName) = $4;
    $L2Boxury($L2BoxName) = $5;
    $FoundL2Box = 1;
```

ClockRoute2

```perl
        next;
    }
    if (/^\s*DeleteCells\s+(\S+)\s*(\$|#)/i) {
        $DeleteCells($1) = 1;
        next;
    }
    if (/^\s*BlockedCells\s+(\S+)\s*(\$|#)/i) {
        $BlockedCells($1) = 1;
        next;
    }
    &DieError("Syntax error at line $. of $Dir/$File: '$_'",1);
}
&DieError("Syntax error at line $. of $Dir/$File: '$_'",1);

close(f);

&DieError("'RowHeight' statement missing from $Dir/$File",0) if (! defined $ArgRowHeight);
&DieError("'Grid' statement missing from $Dir/$File",0) if (! defined $ArgGrid);
&DieError("'RowLookahead' statement missing from $Dir/$File",0) if (! defined $ArgRowLookahead);
&DieError("'Buffer' statement missing from $Dir/$File",0) if (! defined $ArgBufferName);
&DieError("'Clock' statement missing from $Dir/$File",0) if ((! defined $ArgNets) && (! defined $SPNets));
&DieError("'MSWidth' statement missing from $Dir/$File",0) if (! defined $ArgWireWidth);
&DieError("'Orientation' statement missing from $Dir/$File",0) if (! defined $Orientation0);
if ( ($ArgRowHeight/$ArgGrid) != int($ArgRowHeight/$ArgGrid) ) {
    &DieError("RowHeight ($ArgRowHeight) must be even multiple of Grid ($ArgGrid) in $Dir/$File",0);
}
$ArgNumTracks = $ArgRowHeight/$ArgGrid;
if ($ArgNumTracks % 2) {
    &DieError("There are $ArgNumTracks tracks per row.  ClockRoute only knows how to deal with an even number",0);
} for $N ("4","5") {
    &DieError("'MSNCap' statement missing from $Dir/$File",0) if (! defined $ArgWireCap($N));
    $ArgWireMult($N) = 1 if (! defined $ArgWireMult($N));
    $ArgWireCap($N) = (&LookupWireCap($ArgWireCap($N)) * $ArgWireMult($N)) / 1000;
    printf("Effective MSN capacitance %8.6f pF/um\n", $ArgWireCap($N));
} for $N (keys %ArgBoxAtIlx) {
    &DieError("'Buf' statement missing from ClockBox $N in $Dir/$File",0) if (! defined $ArgBoxBufX($N));
    &DieError("'NumBuf' statement missing from ClockBox $N in $Dir/$File",0) if (! defined $ArgBoxNumBuf($N));
    &DieError("Not enough tracks for specified clocks in ClockBox $N",0) if ($ArgNumClocksPerBox($N) > int($ArgNumTracks/3));
} for $Y (keys %ArgC4Row) {
    &DieError("C4Row, $Y is not a multiple of RowHeight",1) if ($Y % $ArgRowHeight);
} for $Y (keys %ArgM4Row) {
    &DieError("M4Row, $Y is not a multiple of RowHeight",1) if ($Y % $ArgRowHeight);
}

&DieError("Can't continue due to previous errors",1) if ($ErrorsSeen);
}

# Make a word into lowercase
sub LC {
```

ClockRoute2

```
        local($_) = @_;
        tr/A-Z/a-z/;
        return $_;
}

# Make a word into uppercase
sub UC {
        local($_) = @_;
        tr/a-z/A-Z/;
        return $_;
}

# Write special net to $WireAdds
sub ProcessPlaceWire {
        local($Net,$Layer,$startX,$startY,$EndX,$EndY,$viasat) = @_;
        local($lowX,$highX,$lowY,$highY);
        &DieError("addwire for $Net must be vertical or horizontal",1) unless ($startX == $EndX || $startY == $EndY);
        $lowX = &Min($startX,$EndX);
        $highX = &Max($startX,$EndX);
        $lowY = &Min($startY,$EndY);
        $highY = &Max($startY,$EndY);
        &ProcessWire("V",$Layer,$Net,$startX,$lowY,$highY,$viasat) if ($startX == $EndX);
        &ProcessWire("H",$Layer,$Net,$startY,$lowX,$highX,$viasat) if ($startY == $EndY);
#       $WireAdds .= "add wire nodrc short noviasat net $(Net) 1 $Layer ( $startX $startY ) ( $EndX $EndY ) ;\n";
} sub ProcessWire {
        local($direction,$layer,$Net,$N,$index,$start,$end,$modify,$viasat) = @_;
        local($net,$startW,$sendW,$set,$lastEndW,$modify,$cleanup);
        $lastEndW = -9999;
        $wire2 = "";
        $modify = 0;
        foreach $set (split(/:/,$Wire($layer,$index))) {
                ($set =~ /^(\S+);((\S+)\s)/) || &DieError("bad data in wire list",1);
                $startW = $1;
                $sendW = $2;
                $net = $3;
                if ($start > $startW) {
                        if ($start == $sendW) {
                                &DieError("Abutting wires short $N to $net at $start, $index",1) if ($N ne $net);
                                $sendW = $end;
                                $start = $startW;
                                $lastEndW = $sendW;
                                $modify = 1;
                        } else ( $lastEndW = $endW; )
                } elsif ($start < $startW) {
                        if ($end == $startW) {
                                &DieError("Abutting wires short $N to $net at $startW, $index",1) if ($N ne $net);
                                $startW = $start;
                                $lastEndW = $sendW;
                                $cleanup = 1 if ($modify);  #cleanup wires that abut on right and left
                        } elsif ($start > $lastEndW ) ( # insert new wire
```

ClockRoute2

```
            $Wire2 .= $start . ";" . $end . ";" . $N . ";";
            $lastEndW = $endW;
    } elsif ($start == $startW) {
            print "what the heck?? Two wires with same start point in ProcessWire.\n";
            &DieError("Abutting wires short $N to $net at $startW, $index",1) if ($N ne $net);
            $endW = &Max($end,$endW);
            $lastendW = $endW;
    }
            $Wire2 .= $startW . ";" . $endW . ";" . $net . ";";
    if ($Direction($layer,$index) != $direction) {
            &DieError("Bad wire direction in ProcessWire",1);
    }
}
if ($start > $lastEndW) { # put new wire in first or last
            $Wire2 .= $start . ";" . $end . ";" . $N . ";";
}
$Wire2 = &CleanupWire($Wire2) if ($Cleanup);
$Wire($layer,$index) = $Wire2;
$Direction($layer,$index) = $direction;
$MLayer($layer,$index) = $layer;
$Index($layer,$index) = $index;
$ViasAt($layer,$index) = $viasat;
$Wire2 = "";
} sub CleanupWire {
    local($wire) = @_;
    local($net,$startW,$endW,$set,$lastEndW,$start,$end,$wireOut,$skip);
    $skip=0;
    foreach $set (split(/;/,$wire)) {
            ($set =~ /^(\S+);(\S+);(\S+)$/) || &DieError("bad data in wire list",1);
            $startW = $1;
            $end = $2;
            $net = $3;
            foreach $set (split(/;/,$wire)) {
                ($set =~ /^(\S+);(\S+);(\S+)$/) || &DieError("bad data in wire list",1);
                $startW = $1;
                $endW = $2;
                if ($startW == $startW) {
                    $skip = 1 if($end < $endW);
                }
                if ($end == $endW) {
                    $skip = 1 if ($start > $startW);
                }
            }
            if(! $skip) {
                $wireOut .= $start . ";" . $end . ";" . $net . ";";
            }
            $skip = 0;
    }
}
```

ClockRoute2

```
    return $wireCut;
} sub CheckRowHeight {
    local($H,$M) = @_;
    &DieError("'RowHeight' statement must come before ClockBox $Dir/$File",1) if (! defined $ArgRowHeight);
    if ( ($H/$ArgRowHeight) != int(($H/$ArgRowHeight)) ) {
        &DieError("'$M' ($H) must be even multiple of RowHeight ($ArgRowHeight) at line $. of $Dir/$File",1);
    }
} sub CheckXWirePosInBox {
    local($Name,$XPos) = @_;
    &DieError("X wire position $XPos already used in box $Name at line $. of $Dir/$File",1) if (defined $ArgXWireUsed{$Name,$XPos});
    $ArgXWireUsed{$Name,$XPos} = 1;
    &DieError("X position $XPos outside ClockBox $Name at line $. of $Dir/$File",1) if ( ($XPos < $ArgBoxAtlx{$Name}) ||
                                                                                          ($XPos >= $ArgBoxAturx{$Name}) );
} sub CheckXPosInBox {
    local($Name,$XPos) = @_;
    &DieError("X position $XPos already used in box $Name at line $. of $Dir/$File",1) if (defined $ArgXUsed{$Name,$XPos});
    $ArgXUsed{$Name,$XPos} = 1;
    &DieError("X position $XPos outside ClockBox $Name at line $. of $Dir/$File",1) if ( ($XPos < $ArgBoxAtlx{$Name}) ||
                                                                                          ($XPos >= $ArgBoxAturx{$Name}) );
} sub CheckYPosInBox {
    local($Name,$YPos) = @_;
    &DieError("Y position $YPos outside ClockBox $Name at line $. of $Dir/$File",1) if ( ($YPos < $ArgBoxAtlly{$Name}) ||
                                                                                          ($YPos >= $ArgBoxAtury{$Name}) );
} sub CheckBoxOverlap {
    local($B1llx,$B1lly,$B1urx,$B1ury,$B2llx,$B2lly,$B2urx,$B2ury) = @_;
    ( ( (($B1llx >= $B2llx) && ($B1llx < $B2urx)) || (($B1urx > $B2llx) && ($B1urx <= $B2urx)) ) &&
      ( (($B1lly >= $B2lly) && ($B1lly < $B2ury)) || (($B1ury > $B2lly) && ($B1ury <= $B2ury)) ) );
} sub InBox {
    local($X,$Y,$llx,$lly,$urx,$ury) = @_;
    ($X >= $llx) && ($X < $urx) && ($Y >= $lly) && ($Y < $ury);
} sub FindBox {
    local($X,$Y) = @_;
    local($B);
    for $B (keys %ArgBoxAtlx) {
        return $B if (&InBox($X,$Y,$ArgBoxAtlx{$B},$ArgBoxAtlly{$B},$ArgBoxAturx{$B},$ArgBoxAtury{$B}));
    }
    return "";
} sub CheckBoxOverlapAgainstExistingBoxes {
```

ClockRoute2

```
    local($Name,$llx,$lly,$urx,$ury) = @_;
    local($B);
} for $B (keys %ArgBoxAllx) {
    if (&CheckBoxOverlap($llx,$lly,$urx,$ury,$ArgBoxAtllx($B),$ArgBoxAtlly($B),$ArgBoxAturx($B),$ArgBoxAtury($B))) {
        &DieError("ClockBox $Name intersects ClockBox $B",1);
    }
} sub CheckBoxOverlapAgainstExistingL2Boxes {
    local($Name,$llx,$lly,$urx,$ury) = @_;
    local($B);

for $B (keys %L2Boxllx) {
        if (&CheckBoxOverlap($llx,$lly,$urx,$ury,$L2Boxllx($B),$L2Boxlly($B),$L2Boxurx($B),$L2Boxury($B))) {
            &DieError("L2Box $Name intersects L2Box $B",1);
        }
    }
} lookup a wire capacitance in WireCap()
sub LookupWireCap {
    local($V) = @_;
    return $v if ($v =~ /^\s*(\d+\.\d+|\d+)/);
    return $WireCap($v) if (defined $WireCap($v));
    &DieError("Could not find wire capacitance '$v' in specified 'TechFile's",1);
}

# Read the technology file to find wire capacitance
#   Input: file name
#   Result: WireCap{Name}=Value
sub ReadTechFile {
    local($File) = @_;
    local($Dir,$Cell);

&DieError("Could not find file '$File'",1) if (($Dir = &FindFile($File,$path)) eq "");
    &DieError("Could not open file '$File'",1) if (!open(TF,"$Dir/$File"));
    while(<TF>) {
        next if (/^\s*#/);
        $WireCap($1) = $2 if (/^\s*(\S+)\s+(\d+\.\d+|\d+)/);
    }
    close(TF);
}

# Read the .parm file to find gate capacitance of cells
#   Input: file name
#   Result: PinType(), PinCap()
sub ReadParm {
    local($File) = @_;
    local($Dir,$Cell);
```

FIG. 14

ClockRoute2

```perl
&DieError("Could not find file '$File'.",1) if (($Dir = &FindFile($File,$path)) eq "");
&DieError("Could not open file '$File'.",1) if (!open(TF,"$Dir/$File"));
while(<TF>) {
    if (/^\s*BL\s+(\S+)\s+(\d+)\s+(\S+M?)|\s*$/) { $Cell = $1; next; }
    if (/^\s*SO\s+(\S+)\s+(I|CK|MI|EN|PR|CL|B|E)\s+(\d+)\s+(\d+\.\d+|\d+)\s+(\d+\.\d+|\d+)\s+((x-]|\d+\.\d+|\d+)?\s*$/) {
    if (/^\s*SO\s+(\S+)\s+(I|CK|MI|EN|PR|CL|B|E)\s+(\d+)\s+(\d+\.\d+|\d+)\s+(\d+\.\d+|\d+)\s+((x+]|\d+\.\d+|\d+)?\s*$/) {
        &DieError("$Cell already defined in Parm file",1) if (defined $PinType{$Cell,$1});
        $PinType{$Cell,$1} = $2;
        $PinCap{$Cell,$1} = $3;
        if ($mapcell ne "none") {
            &DieError("$mapcell$Cell already defined in Parm file",1) if (defined $PinType{"$mapcell$Cell",$1});
            $PinType{"$mapcell$Cell",$1} = $2;
            $PinCap{"$mapcell$Cell",$1} = $3;
        }
        next;
    }
    next if (/^\s*$/);
    next if (/^\s*\*.*/);
    next if (/^\s*TA|EN|OT|SH/);
    &DieError("Syntax error at line $. of $Dir/$File",1);
}
close(TF);

# Read the .lef file to find size of cells
#   Input: file name
#   Result: CellSize()
sub ReadLef {
    local($File) = @_;
    local($Dir,$Cell);

&DieError("Could not find file '$File'.",1) if (($Dir = &FindFile($File,$path)) eq "");
    &DieError("Could not open file '$File'.",1) if (!open(TF,"$Dir/$File"));
    while(<TF>) {
        if (/^\s*MACRO\s+(\S+)\s*$/) { $Cell = $1; next; }
        if (/^\s*SIZE\s+(\d+\.\d+|\d+)\s+BY\s+(\d+\.\d+|\d+)/) {
            &DieError("$Cell already defined in Lef file",1) if (defined $CellSize{$Cell});
            $CellSize{$Cell} = $1;
            if ($mapcell ne "none") {
                &DieError("$mapcell$Cell already defined in Lef file",1) if (defined $CellSize{"$mapcell$Cell"});
                $CellSize{"$mapcell$Cell"} = $1;
            }
            next;
        }
        next if (/^\s*$/);
        next if (/^\s*\*.*/);
        next if (/^\s*FOREIGN|ORIGIN|SYMMETRY|SITE|PIN|DIRECTION|USE|SHAPE|PORT|LAYER|RECT|END|OBS/);
        &DieError("Syntax error at line $. of $Dir/$File",1);
    }
    close(TF);
}
```

ClockRoute2

```perl
# Read the .def file
sub ReadDef {
    local($SFile) = @_;
    local($/) = ";";        # record separator
    local($N,$Net);
    local($SDir,$SElem,$NumElems,,$NumFound,$Done);
    $Done = 0;

&DieError("Could not find file '$SFile'",1) if (($SDir = &FindFile($SFile,$path)) eq "");
    &DieError("Could not open file '$SFile'",1) if (!open(f,"$SDir/$SFile"));
    print "Input Def File: $SFile";
    # The order of statements in the parser matters a lot
    while(<f>) {
        # Parse the easy stuff
        s/\n/ /g;           # remove embedded newline
        s/\s*//;            # remove leading white space
        s/ +/ /g;           # remove extra white space
        next if (/^(#|DESIGN|TECHNOLOGY|HISTORY|DIEAREA|SITE|TRACKS|GCELLGRID)/);

if (/^UNITS\s+DISTANCE\s+MICRONS\s+(\d+)/) {
            $DefUnits = $1;
            next;
        }

# Parse the various blocks
        if ($NumElems && /^-\s+((\S+)/)) {
            $NumFound++;
            $Net = $1;
            &ProcessClockNet($_) if (($SElem eq "NETS") && ($ArgNets =~ /(^|:)$Net(:|)/));
            &ProcessSPNet($_) if (($SElem eq "NETS") && ($SPNets =~ /(^|:)$Net(:|)/));
            &ProcessComponent($_) if ($SElem eq "COMPONENTS");
            next;
        } if ($NumElems && (/END $SElem\s*/)) {
            s/END $SElem\s*//;
            print "$SElem count incorrect in DEF file. Expected $NumElems, found $NumFound" if ($NumElems != $NumFound);
            $NumElems = 0;
        } if (/^(PINS|VIAS|COMPONENTS|SPECIALNETS|GROUPS|NETS)\s+(\d+)/) { $SElem = $1; $NumElems = $2; $NumFound = 0; next; } if (/^END DESIGN/) { $Done = 1; last; }
        $ErrorMsg = substr($_,0,256);
        &DieError("Syntax error at statement $. (;) of $SDir/$SFile: \n    '$ErrorMsg'",1);
    }
    &DieError("Syntax error in $SDir/$SFile: Statements after 'END DESIGN'",1) if (<f>);
    &DieError("$SDir/$SFile ended before END DESIGN",1) if (!$Done);
    close(f);

for $N (split(/:/,$ArgNets)) {
        &DieError("Did not find net $N in DEF file",1) if (!defined $FoundNet($N));
    }
    &DieError("Did not find 'UNITS DISTANCE MICRONS' statement in DEF file",1) if (!(defined $DefUnits));
```

FIG. 16

ClockRoute2

```perl
# Creates the array $OnSPNet()
sub ProcessSPNet (
    local($_) = @_;
    local($Net,$elem,$count,$C,$P);

s/-\s+(\S+)\s+// || &DieError("Error in routine ProcessSPNet",1);
    $Net = $1;
    unless ($ArgNets =~ /(^|:)$Net:/) {
        $FoundSPNet($Net) = 1;
        foreach $elem (split(/\)/,$_)) {
            next if ($elem =~ /^\s*;$/);
            if ($elem =~ /^\s*\(\s*(\S+)\s+(\S+)\s*$/) {
                $C = $1; $P = $2;
                $OnSPNet($C) .= "$P;$Net:";
                $OnNet($C) .= "$P;$Net:";
            }
            else {
                &DieError("ProcessSPNet failed on '$elem'",1);
            }
        }
    }
}

# Creates the array $OnNet()
sub ProcessClockNet (
    local($_) = @_;
    local($Net,$elem,$count);

s/-\s+(\S+)\s+// || &DieError("Error in routine ProcessClockNet",1);
    $Net = $1;
    $FoundNet($Net) = 1;
    foreach $elem (split(/\)/,$_)) {
        next if ($elem =~ /^\s*;$/);
        if ($elem =~ /^\s*\(\s*(\S+)\s+(\S+)\s*$/) {
            $OnNet($1) .= "$2;$Net:";
        }
        else {
            &DieError("ProcessClockNet failed on '$elem'",1);
        }
    }
}

# Creates the arrays $CompType(), $CompX(), $CompY()
sub ProcessComponent (
    local($_) = @_;
    local($O,$Y,$C,$Ynum);
    next if (/^-\s+(\S+)\s+(\S+)\s+;/);
    next if (/^-\s+(\S+)\s+DEFCONM[1234]/);
    if (/^-\s+(\S+)\s+(\S+)\s+(FIXED|PLACED)\s+\(\s+(-?\d+)\s+(-?\d+)\s*\)\s*(S|N|FS|FN|E|W|FE|FW).*;/) {
        $CompType($1) = $2;
        $CompX($1) = $4;
    }
```

ClockRoute2

```perl
$CompY($l) = $5;
$C = $1;
$Y = $5;
$O = $6;
if (defined $BlockedCells($2)) {
    $ArgM4Row($Y) = 1;
}
if (!defined $CellSize($CompType($C))) {
    $CellSize($CompType($C)) = 0;
}
$Ynum = int($Y/$ArgRowHeight);
if ((($O eq $Orientation0) && ($Ynum %2 == 1)) || (($O eq $Orientation1) && ($Ynum %2 == 0))) {
    print stderr "WARNING: Cell $C has wrong orientation $O for row $Y" unless ($CompType($C) =~ /REFRESHVIA/);
}
else { &DieError("ProcessComponent failed on '$_'",1); }
}

# Also create the $AtY() array
sub RemoveNonClockedElems {
local($C,$Count);

for $C (keys %CompType) {
    if (defined $OnNet($C)) {
        if ($CompType($C) =~ /DEFCONM\d/) {
            print "Skipping DEFCON $C";
            next;
        }
        foreach $PN (split(/:/,$OnNet($C))) {
            ($PN =~ /^(\S+):(\S+)$/) || &DieError("Problem in Process Place Elems '$PN'",1);
            $P = $1;
            $N = $2;
            if ($C eq ($L3Master($N) || $L2Master($N))) {
                print "Skipping Master $C";
                delete $OnNet($C);
                next;
            }
            foreach $K (keys %PlaceIlx) {
                if ( (defined $PlaceAllNet($K,$N)) &&
                     ( ($inBox($CompX($C),$CompY($C),$PlaceIlx($K),$PlaceIly($K),$PlaceUrx($K),$PlaceUry($K))) ||
                       (($SpBoxRegexp($K) ne "") && ($C =~ /^$SpBoxRegexp($K)$/) ) )
                   ) {
                    $SPBoxType($N,$C) = $K;
                    $SPType($N,$C) = $CompType($C);
                    next;
                }
            }
        }
    }
    $Count++;
    $AtY($CompY($C)) .= $C . " ";
}
}
```

ClockRoute2

```perl
        }
        else { delete $CompType($C); delete $CompX($C); delete $CompY($C); }
    }
    print "Found $Count devices on clock nets";
} return absolute value
sub Pos {
    local($N) = @_;
    return (0 - $N) if ( $N < 0 );
    return $N;
}

# Add placed elements to $DefComponents
sub ProcessPlacedElems {
    local($K,$X,$Y,$Inst,$Orient);
    for $K (keys %PlaceNet) {
        $X = int($PlaceXPos{$K}/$ArgGrid);
        $Y = int($PlaceYPos{$K}/$ArgRowHeight);
        $Orient = $Orientation0 if ($Y %2 == 0);
        $Orient = $Orientation1 if ($Y %2 == 1);
        $Inst = "BUF_" . $PlaceNet{$K} . "_SP_" . $X . "_" . $Y;
        $DefComponents{$PlaceNet{$K}} .= "- " . $Inst.$ArgBufferName + FIXED ( $PlaceXPos{$K} $PlaceYPos{$K} ) $Orient ;\n";
        $VerilogInst{$PlaceNet{$K}} .= "$ArgBufferNameLc $Inst" . "(" . "$ArgBufferIn" . "$PlaceNetV{$K}" . "), " . "$ArgBufferIn"
        . "$ArgNetInV{$PlaceNet{$K}}" . ")); \n";
        $DefNetIn{$ArgNetIn{$PlaceNet{$K}}} .= "\n( $Inst $ArgBufferIn ) ";
        $DefNetOut{$PlaceNet{$K}} .= "\n( $Inst $ArgBufferOut ) ";
        $L3XPos{$Inst,$PlaceNet{$K}} = $PlaceXPos{$K};
        $L3YPos{$Inst,$PlaceNet{$K}} = $PlaceYPos{$K};
        $L3Net{$Inst,$PlaceNet{$K}} = $ArgNetIn{$PlaceNet{$K}};
    }
} sub numerically {$a <=> $b;}
sub ByX {$CompX{$a} <=> $CompX{$b};}

# Find Clock Cap for each row in each region
sub ProcessStdCellRows {
    local($Y,$C,$PN,$P,$N,$B,$K);

# figure out the wire length and capacitance for each row by looking at
    # all rows, all devices (in X order) and all nexts
    for $Y (sort numerically keys %AtY) {
        undef %CurrBox;
        foreach $C (sort ByX split(/:/,$AtY{$Y})) {
            foreach $PN (split(/:/,$OnNet{$C})) {
                ($SPN =~ /^((\S+):((\S+)$/) || &DieError("Problem in ProcessStdCellRows '$PN'",1);
                $P = $1;
                $N = $2;
                if (defined $ExtraLoad{$C,$P}) {
```

ClockRoute2

```
$ExtraLoadNet($C,$P) = $N;
next;
}
if (! defined $PinCap($CompType($C),$P)) {
    &DieError("Capacitance for device $C type $CompType($C) pin $P not found in any Parmfile. Skipping",0);
    next;
}
if ( ($PinType($CompType($C),$P) ne "CK") && (! defined $ArgAllowClock($CompType($C),$P)) ) {
    $ErrMsg = "Unexpected pin type '$PinType($CompType($C),$P)' of device $C ($CompType($C)) pin $P";
    $ErrMsg .= " on clock net $N. Skipping";
    &DieError($ErrMsg,0);
    next;
}
if (defined $$PType($N,$C)) {
    $SPCap($SPBoxType($N,$C),$N) += $PinCap($CompType($C),$P);
    $SPCount($SPBoxType($N,$C),$N) ++;
    next;
}
if (! defined $ArgAllClocks($N)) {
    &DieError("Device $C ($CompType($C)) at ($CompX($C),$Y) on SPBox net '$N' but in no SPBox. Skipping",0);
    next;
}
if ( ($B = &FindBox($CompX($C),$Y)) eq "") {
    &DieError("Device $C ($CompType($C)) at ($CompX($C),$Y) not in any ClockBox. Skipping",0);
    next;
}
if ($CurrBox($N) ne $B) {          # start new box
    #$RowMostX($N,$Y,$B) = &Min($CompX($C), $ArgBoxOutX($B,$N) + $ArgWireWidth);
    $RowLeastX($N,$Y,$B) = &Max($CompX($C), $ArgBoxOutX($B,$N) + $ArgWireWidth);
    $RowMostX($N,$Y,$B) = &Max($CompX($C)+$CellSize($CompType($C))*$DefUnits, $ArgBoxOutX($B,$N) + $ArgWireWidth);
    $RowGate($N,$Y,$B) += $PinCap($CompType($C),$P);
    $BoxDevices($N,$Y,$B)++;
    $BoxDevices($N)++;
    $CurrBox($N) = $B;
}
}
for $B (keys %ArgBoxAtlix) {
for $N (keys %ArgAllClocks) {
    $Wirelength($B,$N) = 0;
    for ($Y = $ArgBoxAtlly($B); $Y < $ArgBoxAtury($B); $Y += $ArgRowHeight) {
        local($sdist) = &Pos($RowMostX($N,$Y,$B) - $ArgBoxOutX($B,$N));
        $Wirelength($B,$N) = &Max($sdist, $Wirelength($B,$N)) if (defined $RowMostX($N,$Y,$B));
        $sdist = &Pos($RowLeastX($N,$Y,$B) - $ArgBoxOutX($B,$N));
        $Wirelength($B,$N) = &Max($Wirelength($B,$N), $sdist) if (defined $RowLeastX($N,$Y,$B));
    }
}
}
$ErrorsSeen = 0;     # BOZO
&DieError("Can't continue due to previous errors",1) if ($ErrorsSeen);
}
```

ClockRoute2

```perl
sub TotalCap {
    local($Y,$B,$N,$K,$Error);
    for $B (keys %ArgAllClocks) {
        for $N (keys %ArgAllClocks) {
            for ($Y = $ArgBoxAtlly($B); $Y < $ArgBoxAtury($B); $Y += $ArgRowHeight) {
                $RowCap($N,$Y,$B) = $RowGate($N,$Y,$B);
                delete $RowGate($N,$Y,$B);
                $RowCap($N,$Y,$B) += (($ArgRowHeight * $ArgWireCap("5"))/100);
                next if (!defined $RowMostX($N,$Y,$B));
                $RowLength($N,$Y,$B) = ($RowMostX($N,$Y,$B) - $RowLeastX($N,$Y,$B)) / $DefUnits;
                $RowCap($N,$Y,$B) += (($RowLength($N,$Y,$B) * $ArgWireCap("4"))/100);
            }
        }
    }
    $Error = 0;
    for $K (keys %RowGate) {
        print stderr "Internal Error: RowGate of $K ($RowGate($K)) lost by ClockRoute";
        $Error = 1;
    }
    &DieError("FATAL internal error",1) if ($Error);

for $K (keys %ExtraLoad) {
        &DieError("Net not found for Load of '$ExtraLoadInst($K)'. Possible internal error in ClockRoute",1) if (!defined $ExtraLoadNet($K));
        if ($ExtraLoad($K) =~ /PARM/i) {
            &DieError("Capacitance for $ExtraLoadInst($K) not found in parm file.",1) if (! defined $PinCap($CompType($ExtraLoadInst($K)),
$ExtraLoadPin($K)));
            $ExtraLoad($K) = $PinCap($CompType($ExtraLoadInst($K)),$ExtraLoadPin($K));
        }
        print "Add extra load of $ExtraLoad($K) pF to $ExtraLoadBox($K) $ExtraLoadNet($K) at Y=$ExtraLoadY($K)";
        $RowCap($ExtraLoadNet($K),$ExtraLoadY($K),$ExtraLoadBox($K)) += $ExtraLoad($K);
    }
} sub Min {
    local($a,$b) = @_;
    ($a < $b) ? $a : $b;
}
sub Max {
    local($a,$b) = @_;
    ($a > $b) ? $a : $b;
} sub LimitWiresToAssignedRows {
    local($Y,$B,$N,$step);
    for $B (keys %ArgAllClocks) {
        for $N (keys %ArgRowPrewire($B,$N)) {
            if (! defined $ArgRowPrewire($B,$N)) {
                for $Y (keys %ArgC4Row) {
                    delete $RowLeastX($N,$Y,$B) if(defined $ArgC4Row($Y)); #remove wire for C4 row
                    delete $RowMostX($N,$Y,$B) if(defined $ArgC4Row($Y));
```

ClockRoute2

```perl
    }
    next;
}
$Step = $ArgRowPrewire($B,$N);
$MostX = 0;
$LeastX = 9999999999999;
for ($Y = $ArgBoxAtlly($B); $Y < $ArgBoxAtury($B); $Y += $ArgRowHeight) {
    if (defined $RowLeastX($N,$Y,$B)) {
        &DieError("internal error in LimitWiresToAssignedRows $N,$Y,$B",1) if (!defined $RowMostX($N,$Y,$B));
        $LeastX = &Min($LeastX,$RowLeastX($N,$Y,$B));
        $MostX = &Max($MostX,$RowMostX($N,$Y,$B));
    }
    delete $RowLeastX($N,$Y,$B);
    delete $RowMostX($N,$Y,$B);
    next if((defined $ArgC4Row($Y)) || (defined $ArgM4Row($Y)));   # dont prewire in C4 turn row or M4Row
    next if(&CheckNoWire($Y,$B));
    if (--$Step == 0) {
        if ($LeastX != 9999999999999) {
            $RowLeastX($N,$Y,$B) = $LeastX;
            $RowMostX($N,$Y,$B) = $MostX;
        }
        $Step = $ArgRowPrewire($B,$N);
        $MostX = 0;
        $LeastX = 9999999999999;
    }
}
unless (&CheckNoWire($Y-$ArgRowHeight,$B)) {
    if ($Step != $ArgRowPrewire($B,$N)) {    # add a wire at the top if uneven total number
        $Y -= $ArgRowHeight;
        if ($LeastX != 9999999999999) {
            $RowLeastX($N,$Y,$B) = $LeastX;
            $RowMostX($N,$Y,$B) = $MostX;
            delete $RowLeastX($N,$Y,$B) if((defined $ArgC4Row($Y)) || (defined $ArgM4Row($Y)));   # dont prewire in C4 turn row
                                                                                                    or M4Row
        }
    }
}
} sub CheckNoWire {
    local($Y,$B) = @_;
    local($K,$n);
    $n=0;
    for $K (keys %ArgNoWireMinY) {    # check for no strap region
        if(($ArgNoWireBox($K) == $B) && ($ArgNoWireMinY($K) <= $Y) && ($ArgNoWireMaxY($K) > $Y)) {
            $n=1;
        }
    }
    return $n;
}
```

ClockRoute2

```
sub AddStraps {
    local($Y,$B,$Ni,$K);
    for $B (keys %ArgBoxAtlIx) {
        for $N (keys %ArgAllClocks) {
            next if (! defined $ArgRowStrapToEdge($B,$N));
            $Step = $ArgRowStrapToEdge($B,$N) * $ArgRowHeight;
            for ($Y = $ArgBoxAtlly($B) + (($Step - 1) * $ArgRowHeight);
                 $Y < $ArgBoxAtury($B);
                 $Y += $Step) {
*** for ($Y = $ArgBoxAtlly($B); $Y < $ArgBoxAtury($B); $Y += $ArgRowHeight) {
                next if(defined $ArgC4Row($Y));  #dont strap in C4 turn row
                next if(defined $ArgM4Row($Y));  #dont strap in M4 row
                next if($Y % $Step);
                next if(&CheckNoStrap($Y,$B));
                if (&CheckLeftStrap($Y,$B)) {
                    $RowLeastX($N,$Y,$B) = $ArgBoxAtlx($B);
                    $RowMostX($N,$Y,$B) = $ArgBoxAturx($B);
                    $RowMostX($N,$Y,$B) = $ArgBoxOutX($B,$N);
                    next;
                }
                if (&CheckRightStrap($Y,$B)) {
                    $RowMostX($N,$Y,$B) = $ArgBoxAturx($B);
                    $RowLeastX($N,$Y,$B) = $ArgBoxAtlx($B);
                    $RowMostX($N,$Y,$B) = $ArgBoxOutX($B,$N);
                    next;
                }
                $RowLeastX($N,$Y,$B) = $ArgBoxAtlx($B);
                $RowMostX($N,$Y,$B) = $ArgBoxAturx($B);
            }
        }
    }
} sub CheckNoStrap {
    local($Y,$B) = @_;
    local($K,$n);
    $n=0;
    for $K (keys %ArgNoStrapMinY) {   #check for no strap region
        if(($ArgNoStrapBox($K) =~ $B) && ($ArgNoStrapMinY($K) <= $Y) && ($ArgNoStrapMaxY($K) > $Y)) {
            $n=1;
        }
    }
    return $n;
} sub CheckLeftStrap {
    local($Y,$B) = @_;
    local($K,$n);
    $n=0;
    for $K (keys %ArgLeftStrapMinY) {  # check for left strap region
        if(($ArgLeftStrapBox($K) =~ $B) && ($ArgLeftStrapMinY($K) <= $Y) && ($ArgLeftStrapMaxY($K) > $Y)) {
            $n=1;
        }
    }
}
```

ClockRoute2

```
    }
    return $n;
} sub CheckRightStrap {
    local($Y,$B) = @_;
    local($K,$n);
    $n=0;
    for $K (keys %ArgRightStrapMinY) {   # check for Right strap region
        if(($ArgRightStrapBox($K) == $B) && ($ArgRightStrapMinY($K) <= $Y) && ($ArgRightStrapMaxY($K) > $Y) ) {
            $n=1;
        }
    }
    return $n;
} sub reverse { $b cmp $a; } sub AssignBuffersAndInputViasAndWires {
    local($Y,$N,$B,$N,$Num,$CurrCap,$NumBuf,$NextRow,$RowsLeft,$CName,$ClkDrive,$BN,$Row,$XPos);
    local($BufsWithoutPrewire,$BufStartX,$BufEndX,$Redo,$BufsToAdd);
    local($tmpY, $tmpRows);
    local($NotEnoughBuf) = 0;

print "-----------------------------------------------------------";
    for $B (keys %ArgBoxAtllx) {
        for $N (sort keys %ArgAllClocks) {
            if ($BoxDevices($N,$B) == 0) {
                print "WARNING $B contains no devices on net $N";
                next;
            }
            $ClkDrive = $ArgBufferCap;
            $ClkDrive *= $ArgClkDrvMult($N) if (defined $ArgClkDrvMult($N));
            print "Process $B $N";
            $CurrCap = 0;
            $TotalBufs($B,$N) = 0;
            # Gather up capacitance for first $ArgRowLookahead rows
            for ($Y = $ArgBoxAtlly($B),$Num = 0; ($Y < $ArgBoxAtury($B))&&($Num < $ArgRowLookahead); $Y += $ArgRowHeight, $Num++) {
                $CurrCap += $RowCap($N,$Y,$B);
                $NumBufsAlready($B,$Y) = $ArgBoxNumBuffer($B,$Y) * $ArgBoxNumBuf($B) if (! defined $NumBufsAlready($B,$Y));
            }
            # Assign buffers to each row
            for ($Y = $ArgBoxAtlly($B); $Y < $ArgBoxAtury($B); $Y += $ArgRowHeight) {
                $NumBufsAlready($B,$Y) = $ArgNoBuffer($B,$Y) * $ArgBoxNumBuf($B) if (! defined $NumBufsAlready($B,$Y));
                $RowsLeft = int(($ArgBoxAtury($B) - $Y) / $ArgRowHeight);
                $tmpRows = $RowsLeft;
                for ($tmpY = $Y; $tmpY < $Y + $ArgRowHeight * $tmpRows; $tmpY += $ArgRowHeight) {
                    next if ($RowsLeft == 1);
                    $NumBufsAlready($B,$Y) -= $NumBufsAlready($B,$tmpY);
                    $RowsLeft = $RowsLeft -1 if ($ArgBoxNumBuf($B) == $NumBufsAlready($B,$tmpY));
                }
                $RowsLeft = $ArgRowLookahead if ($RowsLeft > $ArgRowLookahead);
                $BufsWithoutPrewire = 0;
```

ClockRoute2

```
$RowRot{$Y} = $Orientation0 if ($Y/$ArgRowHeight %2 == 0);
$RowRot{$Y} = $Orientation1 if ($Y/$ArgRowHeight %2 == 1);
do {
    $Redo = 0;
    $NumBuf = int( ( ($CurrCap / $ClkDrive) / $RowsLeft) + 0.5 );
    $NumBuf = 1 if (($NumBuf == 0) && $CurrCap && ($TotalBufs{$B,$N} == 0));    # force at least one buffer
    $NumBuf = 1 if (($NumBuf == 0) && ($CurrCap > $ClkDrive));
    ## hack to ensure no buffers in C4 turn row ##
    if ((defined $ArgC4Row{$Y}) && ($NumBuf != 0)) {
        $NumBuf = 0;
        print "Cannot add a buffer in C4 turn row y=$Y";
        $NumBufsAlready{$B,$Y} = $ArgNoBuffer{$B,$Y} = $ArgBoxNumBuf{$B,$Y) * $NumBufsAlready{$B,$Y} if (! defined $NumBufsAlready{$B,$Y));
    }
    $BufsToAdd = &Min($NumBuf, ($ArgBoxNumBuf{$B} - $NumBufsAlready{$B});
    $BufStartX = $ArgBoxBufX{$B} + ($ArgBufferSize * $NumBufsAlready{$B,$Y));
    $BufEndX = $ArgBoxBufX{$B} + ($ArgBufferSize * ($NumBufsAlready{$B,$Y} + $BufsToAdd));
    # if putting down a buffer in a row and strap wire does not extend to buffer, extend it
    if ($BufsToAdd && (defined $RowLeastX{$N,$Y,$B}) &&
       (($RowLeastX{$N,$Y,$B} > $BufStartX) || ($RowMostX{$N,$Y,$B} < $BufEndX))) {
        # remove old wire cap
        $RowLength{$N,$Y,$B} = ($RowMostX{$N,$Y,$B} - $RowLeastX{$N,$Y,$B}) / $DefUnits;
        $CurrCap -= (($RowLength{$N,$Y,$B} * $ArgWireCap("4"))/100);
        $RowCap{$N,$Y,$B} -= (($RowLength{$N,$Y,$B} * $ArgWireCap("4"))/100);
        # set new wire length and add in cap
        $RowLeastX{$N,$Y,$B} = &Min($RowLeastX{$N,$Y,$B}, $BufStartX);
        $RowMostX{$N,$Y,$B} = &Max( $RowMostX{$N,$Y,$B}, $BufEndX );
        $RowLength{$N,$Y,$B} = ($RowMostX{$N,$Y,$B} - $RowLeastX{$N,$Y,$B}) / $DefUnits;
        $CurrCap += (($RowLength{$N,$Y,$B} * $ArgWireCap("4"))/100);
        $RowCap{$N,$Y,$B} += (($RowLength{$N,$Y,$B} * $ArgWireCap("4"))/100);
        $Redo = 1;
    }
    # if putting down a buffer in a row with no strap wire need to add a strap wire from M5 to buffer
    if ($BufsToAdd && (! defined $RowLeastX{$N,$Y,$B})) {
        $BufsWithoutPrewire = 1;
        $RowLeastX{$N,$Y,$B} = &Min($ArgBoxOutX{$B,$N}, $BufStartX);
        $RowMostX{$N,$Y,$B} = &Max($ArgBoxOutX{$B,$N} + $ArgWireWidth, $BufEndX);
        # recalculate capacitance and number of buffers required
        $RowLength{$N,$Y,$B} = ($RowMostX{$N,$Y,$B} - $RowLeastX{$N,$Y,$B}) / $DefUnits;
        $CurrCap += (($RowLength{$N,$Y,$B} * $ArgWireCap("4"))/100);
        $RowCap{$N,$Y,$B} += (($RowLength{$N,$Y,$B} * $ArgWireCap("4"))/100);
        $Redo = 1;
    }
} while ($Redo);

if ($NumBuf > ($ArgBoxNumBuf{$B} - $NumBufsAlready{$B,$Y})) {
    printf " WARNING: Need $NumBuf buffer" . &Plural($NumBuf) . ". Allowed ";
    printf $ArgBoxNumBuf{$B} - $NumBufsAlready{$B,$Y};
    printf " at row Y=$Y\n";
    $NumBuf = $ArgBoxNumBuf{$B} - $NumBufsAlready{$B,$Y};
    $NotEnoughBuf = 1;
} else { $NotEnoughBuf = 0; }
```

FIG. 25

ClockRoute2

```
$CurrCap -= ($NumBuf * $ClkDrive);
$NextRow = $Y + ($ArgRowLookahead * $ArgRowHeight);
$CurrCap += $RowCap($N,$NextRow,$B);
$TotalBufs($B,$N) += $NumBuf;
if ($NumBuf) {
    $BufTotals($N,$Y,$B) = $NumBuf;
    printf "    assign $NumBuf buffer", &Plural($NumBuf) . " at row $Y";
    printf " (without stdcell prewire)" if ($BufsWithoutPrewire);
    print "";
    for ($BN = 0; $BN < $NumBuf; $BN++) {
        $XPos = $ArgBoxBufX($B) + ($ArgBufferSize * $NumBufsAlready($B,$Y));
        $Row = $Y / $ArgRowHeight;
        $CName = "BUF_".$B."_".$N."_".$Row."_".$NumBufsAlready($B,$Y);
        $DefComponents($N) .= "- $CName $ArgBufferName + FIXED ( $XPos $Y ) $RowRot($Y) ;\n";
        $VerilogInst($N) .= "$ArgBufferNameLc $CName " ."(.". "$ArgBufferOut" ."(". "$NetV($N)" .") ,  ." . $N._.$RowRot($Y) ."("
        . "$ArgNetInV($N)" .");\n";
        $DefNetIn($ArgNetIn($N)) .= "\n( $CName $ArgBufferIn ) ";
        $DefNetOut($N) = "\n( $CName $ArgBufferOut ) ";
        &AddInputWireAndVia($ArgBoxInX($B,$N), $XPos, $Y, $NumBufsAlready($B,$Y), $B, "_".$Y._.$N, $RowRot($Y));
        $NumBufsAlready($B,$Y)++;
        $L3XPos($CName,$N) = $XPos;
        $L3YPos($CName,$N) = $Y;
        $L3Net($CName,$N) = $ArgNetIn($N);
    }
}
#&DieError("Not enough buffers for $N in $B. Excess Cap is $CurrCap pF",1) if ($CurrCap > ($ClkDrive/2));
printf stderr "Not enough buffers for $N in $B. Excess Cap is %.4f pF\n", $CurrCap if ($NotEnoughBuf);
printf "     excess capacitance %.4f pF\n", $CurrCap if ($CurrCap);
printf "     WARNING: Not enough buffers for $N in $B.\n" if ($NotEnoughBuf);
printf "     average capacitance %.4f pF per buffer\n", $ClkDrive + $CurrCap/$TotalBufs($B,$N) if ($CurrCap && $TotalBufs($B,$N));
printf "     maximum distance from buffer to latch %.if um\n", $Wirelength($B,$N)/$DefUnits;
printf "     total of $TotalBufs($B,$N) buffer" . &Plural($TotalBufs($B,$N))."\n" if ($TotalBufs($B,$N));
} print "";
print "Box         Clock        Y         Cap pF    Bufs Devices Wire from      to";
print "---         -----        -         ------    ---- ------- ---------      --";
local($AnyInLastBox);
for $B (keys %ArgBoxAtllx) {
    for $N (keys %ArgAllClocks) {
        $AnyInLastBox = 0;
        for ($Y = $ArgBoxAtly($B); $Y < $ArgBoxAtury($B); $Y += $ArgRowHeight) {
            next if ( ((! defined $RowCap($N,$Y,$B)) || ($RowCap($N,$Y,$B) == (($ArgRowHeight * $ArgWirecap("5")/$DefUnits))) &&
                (!defined $BufTotals($N,$Y,$B)) && (!defined $RowCap($N,$Y,$B));
                (! defined $RowDevices($N,$Y,$B)) && (!defined $RowMostX($N,$Y,$B));
            $AnyInLastBox = 1;
            printf "%-10s %-8s %12d %8.4f", $B, $N, $Y, $RowCap($N,$Y,$B);
            printf " %4s", $BufTotals($N,$Y,$B);
            printf " %7s", $RowDevices($N,$Y,$B), $RowLeastX($N,$Y,$B);
            printf " %12s\n", $RowDevices($N,$Y,$B), $RowMostX($N,$Y,$B);
        }
    }
}
```

ClockRoute2

```
        print "" if ($AnyInLastBox);
    }
}
print "";
if ($SPBox) {
    print "SPBox       Clock           Cap pF      Bufs    Devices";
    print "------      --------        -------     -----   ---------";
    for $B (keys %Placellx) {
        for $N (split(/:/,$SPNets)) {
            if (defined $PlaceAllNet{$B,$N}) {
                printf "%-10s %-8s %8.4f", $B, $N, $SPCap{$B,$N};
                printf "%4s %7s\n", $SPBufCount{$B,$N}, $SPCount{$B,$N};
            }
        }
    }
} sub ProcessL2Buffers {
    local($B, $K, $N, $i, $CName, $XPos, $Count, $YPos);
    if (defined $FoundL2Box) {
        print "\n";
        print "L2Box       Clock           Cap pF      Bufs    L3 buffers";
        print "------      --------        -------     -----   -----------";
    }
    for $B (keys %L2Boxllx) {
        $L2BoxNumRow($B) = 1 if (! defined $L2BoxNumRow($B));
        $Count = 0;
        foreach $K (keys %L3Net) {
            if (&InBox($L3XPos($K),$L3YPos($K),$L2Boxllx($B),$L2Boxlly($B),$L2Boxurx($B),$L2Boxury($B))) {
                $L3NumBuf($B,$L3Net($K)) ++;
                $L3Cap($L3Net($K)) += $L3BufferCap;
                $L2NumBufTot($B) += $L2NumBuf($N);
                delete $L3Net($K);
            }
        }
        foreach $N (keys %L3Cap) {
            $L3Cap($N) += $WireLoad($B,$N);
            $L2NumBuf($N) = int($L3Cap($N)/$ArgBufferCap + 0.5);
            $L2NumBufTot($B) += $L2NumBuf($N);
            if (($L2BoxNumBuf($B) * $L2BoxNumRow($B)) < $L2NumBufTot($B)) {
                &DieError("Not enough L2 buffer sites in $B. $L2NumBufTot($B) needed. Only ".$L2BoxNumBuf($B) * $L2BoxNumRow($B)." availabl
e.",0);
                print stderr "WARNING: Not enough L2 buffer sites in $B. $L2NumBufTot($B) needed. Only ".$L2BoxNumBuf($B) * $L2BoxNumRow($B)
." available.";
            }
            printf "%-10s %-8s %8.4f", $B, $N, $L3Cap($N);
            printf " ** %7s\n", $L3NumBuf($B,$N);
            $L3Cap($N) = 0;
            next;
        }
        for ($i = 1; $i <= $L2NumBuf($N); $i++) {
            $CName = "L2BUF_".$B."_".$N."_".$i;
            $Count ++;
```

ClockRoute2

```perl
$XPos = $L2BoxBufX($SB) + (($Count - 1) % $L2BoxNumBuf($SB)) * $ArgBufferSize;
$YPos = $L2BoxBufY($SB) + int(($Count - 1)/$L2BoxNumBuf($SB)) * $ArgRowHeight;
if (! defined $RowRot($YPos)) {
    $RowRot($YPos) = $Orientation0 if ($YPos/$ArgRowHeight %2 == 0);
    $RowRot($YPos) = $Orientation1 if ($YPos/$ArgRowHeight %2 == 1);
}
$L2DefComponents($SN) .= "- $CName $ArgBufferName + FIXED ( $XPos $YPos ) $RowRot($YPos) ;\n";
$VerilogInst($SN) .= "$ArgBufferNameLc $CName" . " (" . "$ArgBufferOut" . " (" . "$ArgNetInv($SN)" . " ), " . "$ArgBufferIn"
. " (" . "$L2ArgNetInv($SN)" . " ));\n" ;
$L2DefNetIn($ArgNetIn($SN)) .= "\n( $CName $ArgBufferIn ) ";
$L2DefNetOut($SN) .= "\n( $CName $ArgBufferOut ) ";

printf "%-10s %8.4f", $B, $N, $L3Cap($SN);
printf " %4s %7s\n", $L2NumBuf($SN), $L3NumBuf($SB,$SN);
$L3Cap($SN) = 0;
}
for $K (keys %L3Net) {
    &DieError("L3Buffer $K is not in any L2Box",1) if (defined $FoundL2Box);
}
&PlaceL2Wire();
} sub PlaceL2Wire {
local($SB,$W,@order1,@order2,$offset,$i,$endwidth,$midwidth,$space,$center);
$endwidth = 2*$ArgGrid;
$midwidth = 2.5*$ArgGrid;
$space = 0.5*$ArgGrid;
foreach $W (split(/;/,$ArgM4RowPair)) {
    ($W =~ /^(\S+):((\S+)\S/) || &DieError("Problem in PlaceL2Wire '$W'",1);
    $P1 = $1;
    $P2 = $2;
    @order1 = split(',',$ArgM4RowOrder($P1));
    @order2 = split(',',$ArgM4RowOrder($P2));
    for $B (keys %L2Boxllx) {
        if ($P1 >= $L2Boxlly($B) && $P1 < $L2Boxury($B)) {
            if (defined $ArgM4RowOffset($P1)) {
                $offset = $ArgM4RowOffset($P1) + $P1; # BOZO shorts can occur if user is not careful!
            } else {
                $offset = 5.25 * $ArgGrid + $P1;
            }
            &ProcessL2Wire($endwidth,$order1[0],$offset,$L2Boxllx($B),$L2Boxurx($B)); #bottom end case
            &AddL2Via($P1,$order1[0],$offset,$endwidth) if ($NewWire);
            next if ( $#order1 == 0 );
            for ($i = 1; $i < $#order1; $i++) {
                $center = (0.5*$endwidth)+$space+($space+$midwidth)*($i-1)+(0.5*$midwidth)+$offset;
                &ProcessL2Wire($midwidth,$order1[$i],$center,$L2Boxllx($B),$L2Boxurx($B)); #middle case
                &AddL2Via($P1,$order1[$i],$center,$midwidth) if ($NewWire);
            }
            $center = (0.5*$endwidth)+$space+($space+$midwidth)*($#order1-1)+(0.5*$midwidth)+$offset;
            &ProcessL2Wire($endwidth,$order1[$#order1],$center,$L2Boxllx($B),$L2Boxurx($B)); #top end case
            &AddL2Via($P1,$order1[$#order1],$center,$endwidth) if ($NewWire);
```

ClockRoute2

```perl
    }
    if ($P2 >= $L2Boxlly($B) && $P2 < $L2Boxury($B)) {
        if (defined $ArgM4RowOffset($P2)) {
            $offset = $ArgM4RowOffset($P2) + $P2;
        } else {
            $offset = 5.25 * $ArgGrid + $P2;
        }
        &ProcessL2Wire($sendwidth,$order2[0],$offset,$L2Boxllx($B),$L2Boxurx($B)); #bottom end case
        &AddL2Via($P2,$order2[0],$offset,$endwidth) if ($NewWire);
        next if ( $#order2 == 0 );
        for ($i = 1; $i < $#order2; $i++) {
            $center = (0.5*$sendwidth)+$sspace+($sspace+$midwidth)*($si-1)+(0.5*$midwidth)+$offset;
            &ProcessL2Wire($midwidth,$order2[$si],$center,$L2Boxllx($B),$L2Boxurx($B)); #middle case
            &AddL2Via($P2,$order2[$si],$center,$midwidth) if ($NewWire);
        }
        $center = (0.5*$sendwidth)+$sspace+($sspace+$midwidth)*($#order2-1)+(0.5*$sendwidth)+$offset;
        &ProcessL2Wire($sendwidth,$order2[$#order2],$center,$L2Boxllx($B),$L2Boxurx($B)); #top end case
        &AddL2Via($P2,$order2[$#order2],$center,$endwidth) if ($NewWire);
    }
} sub ProcessL2Wire {
    local($W,$N,$index,$start,$end) = @_;
    local($net,$startW,$endW,$set,$lastEndW,$L2Wire2);
    $lastEndW = -9999;
    $L2Wire2 = "";
    $NewWire = 0;
    foreach $set (split(/:/,$L2Wire($index))) {
        ($set =~ /^(\S+):(\S+):(\S+)$/) || &DieError("bad data in L2 wire list",1);
        $startW = $1;
        $endW = $2;
        $net = $3;
        $width = $4;
        if ($start > $startW) {
            if ($start == $endW) {
                &DieError("Abutting L2 wires short $N to $net at $start, $index",1) if ($N !~ /$net/);
                $endW = $end;
                $start = $startW;
                $lastEndW = $endW;
            } else { $lastEndW = $endW; }
        } elsif ($start < $startW) {
            if ($end == $startW) {
                &DieError("Abutting L2 wires short $N to $net at $startW, $index",1) if ($N !~ /$net/);
                $startW = $start;
                $lastEndW = $endW;
            } elsif ($start > $lastEndW ) { # insert new wire
                $L2ire2 .= $start . ":" . $end . ":" . $N . ":";
                $lastEndW = $endW;
```

ClockRoute2

```perl
      }
    } elsif ($start == $startW) {
        print "what the heck?? Two wires with same start point in ProcessL2Wire.\n";
        &DieError("Abutting L2 wires short $N to $net at $startW, $index",1) if ($N !~ /$net/);
        $endW = &Max($end,$endW);
        $lastendW = $endW;
    }

$L2Wire2 .= $startW . ";" . $endW . ";" . $net . ";" . $width . ";";
}
if ($start > $lastEndW) {    # put new wire in first or last
    $L2Wire2 .= $start . ";" . $end . ";" . $N . ";" . $W . ";";
    $NewWire = 1;
}
$L2Wire{$index} = $L2Wire2;
$L2Index{$index} = $index;
$L2Wire2 = "";

}
sub AddL2Via {
    local($Y,$N,$YPos,$width) = @_;
    local($K,$Net,$XViaPos);
    $YViaPos = $YPos - (0.5 * $width);
    for $K (keys %ArgBoxAtllx) {
        if ( ($Y >= $ArgBoxAtlly{$K}) && ($Y < $ArgNetTury{$K}) ) {
            $Net = $ArgNetOut{$N};
            if (defined $ArgBoxInX{$K,$Net}) {
                $XViaPos = $ArgBoxInX{$K,$Net} - (0.5 * $ArgWireWidth) - 5;   # assumes via is 2.7 by 2.7 with minimum M5
                $DefVias .= "_L2VIA_$(N)_$(ArgBoxInX{$K,$Net})_$(Y) M45CLKVIA + FIXED ( $XViaPos $YViaPos ) $RowRot{$Y} ;\n";
                $ViaNumber ++;
            }
        }
    }
} sub Plural {
    local($val) = @_;
    if ($val == 1) { return ""; } else {return "s";}
}

# The formula (N + int(N/2) + 1) gives the Y offset from the middle for wires spaced in the pattern +1,+2,+4,+5,+7,+8....
sub AddInputWireAndVia {
    local($XWirePos, $XBufPos, $Y, $WiresInRow, $Name, $Rot) = @_;
    local($YWirePos, $XWireStart, $XWireEnd, $Middle, $XViaPos, $YViaPos, $VName);

$Middle = $ArgGrid * (($ArgNumTracks/2) + 0.5);                         # middle of row
    $YWirePos = $SY + $Middle - ($ArgGrid * ($WiresInRow + int($WiresInRow/2) + 1));
    $XWireStart = &Min($XWirePos, $XBufPos+3*$ArgGrid);                    # BOZO move wire 3 grids from possible pins of buffer
    $XWireEnd = &Max($XWirePos + $ArgWireWidth, $XBufPos + $ArgBufferSize - 3 * $ArgGrid);  # BOZO move wire 3 grids from possible pins of buffer
uffer
    #### move wire away from middle of row for M4 wire rows #####
```

ClockRoute2

```perl
$YWirePos = $Y + ($ArgGrid * ($WiresInRow + 0.5)) if (defined $ArgM4Row($SY));
&DieError("Input wire in M4Row $Y conflicts with power bus",1) if (($YWirePos > ($Y + 2 * $ArgGrid)) && ($YWirePos < ($Y + 5 * $ArgGrid)
)));
&ProcessWire("H","M4",$ArgNetIn($N),$YWirePos,$XWireStart,$XWireEnd,"noviasat");
#     $WireAdds .= "add wire nodrc short noviasat net $ArgNetIn($N) l M4 ( $XWireStart $YWirePos ) ( $XWireEnd $YWirePos ) ;\n";
$XViaPos = $XWirePos - (0.5 * $ArgWireWidth) -5; # assumes 2.70 by 2.70 via and minimum M5
if ($WiresInRow % 2) {                # odd face down
    $YViaPos = $YWirePos - (2.25 * $DefUnits);
}
else {                                # even face up
    $YViaPos = $YWirePos - (0.45 * $DefUnits);
}
if (defined $ArgM4Row($SY)) {
    if ($WiresInRow % 2) {            # odd face up
        $YViaPos = $YWirePos - (0.45 * $DefUnits);
    }
    else {                            # even face down
        $YViaPos = $YWirePos - (2.25 * $DefUnits);
    }
}
$VName = " VIAIN_".$Name."_".$WiresInRow;
$DefVias .= "- $VName M45CLKVIA + FIXED ( $XViaPos $YViaPos ) SRot ;\n";
$ViaNumber ++;
}

# The formula (N + int(N/2) + 1) gives the Y offset from the middle for wires spaced in the pattern +1,+2,+4,+5,+7,+8,...
sub AddOutputWiresAndVias {
local($B, $Y, $N, $WiresInRow, $XWireStart, $XWireEnd, $YWirePos, $Middle, $XViaPos, $YViaPos, $VName);

$Middle = $ArgGrid * (($ArgNumTracks/2) + 0.5);    # middle of row

# Add wire and via on L3 outputs. These wires go tracks above the center of the row
for $B (keys %ArgBoxAtllX) {
    for ($Y = $ArgBoxAtlly($B); $Y < $ArgBoxAtury($B); $Y += $ArgRowHeight) {
        $WiresInRow = 0;
        for $N (keys %ArgAllClocks) {
            next if (! defined $RowLeastX($N,$Y,$B));
            $XWireStart = $RowLeastX($N,$Y,$B);
            $XWireEnd = $RowMostX($N,$Y,$B);
            $YWirePos = $Y + $Middle + ($ArgGrid * ($WiresInRow + int($WiresInRow/2) + 1));
            #### move wire away from middle of row for M4 wire rows #####
            $YWirePos = $Y + $ArgRowHeight - ($ArgGrid * ($WiresInRow * 3.0 + 1.5)) if (defined $ArgM4Row($SY));
            &DieError("Output wire in M4Row $Y conflicts with CLK1/CLK2 bus",1) if (($YWirePos < ($Y + $ArgRowHeight - 5 * $ArgGrid)) &
            & ($YWirePos > ($Y + 3 * $ArgGrid)) && (defined $ArgM4Row($SY)));
            $XViaPos = $ArgBoxOutX($B,$N) - (0.5 * $ArgWireWidth) - 5; # assumes 2.7 by 2.7 via with minimum M5
            if ($WiresInRow % 2) {         # odd face up
                $YViaPos = $YWirePos - (0.45 * $DefUnits);
            }
            else {                          # even face down
                $YViaPos = $YWirePos - (2.25 * $DefUnits);
            }
            $VName = " VIAOUT_".$B."_".$N."_".$Y."_".$WiresInRow;
```

ClockRoute2

```perl
        $RowRot($Y) = $Orientation0 if ($Y/$ArgRowHeight %2 == 0);
        $RowRot($Y) = $Orientation1 if ($Y/$ArgRowHeight %2 == 1);
        unless (($XWireStart == $ArgBoxAtllx($B)) || (($XWireStart >= $XViaPos - 180) && ($XWireEnd <= $XViaPos +450))) {
            $XWireStart = $XWireStart + (2 * $ArgGrid);
        }
        unless (($XWireEnd == $ArgBoxAturx($B)) || (($XWireEnd >= $XViaPos - 180) && ($XWireEnd <= $XViaPos +450))) {
            $XWireEnd = $XWireEnd - (2 * $ArgGrid);
        }
        &ProcessWire("H","M4",$N,$YWirePos,$XWireStart,$XWireEnd,"noviasat");
        $WireAdds .= "add wire nodrc short noviasat net $N 1 M4 ( $XWireStart $YWirePos ) ( $XWireEnd $YWirePos ) ;\n";
#       $DefVias .= "- $VName M45CLKVIA + FIXED ( $XViaPos $YViaPos ) $RowRot($Y) ;\n";
        $ViaNumber ++;
        $WiresInRow++;
    }
} sub WriteDef {
    local($Via,$File,$Root) = @_;
    local($/) = ";";        # record separator
    local($N);
    local($Dir,$Elem,$NumElems,$NumSp);
    local($NewFile) = $Root . "_clk.def";
    local($ViaFile) = $Root . ".via";

&DieError("Could not find file '$File'",1) if (($Dir = &FindFile($File,$path)) eq "");
    &DieError("Could not open file '$File'",1) if (!open(f,"$Dir/$File"));
    &DieError("Could not open file '$NewFile'",1) if (!open(o,"> $NewFile"));
    &DieError("Could not open file '$ViaFile'",1) if (($Via) && (!open(v,"> $ViaFile")));

while(<f>) {
        s/\s*//;        # remove leading white space
        if (/^(#|DESIGN|UNITS|TECHNOLOGY|HISTORY|DIEAREA|SITE|TRACKS|GCELLGRID)/) {
            if (/^DESIGN\s+(\s+)/) {
                $DesignName = "DESIGN $1_CLKVIA ;";
            }
            if (/^UNITS/) {
                $Units = $_;
            }
            if (/^TECHNOLOGY/) {
                $Technology = $_;
            }
            if (/^DIEAREA/) {
                $DieArea = $_;
            }
            print o;
            next;
        }
        if ($NumElems && /^-\s+(\S+)/) {
            local($NetName) = $1;
            if ($Elem eq "NETS") {
```

ClockRoute2

```
if ((SArgNets =~ /(^|:)$NetName:/) || ($SPNets =~ /(^|:)$NetName:/) ) {
    &PrintClockNet($_,$NetName);
} elsif ($ArgInNets =~ /(^|:)$NetName:/) {
    &PrintClockInNet($_,$NetName);
} elsif ($L2ArgInNets =~ /(^|:)$NetName:/) {
    &PrintL2ClockInNet($_,$NetName);
} else {
    print o;
}
}
elsif ( ($Elem eq "SPECIALNETS") && ($NetName =~ /VDD|VSS/) ) {
    &PrintPwrNet($_,$NetName);
}
elsif ($Elem eq "SPECIALNETS") {
    print o;
}
elsif ($Elem eq "COMPONENTS") {
    local($Cell) = $1;
    next if ( &IsDeleteCell($Cell) );
    if ( &IsMaster($Cell) ) {
        &AddBuffers($Cell);
        next;
    }
    print o;
} else {
    print o;
}
next;
}
if ($NumElems && (/END $Elem\s*/)) {
    s/END $Elem\s*//;
    $NumElems = 0;
    print o "END $Elem";
}
if (/^($SPECIALNETS)\s+(\d+)/) {
    $Elem = $1;
    $NumElems = $2;
    $NumSp = $NumElems + 2 * $NumNets + $L2NumNets;
    print o "$Elem $NumSp ;";
    &PrintSpecialNets();
    next;
}
if (/^(PINS|VIAS|COMPONENTS|SPECIALNETS|GROUPS|NETS)\s+(\d+)/) {
    $Elem = $1;
    $NumElems = $2;
    print o;
    if ($Elem eq "COMPONENTS") {
        if ($Via) {
            print v $DesignName;
            print v $Technology;
            print v $Units;
```

* * * * * * * *

ClockRoute2

```perl
        print v $DieArea;
        print v "COMPONENTS $ViaNumber ;";
        print v $DefVias;
        print v "END COMPONENTS";
        print v "END DESIGN";
    } else {
        print o $DefVias;
    }
    next;
} if (/^END DESIGN/) { print o; last; }
&DieError("Syntax error at statement $. (:) of $Dir/$File: \n        '$_'",1);
}
close(f);
close(o);
} sub IsDeleteCell {
    local($Elem, $d) = @_;
    for $d (keys %DeleteCells) {
        return 1 if ($Elem =~ /^$d$/);
    }
    0;
} sub PrintClockInNet {
    local($_, $Net) = @_;
    s/(\s*$L3Master($Net)\s+$ArgBufferOut\s*\)/$DefNetOut($Net)/;
    print o $_;
} sub PrintClockInNet {
    local($_, $Net) = @_;
    local($N);
    for $N (keys %ArgNetIn) {
        if ($Net eq $ArgNetIn($N)) {
            s/(\s*$L3Master($N)\s+$ArgBufferIn\s*\)/$DefNetIn($N)/;
            s/(\s*$L2Master($Net)\s+$ArgBufferOut\s*\)/$L2DefNetOut($Net)/;
        }
    }
    print o $_;
} sub PrintL2ClockInNet {
    local($_, $Net) = @_;
    for $N (keys %L2ArgNetIn) {
        s/(\s*$L2Master($N)\s+$ArgBufferIn\s*\)/$L2DefNetIn($N)/;
    }
    print o $_;
}
```

ClockRoute2

```
sub PrintSpecialNets {
    local($N);
    if (defined $ArgNets) {
        foreach $N (split(/:/,$ArgNets)) {
            print o "- $N ( * $N ) ;";
        }
    } elsif (defined $SPNets) {
        foreach $N (split(/:/,$SPNets)) {
            if ($ArgNets !~ /(^|:)$N:/) {
                print o "- $N ( * $(N}_IO ) ;";
            }
        }
    }
    if (defined $ArgInNets) {
        foreach $N (split(/:/,$ArgInNets)) {
            print o "- $N ( * $(N}_IO ) ;";
        }
    }
    if (defined $L2ArgInNets) {
        foreach $N (split(/:/,$L2ArgInNets)) {
            print o "- $N ( * $(N}_IO ) ;";
        }
    }
} sub PrintPwrNet {
    local($_,$Net) = @_;
    local($P);
#   local($P) = "+ STYLE POWERGRID ;";
    if ($Net =~ /VDD/) {
        $P = "+ USE POWER ;";
    }
    if ($Net =~ /VSS/) {
        $P = "+ USE GROUND ;";
    }
    print o "- $Net ( * $Net ) $P";
} sub IsMaster {
    local($Cell) = @_;
    for $N (keys %L3Master) {
        return 1 if ($Cell =~ /^$L3Master{$N}$/);
    }
    for $N (keys %L2Master) {
        return 1 if ($Cell =~ /^$L2Master{$N}$/);
    }
    0;
} sub AddBuffers {
    local($Cell) = @_;
```

ClockRoute2

```perl
local($N);
for $N (keys %L3Master) {
    if ($Cell =~ /^$L3Master($N)$/) {
        print o $DefComponents($N);
    }
}
for $N (keys %L2Master) {
    if ($Cell =~ /^$L2Master($N)$/) {
        print o $L2DefComponents($N);
    }
} sub reverseWire ($MLayer($b) cmp $MLayer($a);)
sub WriteWire {
    local($Root) = @_;
    local($NewFile) = $Root . ".wire";
    local($set,$K,$startW,$endW,$net,$width);
    for $K (keys %L2Wire) {
        foreach $set (split(/:/,$L2Wire($K))) {
            ($set =~ /^(\S+);(\S+);(\S+)$/) || &DieError("WriteWire: bad data in L2 wire list",1);
            $startW = $1;
            $endW = $2;
            $net = $3;
            $width = $4;
            $WireAdds .= "add wire nodrc short noviasat nosnap \n special net $net 1 M4 width $width ( $startW $L2Index($K) ) ( $endW $L2Index($K) ) ;\n";
        }
    }
    for $K (sort reverseWire keys %Wire) {
        foreach $set (split(/:/,$Wire($K))) {
            ($set =~ /^(\S+);(\S+);(\S+)$/) || &DieError("WriteWire: bad data in wire list",1);
            $startW = $1;
            $endW = $2;
            $net = $3;
            if ($Direction($K) =~ "H") {
                $WireAdds .= "add wire nodrc short $ViasAt($K) special net $net 1 $MLayer($K) ( $startW $Index($K) ) ( $endW $Index($K) ) ;\n";
            } else {
                $WireAdds .= "add wire nodrc short $ViasAt($K) special net $net 1 $MLayer($K) ( $Index($K) $startW ) ( $Index($K) $endW ) ;\n";
            }
        }
    }
    &DieError("Could not open file '$NewFile'",1) if (!open(o,"> $NewFile"));
    printf o $WireAdds;
    close(o);
} sub WriteVerilog {
    local($Root,$Ver) = @_;
    local($NewFile) = $Root . ".ver";
```

ClockRoute2

```perl
local($/) = ";";        # record separator
local($*) = 1;          # multiline match
local($\) = "";         # set output record separator
local($inst,$Nout,$Nin,$MatchMaster);
&DieError("Could not open file '$NewFile'",1) if (!open(o,"> $NewFile"));
&DieError("Could not open file '$Ver'",1) if (!open(f,"$Ver"));
while(<f>) {
    $MatchMaster = 0;
    $cmt = "";
    $cmt = $1 if (s/(^\s*\/\/(.*\n)\n)//);
    if (/^\s*$ArgBufferName\s*(\w+)\s*\(\s*\.$ArgBufferOut\s*\(\s*(\w+)\s*\)\s*,\s*\.$ArgBufferIn\s*\(\s*(\w+)\s*\)\s*\)/i) {
        $inst = $1;
        $Nout = $2;
        $Nin = $3;
        for $N (keys %L2MasterV) {
            if ($L2MasterV{$N} =~ /^$inst$/i) {
                printf o "\n";
                printf o $VerilogInst(&UC($Nout));
                delete $L2MasterV{$N};
                $MatchMaster = 1;
            }
        }
        for $N (keys %L3MasterV) {
            if ($L3MasterV{$N} =~ /^$inst$/i) {
                printf o "\n";
                printf o $VerilogInst(&UC($Nout));
                delete $L3MasterV{$N};
                $MatchMaster = 1;
            }
        }
        if (!$MatchMaster) { print o $cmt; print o; }
    } elsif (!$MatchMaster) { print o $cmt; print o; }
}
close(o);
close(f);
for $N ((keys %L2MasterV), (keys %L3MasterV)) {
    &DieError("Failed to match $L2MasterV{$N} in verilog file.",0) if(defined $L2MasterV{$N});
    &DieError("Failed to match $L3MasterV{$N} in verilog file.",0) if(defined $L3MasterV{$N});
} sub PrintHelp {
    local($verbose) = @_;
    open(f,$0) || &DieError("Could not open help file $0",1);
    while(<f>) {
        chop;
        print $_ if (s/^### //);
        print $_ if ($verbose && (s/^###v //));
    }
    exit -1;
}
```

ClockRoute2

```perl
sub DoTest {
    local($test) = @_;
    local($FRoot) = "test$$";
    local($Source) = $@;
    print stderr "********** Extracting source files";
    &WriteFile("indef",$FRoot,$Source);
    &WriteFile("clkctl",$FRoot,$Source);
    &WriteFile("inver",$FRoot,$Source);
    &WriteFile("savedef",$FRoot,$Source);
    &WriteFile("savewire",$FRoot,$Source);
    &WriteFile("savelog",$FRoot,$Source);
    &WriteFile("savever",$FRoot,$Source);
    print stderr "********** Running test";
    system("$Source $FRoot.indef $FRoot.inver > $FRoot.outlog");
    print stderr "********** Comparing results";
    print "********** Differences in output DEF file";
    open(f, "diff $(FRoot)_clk.def $FRoot.savedef |"); while(<f>) { chop; print $_; } close(f);
    print "********** Differences in output WIRE file";
    open(f, "diff $FRoot.wire $FRoot.savewire |"); while(<f>) { chop; print $_; } close(f);
    print "********** Differences in output VERILOG file";
    open(f, "diff $FRoot.ver $FRoot.savever |"); while(<f>) { chop; print $_; } close(f);
    print "********** Differences in output LOG file";
    open(f, "diff $FRoot.outlog $FRoot.savelog |"); while(<f>) { chop; print $_; } close(f);
    if ($test =~ /update/i) {
        print stderr "********** Updating expected results (old source in $Source.save)";
        if (rename($Source, "$Source.save")) {
            open(f, "$Source.save") || die "Could not open $Source.save for reading";
            open(o, "> $Source")     || die "Could not open $Source for writing";
            open(p, "$FRoot.outlog") || die "Can't open $FRoot.outlog"; while(<p>) { $OutLogVal .= "###savelog $_"; } close(p);
            open(p, "$(FRoot)_clk.def") || die "Can't open $(FRoot)_clk.def"; while(<p>) { $OutDefVal .= "###savedef $_"; } close(p);
            open(p, "$FRoot.wire") || die "Can't open $FRoot.wire"; while(<p>) { $OutWireVal .= "###savewire $_"; } close(p);
            open(p, "$FRoot.ver")  || die "Can't open $FRoot.ver"; while(<p>) { $OutVerVal  .= "###savever $_"; } close(p);
            while(<f>) {
                chop;
                if (/^###savelog /)  { print o $OutLogVal  if ($OutLogVal  ne ""); $OutLogVal  = ""; next; }
                if (/^###savedef /)  { print o $OutDefVal  if ($OutDefVal  ne ""); $OutDefVal  = ""; next; }
                if (/^###savewire /) { print o $OutWireVal if ($OutWireVal ne ""); $OutWireVal = ""; next; }
                if (/^###savever /)  { print o $OutVerVal  if ($OutVerVal  ne ""); $OutVerVal  = ""; next; }
                print o;
            }
            close(f);
            close(o);
            chmod 0755, $Source;
        }
        else {
            print stderr "********** Could not move $Souce. Update failed";
        }
    }
}
```

ClockRoute2

```
}
print stderr "********* Removing temporary files";
unlink <$FRoot.*>;
unlink <${FRoot}_clk.*>;
exit 0;
} sub WriteFile {
    local($Type,$Root,$Source) = @_;
    &DieError("Could not open file '$Root.$Type'.",1) if (!open(o,"> $Root.$Type"));
    open(f,$Source) || &DieError("Could not open help file $Source",1);
    while(<f>) {
        chop;
        print o $_ if (s/^##$Type //);
    }
    close(f);
    close(o);
}
```

FIG. 39

Appendix C

ClockRoute2

```
###indef UNITS DISTANCE MICRONS 100 ;
###indef PINS 244 ;
###indef - PH1 + NET PH1 ;
###indef - SC1 + NET SC1 ;
###indef - EDR_ERET_O + NET EDR_ERET_O ;
###indef END PINS
###indef VIAS 6 ;
###indef - VIA01 + RECT M1 ( -60 -60 ) ( 60 60 ) + RECT CA ( -25 -25 ) ( 25 25 ) + RECT
###indef PC ( -60 -60 ) ( 60 60 ) ;
###indef END VIAS
###indef COMPONENTS 1929 ;
###indef - EROM_ROM FQX2S + FIXED ( 90 17145 ) N ;
###indef - EROM_ROMBIST_WORDADDR_R_REG_8 IFQX2S + PLACED ( 77220 3240 ) S ;
###indef - EROM_ROMBIST_WORDADDR_R_REG_7 FQX2S + PLACED ( 81540 3240 ) FS ;
###indef - EROM_ROMBIST_WORDADDR_R_REG_6 FQX2S + PLACED ( 79380 9720 ) FS ;
###indef - EROM_ROMBIST_WORDADDR_R_REG_5 FQX2S + PLACED ( 69480 9720 ) S ;
###indef - EROM_ROMBIST_WORDADDR_R_REG_4 FQX2S + PLACED ( 67320 9720 ) FS ;
###indef - EROM_ROMBIST_WORDADDR_R_REG_3 FQX2S + PLACED ( 56160 6480 ) FN ;
###indef - EROM_ROMBIST_WORDADDR_R_REG_2 FQX2S + PLACED ( 55620 3240 ) S ;
###indef - EROM_ROMBIST_WORDADDR_R_REG_1 FQX2S + PLACED ( 65520 3240 ) S ;
###indef - EROM_ROMBIST_WORDADDR_R_REG_0 FQX2S + PLACED ( 66060 6480 ) N + REGION ( 523080 771120 ) ( 652500 771480 ) ;
###indef - EROM_ROMBIST_WAITSTATE_R_REG FQX2S + PLACED ( 83700 3240 ) S ;
###indef - EROM_RO-MBIST_SUB_297_U18 NAND2X2 + PLACED ( 60300 0 ) N ;
###indef - EROM_ROMBIST_OBSERVWA_R_REG_8 FQX2S + PLACED ( 111420 3240 ) S ;
###indef - EROM_ROMBIST_OBSERVWA_R_REG_7 FQX2S + PLACED ( 0 12960 ) FN ;
###indef - EROM_ROMBIST_OBSERVWA_R_REG_6 FQX2S + PLACED ( 3960 12960 ) FN ;
###indef - EROM_ROMBIST_OBSERVWA_R_REG_5 FQX2S + PLACED ( 3420 6480 ) FN ;
###indef - EROM_ROMBIST_OBSERVWA_R_REG_4 FQX2S + PLACED ( 67860 3240 ) S ;
###indef - EROM_ROMBIST_OBSERVWA_R_REG_3 FQX2S + PLACED ( 73980 12960 ) FN ;
###indef - EROM_ROMBIST_OBSERVWA_R_REG_2 FQX2S + PLACED ( 60120 12960 ) FN ;
###indef - EROM_ROMBIST_OBSERVWA_R_REG_1 FQX2S + PLACED ( 109080 12960 ) FN ;
###indef - EROM_ROMBIST_OBSERVWA_R_REG_0 FQX2S + PLACED ( 27360 6480 ) FN ;
###indef - EROM_ROMBIST_OBSERVROMEN_R_REG FQX2S + PLACED ( 90000 12960 ) FN ;
```

FIG. 40

ClockRoute2

```
###indef - EROM_ROMBIST_OBSERVBA_R_REG_2 FQX2S + PLACED ( 94860 12960 ) FN ;
###indef - EROM_ROMBIST_OBSERVBA_R_REG_1 FQX2S + PLACED ( 35280 3240 ) S ;
###indef - EROM_ROMBIST_OBSERVBA_R_REG_0 FQX2S + PLACED ( 95220 9720 ) S ;
###indef - EROM_ROMBIST_MODEREG_R_REG_2 FQX2S + PLACED ( 86580 12960 ) FN ;
###indef - EROM_ROMBIST_MODEREG_R_REG_1 FQX2S + PLACED ( 87480 6480 ) FN ;
###indef - EROM_ROMBIST_MODEREG_R_REG_0 FQX2S + PLACED ( 82080 12960 ) FN ;
###indef - EROM_ROMBIST_MISR_R_REG_99 FQX2S + PLACED ( 42840 0 ) FN ;
###indef - EROM_ROMBIST_MISR_R_REG_98 FQX2S + PLACED ( 41220 3240 ) S ;
###indef - EROM_ROMBIST_MISR_R_REG_97 FQX2S + PLACED ( 44820 3240 ) S ;
###indef - EROM_ROMBIST_MISR_R_REG_96 FQX2S + PLACED ( 41760 6480 ) FN ;
###indef - EROM_ROMBIST_MISR_R_REG_95 FQX2S + PLACED ( 31500 3240 ) S ;
###indef - EROM_ROMBIST_MISR_R_REG_94 FQX2S + PLACED ( 39600 6480 ) N ;
###indef - EROM_ROMBIST_MISR_R_REG_93 FQX2S + PLACED ( 36000 9720 ) S ;
###indef - EROM_ROMBIST_MISR_R_REG_92 FQX2S + PLACED ( 34560 12960 ) N ;
###indef - EROM_ROMBIST_MISR_R_REG_91 FQX2S + PLACED ( 39420 12960 ) S ;
###indef - EROM_ROMBIST_MISR_R_REG_90 FQX2S + PLACED ( 28260 12960 ) FN ;
###indef - EROM_ROMBIST_MISR_R_REG_9 FQX2S + PLACED ( 153180 9720 ) S ;
###indef - EROM_ROMBIST_MISR_R_REG_89 FQX2S + PLACED ( 27720 9720 ) S ;
###indef - EROM_ROMBIST_MISR_R_REG_88 FQX2S + PLACED ( 30600 6480 ) N ;
###indef - EROM_ROMBIST_MISR_R_REG_87 FQX2S + PLACED ( 26460 0 ) FN ;
###indef - EROM_ROMBIST_MISR_R_REG_86 FQX2S + PLACED ( 33300 0 ) N ;
###indef - EROM_ROMBIST_MISR_R_REG_85 FQX2S + PLACED ( 23220 0 ) FN ;
###indef - EROM_ROMBIST_MISR_R_REG_84 FQX2S + PLACED ( 38880 0 ) N ;
###indef - EROM_ROMBIST_MISR_R_REG_83 FQX2S + PLACED ( 3420 3240 ) S ;
###indef - EROM_ROMBIST_MISR_R_REG_82 FQX2S + PLACED ( 5940 6480 ) FN ;
###indef - EROM_ROMBIST_MISR_R_REG_81 FQX2S + PLACED ( 11880 3240 ) FS ;
###indef - EROM_ROMBIST_MISR_R_REG_80 FQX2S + PLACED ( 6660 0 ) FN ;
###indef - EROM_ROMBIST_MISR_R_REG_8 FQX2S + PLACED ( 156240 6480 ) N ;
###indef - EROM_ROMBIST_MISR_R_REG_79 FQX2S + PLACED ( 14220 3240 ) FS ;
###indef - EROM_ROMBIST_MISR_R_REG_78 FQX2S + PLACED ( 16200 3240 ) FS ;
###indef - EROM_ROMBIST_MISR_R_REG_77 FQX2S + PLACED ( 18540 0 ) FN ;
###indef - EROM_ROMBIST_MISR_R_REG_76 FQX2S + PLACED ( 22320 3240 ) FS ;
###indef - EROM_ROMBIST_MISR_R_REG_75 FQX2S + PLACED ( 17280 6480 ) N ;
###indef - EROM_ROMBIST_MISR_R_REG_74 FQX2S + PLACED ( 20520 6480 ) FS ;
###indef - EROM_ROMBIST_MISR_R_REG_73 FQX2S + PLACED ( 18900 9720 ) S ;
###indef - EROM_ROMBIST_MISR_R_REG_72 FQX2S + PLACED ( 23760 9720 ) S ;
###indef - EROM_ROMBIST_MISR_R_REG_71 FQX2S + PLACED ( 19980 12960 ) FN ;
###indef - EROM_ROMBIST_MISR_R_REG_70 FQX2S + PLACED ( 14040 12960 ) FN ;
###indef - EROM_ROMBIST_MISR_R_REG_7 FQX2S + PLACED ( 13500 9720 ) S ;
###indef - EROM_ROMBIST_MISR_R_REG_69 FQX2S + PLACED ( 148500 3240 ) N ;
###indef - EROM_ROMBIST_MISR_R_REG_68 FQX2S + PLACED ( 17280 6480 ) FN ;
###indef - EROM_ROMBIST_MISR_R_REG_67 FQX2S + PLACED ( 7920 6480 ) S ;
###indef - EROM_ROMBIST_MISR_R_REG_66 FQX2S + PLACED ( 7920 9720 ) S ;
###indef - EROM_ROMBIST_MISR_R_REG_65 FQX2S + PLACED ( 5940 9720 ) FS ;
###indef - EROM_ROMBIST_MISR_R_REG_64 FQX2S + PLACED ( 0 9720 ) S ;
###indef - EROM_ROMBIST_MISR_R_REG_63 FQX2S + PLACED ( 0 0 ) N ;
###indef - EROM_ROMBIST_MISR_R_REG_62 FQX2S + PLACED ( 3240 0 ) N ;
###indef - EROM_ROMBIST_MISR_R_REG_61 FQX2S + PLACED ( 107100 9720 ) FS ;
###indef - EROM_ROMBIST_MISR_R_REG_60 FQX2S + PLACED ( 128880 6480 ) N ;
###indef - EROM_ROMBIST_MISR_R_REG_6 FQX2S + PLACED ( 127260 3240 ) S ;
###indef - EROM_ROMBIST_MISR_R_REG_59 FQX2S + PLACED ( 145440 6480 ) FN ;
###indef - EROM_ROMBIST_MISR_R_REG_58 FQX2S + PLACED ( 120060 9720 ) FN ;
###indef - EROM_ROMBIST_MISR_R_REG_58 FQX2S + PLACED ( 118800 12960 ) N ;
```

ClockRoute2

```
###indef - EROM_ROMBIST_MISR_R_REG_57 FQX2S + PLACED ( 123120 12960 ) N ;
###indef - EROM_ROMBIST_MISR_R_REG_56 FQX2S + PLACED ( 113400 12960 ) FN ;
###indef - EROM_ROMBIST_MISR_R_REG_55 FQX2S + PLACED ( 110520 6480 ) FN ;
###indef - EROM_ROMBIST_MISR_R_REG_54 FQX2S + PLACED ( 115200 6480 ) FN ;
###indef - EROM_ROMBIST_MISR_R_REG_53 FQX2S + PLACED ( 105480 6480 ) FN ;
###indef - EROM_ROMBIST_MISR_R_REG_52 FQX2S + PLACED ( 107100 12960 ) N ;
###indef - EROM_ROMBIST_MISR_R_REG_51 FQX2S + PLACED ( 112140 9720 ) S ;
###indef - EROM_ROMBIST_MISR_R_REG_50 FQX2S + PLACED ( 116820 0 ) N ;
###indef - EROM_ROMBIST_MISR_R_REG_5 FQX2S + PLACED ( 144900 9720 ) S ;
###indef - EROM_ROMBIST_MISR_R_REG_49 FQX2S + PLACED ( 121500 0 ) N ;
###indef - EROM_ROMBIST_MISR_R_REG_48 FQX2S + PLACED ( 121680 3240 ) S ;
###indef - EROM_ROMBIST_MISR_R_REG_47 FQX2S + PLACED ( 115560 3240 ) S ;
###indef - EROM_ROMBIST_MISR_R_REG_46 FQX2S + PLACED ( 122220 6480 ) N ;
###indef - EROM_ROMBIST_MISR_R_REG_45 FQX2S + PLACED ( 51300 9720 ) S ;
###indef - EROM_ROMBIST_MISR_R_REG_44 FQX2S + PLACED ( 58140 12960 ) N ;
###indef - EROM_ROMBIST_MISR_R_REG_43 FQX2S + PLACED ( 97380 9720 ) S ;
###indef - EROM_ROMBIST_MISR_R_REG_42 FQX2S + PLACED ( 100620 12960 ) FN ;
###indef - EROM_ROMBIST_MISR_R_REG_41 FQX2S + PLACED ( 133920 6480 ) N ;
###indef - EROM_ROMBIST_MISR_R_REG_40 FQX2S + PLACED ( 127080 9720 ) S ;
###indef - EROM_ROMBIST_MISR_R_REG_4 FQX2S + PLACED ( 149940 12960 ) FN ;
###indef - EROM_ROMBIST_MISR_R_REG_39 FQX2S + PLACED ( 126720 12960 ) N ;
###indef - EROM_ROMBIST_MISR_R_REG_38 FQX2S + PLACED ( 133020 12960 ) N ;
###indef - EROM_ROMBIST_MISR_R_REG_37 FQX2S + PLACED ( 131580 9720 ) S ;
###indef - EROM_ROMBIST_MISR_R_REG_36 FQX2S + PLACED ( 135180 12960 ) FN ;
###indef - EROM_ROMBIST_MISR_R_REG_35 FQX2S + PLACED ( 141300 12960 ) N ;
###indef - EROM_ROMBIST_MISR_R_REG_34 FQX2S + PLACED ( 142560 9720 ) FS ;
###indef - EROM_ROMBIST_MISR_R_REG_33 FQX2S + PLACED ( 145800 3240 ) FS ;
###indef - EROM_ROMBIST_MISR_R_REG_32 FQX2S + PLACED ( 150840 0 ) N ;
###indef - EROM_ROMBIST_MISR_R_REG_31 FQX2S + PLACED ( 141480 0 ) FN ;
###indef - EROM_ROMBIST_MISR_R_REG_30 FQX2S + PLACED ( 138420 6480 ) FN ;
###indef - EROM_ROMBIST_MISR_R_REG_3 FQX2S + PLACED ( 144720 12960 ) FN ;
###indef - EROM_ROMBIST_MISR_R_REG_29 FQX2S + PLACED ( 141300 3240 ) FS ;
###indef - EROM_ROMBIST_MISR_R_REG_28 FQX2S + PLACED ( 124920 3240 ) S ;
###indef - EROM_ROMBIST_MISR_R_REG_27 FQX2S + PLACED ( 108540 3240 ) S ;
###indef - EROM_ROMBIST_MISR_R_REG_26 FQX2S + PLACED ( 107280 0 ) N ;
###indef - EROM_ROMBIST_MISR_R_REG_25 FQX2S + PLACED ( 99900 3240 ) FS ;
###indef - EROM_ROMBIST_MISR_R_REG_24 FQX2S + PLACED ( 102600 3240 ) FS ;
###indef - EROM_ROMBIST_MISR_R_REG_23 FQX2S + PLACED ( 131040 0 ) N ;
###indef - EROM_ROMBIST_MISR_R_REG_22 FQX2S + PLACED ( 135180 3240 ) FS ;
###indef - EROM_ROMBIST_MISR_R_REG_21 FQX2S + PLACED ( 137160 3240 ) FS ;
###indef - EROM_ROMBIST_MISR_R_REG_20 FQX2S + PLACED ( 45720 12960 ) FN ;
###indef - EROM_ROMBIST_MISR_R_REG_2 FQX2S + PLACED ( 50580 12960 ) FN ;
###indef - EROM_ROMBIST_MISR_R_REG_19 FQX2S + PLACED ( 192600 12960 ) N ;
###indef - EROM_ROMBIST_MISR_R_REG_18 FQX2S + PLACED ( 198000 9720 ) FS ;
###indef - EROM_ROMBIST_MISR_R_REG_17 FQX2S + PLACED ( 187200 12960 ) N ;
###indef - EROM_ROMBIST_MISR_R_REG_167 FQX2S + PLACED ( 223020 12960 ) FN ;
###indef - EROM_ROMBIST_MISR_R_REG_166 FQX2S + PLACED ( 223920 9720 ) S ;
###indef - EROM_ROMBIST_MISR_R_REG_165 FQX2S + PLACED ( 225720 3240 ) S ;
###indef - EROM_ROMBIST_MISR_R_REG_164 FQX2S + PLACED ( 236880 3240 ) S ;
###indef - EROM_ROMBIST_MISR_R_REG_163 FQX2S + PLACED ( 237240 6480 ) FN ;
###indef - EROM_ROMBIST_MISR_R_REG_162 FQX2S + PLACED ( 243180 3240 ) FS ;
###indef - EROM_ROMBIST_MISR_R_REG_161 FQX2S + PLACED ( 239400 0 ) FN ;
```

FIG. 42

ClockRoute2

```
###indef - EROM_ROMBIST_MISR_R_REG_160 FQX2S + PLACED ( 246780    0 ) N ;
###indef - EROM_ROMBIST_MISR_R_REG_16  FQX2S + PLACED ( 181260 9720 ) S ;
###indef - EROM_ROMBIST_MISR_R_REG_159 FQX2S + PLACED ( 248400 12960 ) N ;
###indef - EROM_ROMBIST_MISR_R_REG_158 FQX2S + PLACED ( 242100 12960 ) N ;
###indef - EROM_ROMBIST_MISR_R_REG_157 FQX2S + PLACED ( 236880 9720 ) S ;
###indef - EROM_ROMBIST_MISR_R_REG_156 FQX2S + PLACED ( 243340 9720 ) S ;
###indef - EROM_ROMBIST_MISR_R_REG_155 FQX2S + PLACED ( 248220 3240 ) S ;
###indef - EROM_ROMBIST_MISR_R_REG_154 FQX2S + PLACED ( 245340 6480 ) FN ;
###indef - EROM_ROMBIST_MISR_R_REG_153 FQX2S + PLACED ( 251640 9720 ) S ;
###indef - EROM_ROMBIST_MISR_R_REG_152 FQX2S + PLACED ( 252000 12960 ) FN ;
###indef - EROM_ROMBIST_MISR_R_REG_151 FQX2S + PLACED ( 257940 9720 ) S ;
###indef - EROM_ROMBIST_MISR_R_REG_150 FQX2S + PLACED ( 258300 3240 ) S ;
###indef - EROM_ROMBIST_MISR_R_REG_15  FQX2S + PLACED ( 170460 9720 ) S ;
###indef - EROM_ROMBIST_MISR_R_REG_149 FQX2S + PLACED ( 231660 3240 ) S ;
###indef - EROM_ROMBIST_MISR_R_REG_148 FQX2S + PLACED ( 233820 12960 ) FN ;
###indef - EROM_ROMBIST_MISR_R_REG_147 FQX2S + PLACED ( 229860 12960 ) FN ;
###indef - EROM_ROMBIST_MISR_R_REG_146 FQX2S + PLACED ( 406980 12960 ) N ;
###indef - EROM_ROMBIST_MISR_R_REG_145 FQX2S + PLACED ( 284400 9720 ) S ;
###indef - EROM_ROMBIST_MISR_R_REG_144 FQX2S + PLACED ( 279180 6480 ) FN ;
###indef - EROM_ROMBIST_MISR_R_REG_143 FQX2S + PLACED ( 258660    0 ) FN ;
###indef - EROM_ROMBIST_MISR_R_REG_142 FQX2S + PLACED ( 253980 3240 ) S ;
###indef - EROM_ROMBIST_MISR_R_REG_141 FQX2S + PLACED ( 250740 3240 ) S ;
###indef - EROM_ROMBIST_MISR_R_REG_140 FQX2S + PLACED ( 253620    0 ) N ;
###indef - EROM_ROMBIST_MISR_R_REG_14  FQX2S + PLACED ( 167580 9720 ) S ;
###indef - EROM_ROMBIST_MISR_R_REG_139 FQX2S + PLACED ( 228600    0 ) FN ;
###indef - EROM_ROMBIST_MISR_R_REG_138 FQX2S + PLACED ( 219240 9720 ) S ;
###indef - EROM_ROMBIST_MISR_R_REG_137 FQX2S + PLACED ( 213120 12960 ) FN ;
###indef - EROM_ROMBIST_MISR_R_REG_136 FQX2S + PLACED ( 216360 9720 ) S ;
###indef - EROM_ROMBIST_MISR_R_REG_135 FQX2S + PLACED ( 228600 6480 ) N ;
###indef - EROM_ROMBIST_MISR_R_REG_134 FQX2S + PLACED ( 210060 12960 ) N ;
###indef - EROM_ROMBIST_MISR_R_REG_133 FQX2S + PLACED ( 211320 9720 ) S ;
###indef - EROM_ROMBIST_MISR_R_REG_132 FQX2S + PLACED ( 221760    0 ) FN ;
###indef - EROM_ROMBIST_MISR_R_REG_131 FQX2S + PLACED ( 165600 9720 ) S ;
###indef - EROM_ROMBIST_MISR_R_REG_130 FQX2S + PLACED ( 175140 9720 ) S ;
###indef - EROM_ROMBIST_MISR_R_REG_13  FQX2S + PLACED ( 164340 12960 ) FN ;
###indef - EROM_ROMBIST_MISR_R_REG_129 FQX2S + PLACED ( 178740 12960 ) N ;
###indef - EROM_ROMBIST_MISR_R_REG_128 FQX2S + PLACED ( 443700 6480 ) N ;
###indef - EROM_ROMBIST_MISR_R_REG_127 FQX2S + PLACED ( 184680 12960 ) N ;
###indef - EROM_ROMBIST_MISR_R_REG_126 FQX2S + PLACED ( 410940 12960 ) N ;
###indef - EROM_ROMBIST_MISR_R_REG_125 FQX2S + PLACED ( 415260 9720 ) FS ;
###indef - EROM_ROMBIST_MISR_R_REG_124 FQX2S + PLACED ( 429660 12960 ) N ;
###indef - EROM_ROMBIST_MISR_R_REG_123 FQX2S + PLACED ( 432900 6480 ) N ;
###indef - EROM_ROMBIST_MISR_R_REG_122 FQX2S + PLACED ( 436500 6480 ) N ;
###indef - EROM_ROMBIST_MISR_R_REG_121 FQX2S + PLACED ( 432360 3240 ) S ;
###indef - EROM_ROMBIST_MISR_R_REG_120 FQX2S + PLACED ( 435060    0 ) N ;
###indef - EROM_ROMBIST_MISR_R_REG_12  FQX2S + PLACED ( 443700    0 ) N ;
###indef - EROM_ROMBIST_MISR_R_REG_119 FQX2S + PLACED ( 159300 12960 ) FN ;
###indef - EROM_ROMBIST_MISR_R_REG_118 FQX2S + PLACED ( 443700 6480 ) N ;
###indef - EROM_ROMBIST_MISR_R_REG_117 FQX2S + PLACED ( 440820 6480 ) N ;
###indef - EROM_ROMBIST_MISR_R_REG_116 FQX2S + PLACED ( 440940 9720 ) FS ;
###indef - EROM_ROMBIST_MISR_R_REG_115 FQX2S + PLACED ( 443700 12960 ) N ;
###indef - EROM_ROMBIST_MISR_R_REG_114 FQX2S + PLACED ( 439560 9720 ) FS ;
###indef - EROM_ROMBIST_MISR_R_REG_113 FQX2S + PLACED ( 435780 12960 ) N ;
```

FIG. 43

ClockRoute2

```
###indef - EROM_ROMBIST_MISR_R_REG_113 FQX2S + PLACED ( 431640 12960 ) FN ;
###indef - EROM_ROMBIST_MISR_R_REG_112 FQX2S + PLACED ( 350280 12960 ) N ;
###indef - EROM_ROMBIST_MISR_R_REG_111 FQX2S + PLACED ( 314820 12960 ) FN ;
###indef - EROM_ROMBIST_MISR_R_REG_110 FQX2S + PLACED ( 279540 12960 ) FN ;
###indef - EROM_ROMBIST_MISR_R_REG_11 FQX2S FQX2S + PLACED ( 160560 9720 ) S ;
###indef - EROM_ROMBIST_MISR_R_REG_109 FQX2S + PLACED ( 279900 9720 ) S ;
###indef - EROM_ROMBIST_MISR_R_REG_108 FQX2S + PLACED ( 288720 12960 ) N ;
###indef - EROM_ROMBIST_MISR_R_REG_107 FQX2S + PLACED ( 393660 12960 ) N ;
###indef - EROM_ROMBIST_MISR_R_REG_106 FQX2S + PLACED ( 399240 9720 ) S ;
###indef - EROM_ROMBIST_MISR_R_REG_105 FQX2S + PLACED ( 398880 12960 ) N ;
###indef - EROM_ROMBIST_MISR_R_REG_104 FQX2S + PLACED ( 37980 3240 ) FS ;
###indef - EROM_ROMBIST_MISR_R_REG_103 FQX2S + PLACED ( 52380 6480 ) N ;
###indef - EROM_ROMBIST_MISR_R_REG_102 FQX2S + PLACED ( 48240 3240 ) S ;
###indef - EROM_ROMBIST_MISR_R_REG_101 FQX2S + PLACED ( 51480 3240 ) S ;
###indef - EROM_ROMBIST_MISR_R_REG_100 FQX2S + PLACED ( 50400 0 ) FN ;
###indef - EROM_ROMBIST_MISR_R_REG_10 FQX2S + PLACED ( 153180 12960 ) FN ;
###indef - EROM_ROMBIST_MISR_R_REG_1 FQX2S + PLACED ( 41580 12960 ) FN ;
###indef - EROM_ROMBIST_MISR_R_REG_0 FQX2S + PLACED ( 44460 9720 ) FS ;
###indef - EROM_ROMBIST_LOADSIG_R_REG FQX2S + PLACED ( 92880 9720 ) S ;
###indef - EROM_ROMBIST_HOLDMISR_R_REG FQX2S + PLACED ( 97380 3240 ) S ;
###indef - EROM_ROMBIST_BTTADDR_R_REG_2 FQX2S + PLACED ( 95400 3240 ) FS ;
###indef - EROM_ROMBIST_BTTADDR_R_REG_1 FQX2S + PLACED ( 95220 0 ) N ;
###indef - EROM_ROMBIST_BTTADDR_R_REG_0 FQX2S + PLACED ( 87480 0 ) N ;
###indef - EROM_ROMBIST_ADD_294_U9 XNOR2X1 + PLACED ( 58860 3240 ) N ;
###indef - ERMCTL_SUBRETADDR_R_REG_9 FQX2S + PLACED ( 204660 3240 ) S ;
###indef - ERMCTL_SUBRETADDR_R_REG_8 FQX2S + PLACED ( 152460 3240 ) S ;
###indef - ERMCTL_SUBRETADDR_R_REG_7 FQX2S + PLACED ( 187020 0 ) N ;
###indef - ERMCTL_SUBRETADDR_R_REG_6 FQX2S + PLACED ( 187200 3240 ) FS ;
###indef - ERMCTL_SUBRETADDR_R_REG_5 FQX2S + PLACED ( 195120 6480 ) N ;
###indef - ERMCTL_SUBRETADDR_R_REG_4 FQX2S + PLACED ( 205200 6480 ) N ;
###indef - ERMCTL_SUBRETADDR_R_REG_3 FQX2S + PLACED ( 210960 6480 ) N ;
###indef - ERMCTL_SUBRETADDR_R_REG_2 FQX2S + PLACED ( 155160 3240 ) S ;
###indef - ERMCTL_SUBRETADDR_R_REG_13 FQX2S + PLACED ( 161460 6480 ) N ;
###indef - ERMCTL_SUBRETADDR_R_REG_12 FQX2S + PLACED ( 162900 0 ) FN ;
###indef - ERMCTL_SUBRETADDR_R_REG_11 FQX2S + PLACED ( 202140 12960 ) N ;
###indef - ERMCTL_SUBRETADDR_R_REG_10 FQX2S + PLACED ( 173340 6480 ) N ;
###indef - ERMCTL_SUBRETADDR_R_REG_1 FQX2S + PLACED ( 181620 6480 ) N ;
###indef - ERMCTL_SUBRETADDR_R_REG_0 FQX2S + PLACED ( 189180 9720 ) S ;
###indef - ERMCTL_STATE_R_REG FQX2S + PLACED ( 293040 0 ) N ;
###indef - ERMCTL_EMCFETCHADDR_R_REG_9 FQX2S + PLACED ( 199620 3240 ) S ;
###indef - ERMCTL_EMCFETCHADDR_R_REG_8 FQX2S + PLACED ( 189540 0 ) FN ;
###indef - ERMCTL_EMCFETCHADDR_R_REG_7 FQX2S + PLACED ( 191340 6480 ) FN ;
###indef - ERMCTL_EMCFETCHADDR_R_REG_6 FQX2S + PLACED ( 180720 0 ) FN ;
###indef - ERMCTL_EMCFETCHADDR_R_REG_5 FQX2S + PLACED ( 196560 0 ) N ;
###indef - ERMCTL_EMCFETCHADDR_R_REG_4 FQX2S + PLACED ( 195660 3240 ) S ;
###indef - ERMCTL_EMCFETCHADDR_R_REG_3 FQX2S + PLACED ( 209520 3240 ) FS ;
###indef - ERMCTL_EMCFETCHADDR_R_REG_2 FQX2S + PLACED ( 154620 0 ) FN ;
###indef - ERMCTL_EMCFETCHADDR_R_REG_13 FQX2S + PLACED ( 165780 0 ) FN ;
###indef - ERMCTL_EMCFETCHADDR_R_REG_12 FQX2S + PLACED ( 174240 3240 ) S ;
###indef - ERMCTL_EMCFETCHADDR_R_REG_11 FQX2S + PLACED ( 203580 9720 ) S ;
###indef - ERMCTL_EMCFETCHADDR_R_REG_10 FQX2S + PLACED ( 174060 0 ) FN ;
###indef - ERMCTL_EMCFETCHADDR_R_REG_1 FQX2S + PLACED ( 189180 6480 ) N ;
```

ClockRoute2

```
###indef - ERMCTL_EMCFETCHADDR_R_REG_0 FQX2S + PLACED ( 199800 6480 ) N ;
###indef - TCK1 DEFCONM3 ;
###indef - TCK2_ DEFCONM3 ;
###indef - BUF_MASTER_CLK3 L3CKBUF + PLACED ( 0 0 ) FN ;
###indef - BUF_MASTER_CLK2 L3CKBUF + PLACED ( 0 0 ) FN ;
###indef - BUF_MASTER_SC13 L3CKBUF + PLACED ( 1800 0 ) FN ;
###indef - BUF_MASTER_SC12 L3CKBUF + PLACED ( 1800 0 ) FN ;
###indef END COMPONENTS
###indef SPECIALNETS 2 ;
###indef - VSS ( EROM_ROMBIST_WORDADDR_R_REG_8 VSS ) ( EROM_ROMBIST_WORDADDR_R_REG_7 VSS
###indef ) ( EROM_ROMBIST_WORDADDR_R_REG_6 VSS ) ( EROM_ROMBIST_WORDADDR_R_REG_5 VSS ) (
###indef EROM_ROMBIST_WORDADDR_R_REG_4 VSS ) ( EROM_ROMBIST_WORDADDR_R_REG_3 VSS ) (
###indef EROM_ROMBIST_WORDADDR_R_REG_2 VSS ) ( EROM_ROMBIST_WORDADDR_R_REG_1 VSS ) (
###indef EDR_U1005 VSS ) ( EDR_U1004 VSS ) ( EDR_U1003 VSS ) ( EDR_U1002 VSS ) (
###indef EDR_U1001 VSS ) ( EDR_U1000 VSS ) + USE GROUND ;
###indef - VDD ( EROM_ROMBIST_WORDADDR_R_REG_8 VDD ) ( EROM_ROMBIST_WORDADDR_R_REG_7 VDD
###indef ) ( EROM_ROMBIST_WORDADDR_R_REG_6 VDD ) ( EROM_ROMBIST_WORDADDR_R_REG_5 VDD ) (
###indef EROM_ROMBIST_WORDADDR_R_REG_4 VDD ) ( EROM_ROMBIST_WORDADDR_R_REG_3 VDD ) (
###indef EDR_U1005 VDD ) ( EDR_U1004 VDD ) ( EDR_U1003 VDD ) ( EDR_U1002 VDD ) (
###indef EDR_U1001 VDD ) ( EDR_U1000 VDD ) + USE POWER ;
###indef END SPECIALNETS
###indef NETS 1941 ;
###indef - TCK1 ( TCK1 IO ) ;
###indef - TCK2_ ( TCK2_ IO ) ;
###indef - SC1_1 ( SC1_1 IO ) ( BUF_MASTER_SC13 CKI ) ;
###indef - SC1_2 ( BUF_MASTER_SC12 CKO ) ( BUF_MASTER_SC12 CKI ) ;
###indef - SC1 ( BUF_MASTER_SC13 CKO ) ( EROM_ROMBIST_WORDADDR_R_REG_8 SC1 ) ( EROM_ROMBIST_WORDADDR_R_REG_7 SC1
###indef ) ( EROM_ROMBIST_WORDADDR_R_REG_6 SC1 ) ( EROM_ROMBIST_WORDADDR_R_REG_5 SC1 ) (
###indef EROM_ROMBIST_WORDADDR_R_REG_4 SC1 ) ( EROM_ROMBIST_WORDADDR_R_REG_3 SC1 ) (
###indef EROM_ROMBIST_WORDADDR_R_REG_2 SC1 ) ( EROM_ROMBIST_WORDADDR_R_REG_1 SC1 ) (
###indef EROM_ROMBIST_WORDADDR_R_REG_0 SC1 ) ( EROM_ROMBIST_WAITSTATE_R_REG SC1 ) ;
###indef - PH1_1 ( PH1_1 IO ) ( BUF_MASTER_CLK2 CKI ) ;
###indef - PH1_2 ( BUF_MASTER_CLK3 CKI ) ( BUF_MASTER_CLK2 CKO ) ;
###indef - PH1 ( EROM_ROM CK ) ( EROM_ROMBIST_MISR_R_REG_160 CK ) (
###indef BUF_MASTER_CLK3 CKO ) (
###indef EROM_ROMBIST_MISR_R_REG_161 CK ) ( EROM_ROMBIST_MISR_R_REG_162 CK ) (
###indef EROM_ROMBIST_MISR_R_REG_163 CK ) ( EROM_ROMBIST_MISR_R_REG_164 CK ) (
###indef EROM_ROMBIST_MISR_R_REG_165 CK ) ( EROM_ROMBIST_MISR_R_REG_166 CK ) (
###indef EROM_ROMBIST_MISR_R_REG_167 CK ) ( EROM_ROMBIST_MISR_R_REG_29 CK ) (
###indef EROM_ROMBIST_MISR_R_REG_4 CK ) ( EROM_ROMBIST_MISR_R_REG_28 CK ) ( EROM_ROMBIST_MISR_R_REG_27 CK ) (
###indef EROM_ROMBIST_MISR_R_REG_2 CK ) ( EROM_ROMBIST_MISR_R_REG_26 CK ) ( EROM_ROMBIST_MISR_R_REG_25 CK ) (
###indef EROM_ROMBIST_MISR_R_REG_0 CK ) ( EROM_ROMBIST_MISR_R_REG_24 CK ) ( EROM_ROMBIST_MISR_R_REG_23 CK ) (
###indef EROM_ROMBIST_MISR_R_REG_22 CK ) ( EROM_ROMBIST_MISR_R_REG_20 CK ) ( EROM_ROMBIST_MISR_R_REG_21 CK ) (
###indef EROM_ROMBIST_LOADSIG_R_REG CK ) ( EROM_ROMBIST_OBSERVROMEN_R_REG CK ) (
###indef EROM_ROMBIST_MODEREG_R_REG_1 CK ) ( EROM_ROMBIST_MODEREG_R_REG_0 CK ) (
###indef EROM_ROMBIST_MODEREG_R_REG_2 CK ) ( EROM_ROMBIST_MISR_R_REG_131 CK ) (
###indef EROM_ROMBIST_MISR_R_REG_130 CK ) ( EROM_ROMBIST_MISR_R_REG_132 CK ) ( EROM_ROMBIST_MISR_R_REG_133 CK ) (
###indef EROM_ROMBIST_MISR_R_REG_134 CK ) ( EROM_ROMBIST_MISR_R_REG_135 CK ) (
###indef EROM_ROMBIST_MISR_R_REG_136 CK ) ( EROM_ROMBIST_MISR_R_REG_137 CK ) (
###indef EROM_ROMBIST_MISR_R_REG_138 CK ) ( EROM_ROMBIST_MISR_R_REG_139 CK ) (
###indef EROM_ROMBIST_BITADDR_R_REG_2 CK ) ( EROM_ROMBIST_BITADDR_R_REG_1 CK ) (
```

ClockRoute2

45

```
###undef EROM_ROMBIST_BITADDR_R_REG_0 CK    ( EROM_ROMBIST_MISR_R_REG_59 CK )
###undef EROM_ROMBIST_MISR_R_REG_58 CK      ( EROM_ROMBIST_MISR_R_REG_57 CK )
###undef EROM_ROMBIST_MISR_R_REG_56 CK      ( EROM_ROMBIST_MISR_R_REG_55 CK )
###undef EROM_ROMBIST_MISR_R_REG_54 CK      ( EROM_ROMBIST_MISR_R_REG_53 CK )
###undef EROM_ROMBIST_MISR_R_REG_52 CK      ( EROM_ROMBIST_MISR_R_REG_51 CK )
###undef EROM_ROMBIST_MISR_R_REG_50 CK      ( EROM_ROMBIST_OBSERVBA_R_REG_2 CK )
###undef EROM_ROMBIST_OBSERVBA_R_REG_1 CK   ( EROM_ROMBIST_OBSERVBA_R_REG_0 CK )
###undef EROM_ROMBIST_MISR_R_REG_100 CK     ( EROM_ROMBIST_MISR_R_REG_101 CK )
###undef EROM_ROMBIST_MISR_R_REG_102 CK     ( EROM_ROMBIST_MISR_R_REG_103 CK )
###undef EROM_ROMBIST_MISR_R_REG_104 CK     ( EROM_ROMBIST_MISR_R_REG_105 CK )
###undef EROM_ROMBIST_MISR_R_REG_106 CK     ( EROM_ROMBIST_MISR_R_REG_107 CK )
###undef EROM_ROMBIST_MISR_R_REG_108 CK     ( EROM_ROMBIST_MISR_R_REG_109 CK )
###undef EROM_ROMBIST_MISR_R_REG_89 CK      ( EROM_ROMBIST_MISR_R_REG_88 CK )
###undef EROM_ROMBIST_MISR_R_REG_87 CK      ( EROM_ROMBIST_MISR_R_REG_86 CK )
###undef EROM_ROMBIST_MISR_R_REG_85 CK      ( EROM_ROMBIST_MISR_R_REG_84 CK )
###undef EROM_ROMBIST_MISR_R_REG_83 CK      ( EROM_ROMBIST_MISR_R_REG_82 CK )
###undef EROM_ROMBIST_MISR_R_REG_81 CK      ( EROM_ROMBIST_MISR_R_REG_80 CK )
###undef EROM_ROMBIST_HOLDMISR_R_REG CK     ( EROM_ROMBIST_MISR_R_REG_150 CK )
###undef EROM_ROMBIST_MISR_R_REG_151 CK     ( EROM_ROMBIST_MISR_R_REG_152 CK )
###undef EROM_ROMBIST_MISR_R_REG_153 CK     ( EROM_ROMBIST_MISR_R_REG_154 CK )
###undef EROM_ROMBIST_MISR_R_REG_155 CK     ( EROM_ROMBIST_MISR_R_REG_156 CK )
###undef EROM_ROMBIST_MISR_R_REG_157 CK     ( EROM_ROMBIST_MISR_R_REG_158 CK )
###undef EROM_ROMBIST_MISR_R_REG_159 CK     ( EROM_ROMBIST_MISR_R_REG_39 CK )
###undef EROM_ROMBIST_MISR_R_REG_38 CK      ( EROM_ROMBIST_MISR_R_REG_37 CK )
###undef EROM_ROMBIST_MISR_R_REG_36 CK      ( EROM_ROMBIST_MISR_R_REG_35 CK )
###undef EROM_ROMBIST_MISR_R_REG_34 CK      ( EROM_ROMBIST_MISR_R_REG_33 CK )
###undef EROM_ROMBIST_MISR_R_REG_32 CK      ( EROM_ROMBIST_MISR_R_REG_31 CK )
###undef EROM_ROMBIST_MISR_R_REG_30 CK      ( EROM_ROMBIST_MISR_R_REG_120 CK )
###undef EROM_ROMBIST_MISR_R_REG_121 CK     ( EROM_ROMBIST_MISR_R_REG_122 CK )
###undef EROM_ROMBIST_MISR_R_REG_123 CK     ( EROM_ROMBIST_MISR_R_REG_124 CK )
###undef EROM_ROMBIST_MISR_R_REG_125 CK     ( EROM_ROMBIST_MISR_R_REG_126 CK )
###undef EROM_ROMBIST_MISR_R_REG_127 CK     ( EROM_ROMBIST_MISR_R_REG_128 CK )
###undef EROM_ROMBIST_MISR_R_REG_129 CK     ( EROM_ROMBIST_MISR_R_REG_69 CK )
###undef EROM_ROMBIST_MISR_R_REG_68 CK      ( EROM_ROMBIST_MISR_R_REG_67 CK )
###undef EROM_ROMBIST_MISR_R_REG_66 CK      ( EROM_ROMBIST_MISR_R_REG_65 CK )
###undef EROM_ROMBIST_MISR_R_REG_64 CK      ( EROM_ROMBIST_MISR_R_REG_63 CK )
###undef EROM_ROMBIST_MISR_R_REG_62 CK      ( EROM_ROMBIST_MISR_R_REG_61 CK )
###undef EROM_ROMBIST_MISR_R_REG_60 CK      ( EROM_ROMBIST_MISR_R_REG_19 CK )
###undef EROM_ROMBIST_MISR_R_REG_18 CK      ( EROM_ROMBIST_MISR_R_REG_17 CK )
###undef EROM_ROMBIST_MISR_R_REG_16 CK      ( EROM_ROMBIST_MISR_R_REG_15 CK )
###undef EROM_ROMBIST_MISR_R_REG_14 CK      ( EROM_ROMBIST_MISR_R_REG_13 CK )
###undef EROM_ROMBIST_MISR_R_REG_12 CK      ( EROM_ROMBIST_MISR_R_REG_11 CK )
###undef EROM_ROMBIST_MISR_R_REG_10 CK      ( EROM_ROMBIST_MISR_R_REG_99 CK )
###undef EROM_ROMBIST_MISR_R_REG_98 CK      ( EROM_ROMBIST_MISR_R_REG_97 CK )
###undef EROM_ROMBIST_MISR_R_REG_96 CK      ( EROM_ROMBIST_MISR_R_REG_95 CK )
###undef EROM_ROMBIST_MISR_R_REG_94 CK      ( EROM_ROMBIST_MISR_R_REG_93 CK )
###undef EROM_ROMBIST_MISR_R_REG_92 CK      ( EROM_ROMBIST_MISR_R_REG_91 CK )
###undef EROM_ROMBIST_MISR_R_REG_90 CK      ( EROM_ROMBIST_MISR_R_REG_140 CK )
###undef EROM_ROMBIST_MISR_R_REG_141 CK     ( EROM_ROMBIST_MISR_R_REG_142 CK )
###undef EROM_ROMBIST_MISR_R_REG_143 CK     ( EROM_ROMBIST_MISR_R_REG_144 CK )
###undef EROM_ROMBIST_MISR_R_REG_145 CK     ( EROM_ROMBIST_MISR_R_REG_146 CK )
###undef EROM_ROMBIST_MISR_R_REG_147 CK     ( EROM_ROMBIST_MISR_R_REG_148 CK )
```

ClockRoute2

```
##ifndef EROM_ROMBIST_MISR_R_REG_149_CK ) ( EROM_ROMBIST_TESTMODE_R_REG_CK )  (
##ifndef EROM_ROMBIST_MISR_R_REG_49_CK )  ( EROM_ROMBIST_MISR_R_REG_48_CK )  (
##ifndef EROM_ROMBIST_MISR_R_REG_47_CK )  ( EROM_ROMBIST_MISR_R_REG_46_CK )  (
##ifndef EROM_ROMBIST_MISR_R_REG_45_CK )  ( EROM_ROMBIST_MISR_R_REG_44_CK )  (
##ifndef EROM_ROMBIST_MISR_R_REG_43_CK )  ( EROM_ROMBIST_MISR_R_REG_42_CK )  (
##ifndef EROM_ROMBIST_MISR_R_REG_41_CK )  ( EROM_ROMBIST_MISR_R_REG_40_CK )  (
##ifndef EROM_ROMBIST_MISR_R_REG_110_CK ) ( EROM_ROMBIST_MISR_R_REG_111_CK )  (
##ifndef EROM_ROMBIST_MISR_R_REG_112_CK ) ( EROM_ROMBIST_MISR_R_REG_113_CK )  (
##ifndef EROM_ROMBIST_MISR_R_REG_114_CK ) ( EROM_ROMBIST_MISR_R_REG_115_CK )  (
##ifndef EROM_ROMBIST_MISR_R_REG_116_CK ) ( EROM_ROMBIST_MISR_R_REG_117_CK )  (
##ifndef EROM_ROMBIST_MISR_R_REG_118_CK ) ( EROM_ROMBIST_MISR_R_REG_119_CK )  (
##ifndef EROM_ROMBIST_MISR_R_REG_0_CK )   ( EROM_ROMBIST_MISR_R_REG_1_CK )    (
##ifndef EROM_ROMBIST_MISR_R_REG_2_CK )   ( EROM_ROMBIST_MISR_R_REG_3_CK )    (
##ifndef EROM_ROMBIST_MISR_R_REG_4_CK )   ( EROM_ROMBIST_WAITSTATE_R_REG_CK ) (
##ifndef EROM_ROMBIST_MISR_R_REG_5_CK )   ( EROM_ROMBIST_MISR_R_REG_6_CK )    (
##ifndef EROM_ROMBIST_MISR_R_REG_7_CK )   ( EROM_ROMBIST_MISR_R_REG_8_CK )    (
##ifndef EROM_ROMBIST_MISR_R_REG_9_CK )   ( EROM_ROMBIST_OBSERVWA_R_REG_0_CK )  (
##ifndef EROM_ROMBIST_OBSERVWA_R_REG_1_CK ) ( EROM_ROMBIST_OBSERVWA_R_REG_2_CK ) (
##ifndef EROM_ROMBIST_OBSERVWA_R_REG_3_CK ) ( EROM_ROMBIST_OBSERVWA_R_REG_4_CK ) (
##ifndef EROM_ROMBIST_OBSERVWA_R_REG_5_CK ) ( EROM_ROMBIST_OBSERVWA_R_REG_6_CK ) (
##ifndef EROM_ROMBIST_OBSERVWA_R_REG_7_CK ) ( EROM_ROMBIST_OBSERVWA_R_REG_8_CK ) (
##ifndef EROM_ROMBIST_WORDADDR_R_REG_0_CK ) ( EROM_ROMBIST_WORDADDR_R_REG_1_CK ) (
##ifndef EROM_ROMBIST_WORDADDR_R_REG_2_CK ) ( EROM_ROMBIST_WORDADDR_R_REG_3_CK ) (
##ifndef EROM_ROMBIST_WORDADDR_R_REG_4_CK ) ( EROM_ROMBIST_WORDADDR_R_REG_5_CK ) (
##ifndef EROM_ROMBIST_WORDADDR_R_REG_6_CK ) ( EROM_ROMBIST_WORDADDR_R_REG_7_CK ) (
##ifndef EROM_ROMBIST_WORDADDR_R_REG_8_CK ) ( EROM_ROMBIST_MISR_R_REG_79_CK )   (
##ifndef EROM_ROMBIST_MISR_R_REG_78_CK )  ( EROM_ROMBIST_MISR_R_REG_77_CK )   (
##ifndef EROM_ROMBIST_MISR_R_REG_76_CK )  ( EROM_ROMBIST_MISR_R_REG_75_CK )   (
##ifndef EROM_ROMBIST_MISR_R_REG_74_CK )  ( EROM_ROMBIST_MISR_R_REG_73_CK )   (
##ifndef EROM_ROMBIST_MISR_R_REG_72_CK )  ( EROM_ROMBIST_MISR_R_REG_71_CK )   (
##ifndef EROM_ROMBIST_MISR_R_REG_70_CK )  (
##ifndef ERMCTL_EMCFETCHADDR_R_REG_13_CK ) ( ERMCTL_EMCFETCHADDR_R_REG_12_CK ) (
##ifndef ERMCTL_EMCFETCHADDR_R_REG_11_CK ) ( ERMCTL_EMCFETCHADDR_R_REG_10_CK ) (
##ifndef ERMCTL_SUBRETADDR_R_REG_9_CK )   ( ERMCTL_SUBRETADDR_R_REG_8_CK )    (
##ifndef ERMCTL_SUBRETADDR_R_REG_7_CK )   ( ERMCTL_SUBRETADDR_R_REG_6_CK )    (
##ifndef ERMCTL_SUBRETADDR_R_REG_5_CK )   ( ERMCTL_SUBRETADDR_R_REG_4_CK )    (
##ifndef ERMCTL_SUBRETADDR_R_REG_3_CK )   ( ERMCTL_SUBRETADDR_R_REG_2_CK )    (
##ifndef ERMCTL_SUBRETADDR_R_REG_1_CK )   ( ERMCTL_SUBRETADDR_R_REG_0_CK )    (
##ifndef ERMCTL_SUBRETADDR_R_REG_13_CK )  ( ERMCTL_EMCFETCHADDR_R_REG_12_CK ) (
##ifndef ERMCTL_SUBRETADDR_R_REG_11_CK )  ( ERMCTL_EMCFETCHADDR_R_REG_10_CK ) (
##ifndef ERMCTL_EMCFETCHADDR_R_REG_0_CK ) ( ERMCTL_EMCFETCHADDR_R_REG_1_CK )  (
##ifndef ERMCTL_EMCFETCHADDR_R_REG_2_CK ) ( ERMCTL_STATE_R_REG_CK )           (
##ifndef ERMCTL_EMCFETCHADDR_R_REG_3_CK ) ( ERMCTL_EMCFETCHADDR_R_REG_4_CK )  (
##ifndef ERMCTL_EMCFETCHADDR_R_REG_5_CK ) ( ERMCTL_EMCFETCHADDR_R_REG_6_CK )  (
##ifndef ERMCTL_EMCFETCHADDR_R_REG_7_CK ) ( ERMCTL_EMCFETCHADDR_R_REG_8_CK )  (
##ifndef ERMCTL_EMCFETCHADDR_R_REG_9_CK )
##ifndef - EDR_N4181 ( EDR_U1243_Z ) ( EDR_U1241_A ) ;
##ifndef END NETS
##ifndef END DESIGN
```

46

ClockRoute2

APPENDIX C

```
###clkctl TechFile    /usr/cae/lib/rel/cmos51_h/dat/cell3wri2netload/wri_consts
###clkctl ParmFile    /usr/cae/lib/rel/cmos51_h/stdcells/parm/cmos51_h.parm
```

ClockRoute2

```
###clkctl Buffer                    L3CKBUF 0.7 1800 CKI CKO VDD VSS
###clkctl ClockDriveMult            SC1     4
###clkctl
###clkctl Grid                      180
###clkctl RowHeight                 3240
###clkctl RowLookahead              2
###clkctl M4Cap                     WIRE_CAP[M4]
###clkctl M4Mult                    1
###clkctl M5Cap                     WIRE_CAP[LM]
###clkctl M5Mult                    1.5
###clkctl M5Width                   260
###clkctl Orientation               N
###clkctl
###clkctl L3Master PH1      Buf_MASTER_CLK3
###clkctl L2Master PH1_2    Buf_MASTER_CLK2
###clkctl L3Master SC1      Buf_MASTER_SC13
###clkctl L2Master SC1_2    Buf_MASTER_SC12
###clkctl L3Master SC2      Buf_MASTER_SC23
###clkctl L2Master SC2_2    Buf_MASTER_SC22
###clkctl BufCap   0.064
###clkctl
###clkctl M4Row 0 720 ( SC1_1 Ph1 1 SC2_1 ) 3240 945 ( SC1_2 Ph1_2 SC2_2 )
###clkctl DeleteCells EROM_ROMBIST_SUB_297_U1\d+
###clkctl AddWire OutsideBox M3 (20000,0) (20000,9720)
###clkctl
###clkctl ClockBox Box1 (0,0) (150000,16200) (
###clkctl    RowPrewire               PH1          2
###clkctl    RowStrapToEdge           PH1          4
###clkctl    ClockWire PH1_2 PH1                   71800 77600
###clkctl    ClockWire SC1_2 SC1                   70800 78600
###clkctl    buf                                   72000
###clkctl    numbuf                   3
###clkctl    nobuffer                 3240
###clkctl    AddWire InBox1 M3 (20100,0) (20100,9720)
###clkctl )
###clkctl L2Box l2box1 (0,0) (446580,16200) (
###clkctl WireLoad PH1_1 PH1_2 2.0
###clkctl WireLoad SC1_1 SC1_2 0.5
###clkctl    buf        (160000,6480)
###clkctl    numbuf     6
###clkctl )
###clkctl ClockBox Box2 (150000,0) (300000,16200) (
###clkctl    ClockWire PH1_2 PH1                   201000 205000
###clkctl    ClockWire SC1_2 SC1                   202000 206000
###clkctl    buf                                   200000
###clkctl    numbuf     2
###clkctl )
###clkctl ClockBox Box3 (300000,0) (446580,16200) (
```

FIG. 47

48

ClockRoute2

```
###clkctl    ClockWire PH1_2 PHI         360100 390000
###clkctl    ClockWire SC1_2 SC1         361100 391000
###clkctl    RowStrapToEdge PH1 1
###clkctl    NoStrap 3240 6480           370000
###clkctl    buf         3
###clkctl    numbuf
###clkctl  )
###clkctl  ClockBox Box4 (0,16200) (446580,2106600) (
###clkctl    ClockWire PH1_2 PHI         100 200
###clkctl    ClockWire SC1_2 SC1         300 400
###clkctl    buf                         500
###clkctl    numbuf      5
###clkctl  )
###clkctl  SPBox EromBox EROM_ROM (
###clkctl    AddWire InEromBox M3 (20200,0) (20200,9720) viasat
###clkctl    Place PH1_2 PH1 (23000,0)
###clkctl  )
```

ClockRoute2

Appendix L

```
###inver module HEDRM(
###inver   // Inputs;
###inver   IC_Op_I,
###inver   IC_OpV_I,
###inver   IC_ERET_I,
###inver   DEC_EmReg_I,
###inver   DEC_EmRegm_I,
###inver   DEC_EmDSz_I,
###inver   DEC_EmASz_I,
###inver   DEC_EmOprSeg_I,
###inver   DEC_EmLock_I,
###inver   DEC_ExtEmc_I,
###inver   RUX_B_I,
###inver   RUX_WrSR5_I,
###inver   .RUX_SRWrData_18_I(RUX_SRWrData_I[18]),
###inver   SC_Vec2ROM_I,
###inver   SC_Vec2RAM_I,
###inver   SC_Vec2Dec_I,
###inver   SC_SchedFull_I,
###inver   SC_TermMOVS_I,
###inver   SC_VecAddr_I,
###inver   DEC_Vec2ROM_I,
###inver   DEC_VecAddr_I,
###inver   IO_BISTEn_I,
###inver   IO_Reset_I,
###inver   // Outputs;
###inver   EDR_Op0_O,
###inver   EDR_Op1_O,
###inver   EDR_Op2_O,
###inver   EDR_Op3_O,
###inver   EDR_ERET_O,
###inver   EDR_OpQV_O,
```

FIG. 49

ClockRoute2

```
###inver   ERM_DoERET_O,
###inver   ERM_StopIF_O,
###inver   // Clocks;
###inver   Ph1_1
###inver   );
###inver   // Input Declarations;
###inver   input [37:0] IC_Op_I;
###inver   input IC_OpV_I;
###inver   input IC_ERET_I;
###inver   input [2:0] DEC_EmReg_I;
###inver   input [2:0] DEC_EmRegm_I;
###inver   input DEC_EmDSz_I;
###inver   input DEC_EmASz_I;
###inver   input [2:0] DEC_EmOprSeg_I;
###inver   input DEC_EmLock_I;
###inver   input DEC_ExtEmc_I;
###inver   input RUX_B_I;
###inver   input RUX_WrSR5_I;
###inver   input [19:18] RUX_SRWrData_I;
###inver   input SC_Vec2ROM_I;
###inver   input SC_Vec2RAM_I;
###inver   input SC_Vec2Dec_I;
###inver   input SC_SchedFull_I;
###inver   input SC_TermMOVS_I;
###inver   input [`EmcOpAddrSz] SC_VecAddr_I;
###inver   input DEC_Vec2ROM_I;
###inver   input [`EmcOpAddrSz] DEC_VecAddr_I;
###inver   input IO_BISTEn_I_;
###inver   input IO_Reset_I;
###inver   // Output Declarations;
###inver   output [37:0] EDR_Op0_O;
###inver   output [37:0] EDR_Op1_O;
###inver   output [37:0] EDR_Op2_O;
###inver   output [37:0] EDR_Op3_O;
###inver   output EDR_ERET_O;
###inver   output EDR_OpQV_O;
###inver   output ERM_DoERET_O;
###inver   output ERM_StopIF_O;
###inver   // Clock Declaration;
###inver   input Ph1_1;
###inver   //- dummyfilter
###inver   // Wire Declaration;
###inver   wire [`EmcOpAddrSz] EmcAddr_W;
###inver   wire [`EmcOpActionsSz] EmcAction_W;
###inver   wire [13:2] ERM_FetchAddr_W;
###inver   wire ERM_ROMEn_W;
```

ClockRoute2

```
###inver   wire [37:0] Op0_W;
###inver   wire [37:0] Op1_W;
###inver   wire [37:0] Op2_W;
###inver   wire [37:0] Op3_W;
###inver   wire [1:0] EmcFetchAddr_W;
###inver   wire ERET_W;
###inver   wire ERM_RTW_W;
###inver
###inver   // Instantiate EDR:
###inver   HEDR EDR (
###inver      // Inputs:
###inver      .IC_Op_I(IC_Op_I),
###inver      .IC_OpV_I(IC_OpV_I),
###inver      .IC_ERET_I(IC_ERET_I),
###inver      .ERM_Op0_I(Op0_W),
###inver      .ERM_Op1_I(Op1_W),
###inver      .ERM_Op2_I(Op2_W),
###inver      .ERM_Op3_I(Op3_W),
###inver      .ERM_EmcFetchAddr_I(EmcFetchAddr_W),
###inver      .ERM_ERET_I(ERET_W),
###inver      .DEC_EmReg_I(DEC_EmReg_I),
###inver      .DEC_EmRegm_I(DEC_EmRegm_I),
###inver      .DEC_EmDSz_I(DEC_EmDSz_I),
###inver      .DEC_EmASz_I(DEC_EmASz_I),
###inver      .DEC_EmUprSeg_I(DEC_EmOprSeg_I),
###inver      .DEC_EmLock_I(DEC_EmLock_I),
###inver      .DEC_ExtEmc_I(DEC_ExtEmc_I),
###inver      .RUX_B_I(RUX_B_I),
###inver
###inver      // Outputs:
###inver      .EDR_Op0_O(EDR_Op0_O),
###inver      .EDR_Op1_O(EDR_Op1_O),
###inver      .EDR_Op2_O(EDR_Op2_O),
###inver      .EDR_Op3_O(EDR_Op3_O),
###inver      .EDR_ERET_O(EDR_ERET_O),
###inver      .EDR_OpQV_O(EDR_OpQV_O)
###inver   );
###inver
###inver   // Instantiate ERM Control:
###inver   HERMCtl ERMCtl (
###inver      // Inputs:
###inver      .ERM_Op3_37to30_I(Op3_W[37:30]),
###inver      .ERM_Op3_13to0_I(Op3_W[13:0]),
###inver      .ERM_Addr_I(EmcAddr_W),
###inver      .ERM_Action_I(EmcAction_W),
###inver      .SC_Vec2ROM_I(SC_Vec2ROM_I),
###inver      .SC_Vec2RAM_I(SC_Vec2RAM_I),
###inver      .SC_Vec2Dec_I(SC_Vec2Dec_I),
###inver      .SC_SchedFull_I(SC_SchedFull_I),
###inver      .SC_TermMOVS_I(SC_TermMOVS_I),
###inver      .SC_VecAddr_I(SC_VecAddr_I),
###inver      .DEC_Vec2ROM_I(DEC_Vec2ROM_I),
```

ClockRoute2

```
###inver         .DEC_VecAddr_I(DEC_VecAddr_I),
###inver         .IO_Reset_I(IO_Reset_I),
###inver         .RUX_WrSR5_I(RUX_WrSR5_I),
###inver         .RUX_SRWrData_18_I(RUX_SRWrData_I[18]),
###inver         // Outputs;
###inver         .ERM_ERET_O(ERET_W),
###inver         .ERM_FetchAddr_O(ERM_FetchAddr_W),
###inver         .ERM_ROMEn_O(ERM_ROMEn_W),
###inver         .ERM_EmcFetchAddr_O(EmcFetchAddr_W),
###inver         .ERM_DoERET_O(ERM_DoERET_O),
###inver         .ERM_StopIF_O(ERM_StopIF_O),
###inver         .ERM_RTM_O(ERM_RTM_W),
###inver         // Clocks;
###inver         .Clk(Ph1)
###inver         );
###inver
###inver         // Instantiate ROM Wrapper;
###inver         HEROM EROM (
###inver         // Inputs;
###inver         .ERM_FetchAddr_I(ERM_FetchAddr_W),
###inver         .ERM_ROMEn_I(ERM_ROMEn_W),
###inver         .ERM_RTM_I(ERM_RTM_W),
###inver         .IO_BISTEn_I_(IO_BISTEn_I_),
###inver
###inver         // Outputs;
###inver         .ERM_Op0_O(Op0_W),
###inver         .ERM_Op1_O(Op1_W),
###inver         .ERM_Op2_O(Op2_W),
###inver         .ERM_Op3_O(Op3_W),
###inver         .ERM_Addr_O(EmcAddr_W),
###inver         .ERM_Action_O(EmcAction_W),
###inver
###inver         // Clocks;
###inver         .Clk(Ph1)
###inver         );
###inver
###inver         l3ckbuf Buf_MASTER_CLK2(.CKO(Ph1_2),   .CKI(Ph1_2));
###inver         l3ckbuf Buf_MASTER_CLK3(.CKO(Ph1),     .CKI(Ph1));
###inver         l3ckbuf Buf_MASTER_SC13(.CKO(SC1),     .CKI(SC1_2));
###inver         l3ckbuf Buf_MASTER_SC12(.CKO(SC1_2),   .CKI(SC1_1));
###inver         l3ckbuf Buf_MASTER_SC23(.CKO(SC2),     .CKI(SC2_2));
###inver         l3ckbuf Buf_MASTER_SC22(.CKO(SC2_2),   .CKI(SC2_1));
###inver
###inver         //*
###inver endmodule
```

ClockRoute2

APPENDIX E savedef UNITS DISTANCE MICRONS 100 ;
savedef PINS 244 ;
savedef - PH1 + NET PH1 ;

ClockRoute2

```
###savedef - SC1 + NET SC1 ;
###savedef - EDR_ERET_O + NET EDR_ERET_O ;
###savedef END PINS
###savedef VIAS 6 ;
###savedef - VIA01 + RECT M1 ( -60 -60 ) ( 60 60 ) + RECT CA ( -25 -25 ) ( 25 25 ) + RECT
###savedef PC ( -60 -60 ) ( 60 60 ) ;
###savedef END VIAS
###savedef COMPONENTS 1929 ;
###savedef - VIAIN_Box2_0_PHI_0 M45CLKVIA + FIXED ( 200865 -135 ) N ;
###savedef - VIAIN_Box2_3240_PHI_0 M45CLKVIA + FIXED ( 200865 3105 ) S ;
###savedef - VIAIN_Box2_9720_PHI_0 M45CLKVIA + FIXED ( 200865 11205 ) S ;
###savedef - VIAIN_Box2_12960_PHI_0 M45CLKVIA + FIXED ( 200865 14445 ) N ;
###savedef - VIAIN_Box3_0_PHI_0 M45CLKVIA + FIXED ( 359965 -135 ) N ;
###savedef - VIAIN_Box3_0_PHI_0 M45CLKVIA + FIXED ( 71665 -135 ) N ;
###savedef - VIAIN_Box1_6480_PHI_0 M45CLKVIA + FIXED ( 71665 7965 ) N ;
###savedef - VIAIN_Box1_6480_PHI_1 M45CLKVIA + FIXED ( 71665 7605 ) N ;
###savedef - VIAIN_Box1_9720_PHI_0 M45CLKVIA + FIXED ( 71665 11205 ) S ;
###savedef - VIAIN_Box1_12960_PHI_0 M45CLKVIA + FIXED ( 71665 14445 ) N ;
###savedef - VIAIN_Box1_0_SC1_1 M45CLKVIA + FIXED ( 70665 225 ) N ;
###savedef - L2VIA_SC1_2_202000_3240 M45CLKVIA + FIXED ( 201865 4005 ) N ;
###savedef - L2VIA_SC1_2_361100_3240 M45CLKVIA + FIXED ( 360965 4005 ) S ;
###savedef - L2VIA_SC1_2_70800_3240 M45CLKVIA + FIXED ( 70665 4005 ) S ;
###savedef - L2VIA_PHI_2_201000_3240 M45CLKVIA + FIXED ( 200865 4455 ) S ;
###savedef - L2VIA_PHI_2_360100_3240 M45CLKVIA + FIXED ( 359965 4455 ) S ;
###savedef - L2VIA_PHI_2_71800_3240 M45CLKVIA + FIXED ( 71665 4455 ) S ;
###savedef - VIAOUT_Box2_PHI_0_0 M45CLKVIA + FIXED ( 204865 2745 ) N ;
###savedef - VIAOUT_Box2_PHI_3240_0 M45CLKVIA + FIXED ( 204865 5985 ) S ;
###savedef - VIAOUT_Box2_PHI_6480_0 M45CLKVIA + FIXED ( 204865 8145 ) N ;
###savedef - VIAOUT_Box2_PHI_9720_0 M45CLKVIA + FIXED ( 204865 11385 ) S ;
###savedef - VIAOUT_Box2_PHI_12960_0 M45CLKVIA + FIXED ( 204865 14625 ) N ;
###savedef - VIAOUT_Box3_PHI_0_0 M45CLKVIA + FIXED ( 389865 2745 ) N ;
###savedef - VIAOUT_Box3_PHI_3240_0 M45CLKVIA + FIXED ( 389865 5985 ) S ;
###savedef - VIAOUT_Box3_PHI_6480_0 M45CLKVIA + FIXED ( 389865 8145 ) N ;
###savedef - VIAOUT_Box3_PHI_9720_0 M45CLKVIA + FIXED ( 389865 11385 ) S ;
###savedef - VIAOUT_Box3_PHI_12960_0 M45CLKVIA + FIXED ( 389865 14625 ) N ;
###savedef - VIAOUT_Box1_PHI_0_0 M45CLKVIA + FIXED ( 77465 2745 ) N ;
###savedef - VIAOUT_Box1_SC1_0_1 M45CLKVIA + FIXED ( 78465 2385 ) N ;
###savedef - VIAOUT_Box1_SC1_3240_0 M45CLKVIA + FIXED ( 78465 5985 ) S ;
###savedef - VIAOUT_Box1_PHI_6480_0 M45CLKVIA + FIXED ( 77465 8145 ) N ;
###savedef - VIAOUT_Box1_SC1_6480_1 M45CLKVIA + FIXED ( 78465 8505 ) S ;
###savedef - VIAOUT_Box1_SC1_9720_0 M45CLKVIA + FIXED ( 77465 11385 ) S ;
###savedef - VIAOUT_Box1_SC1_9720_1 M45CLKVIA + FIXED ( 78465 11745 ) S ;
###savedef - VIAOUT_Box1_PHI_12960_0 M45CLKVIA + FIXED ( 78465 14625 ) N ;
###savedef - EROM_ROM FQX2S + FIXED ( 90 17145 ) N ;
###savedef - EROM_ROMBIST_WORDADDR_R_REG_8 IFQX2S + PLACED ( 77220 3240 ) S ;
###savedef - EROM_ROMBIST_WORDADDR_R_REG_7 FQX2S + PLACED ( 81540 3240 ) FS ;
###savedef - EROM_ROMBIST_WORDADDR_R_REG_6 FQX2S + PLACED ( 79380 9720 ) FS ;
###savedef - EROM_ROMBIST_WORDADDR_R_REG_5 FQX2S + PLACED ( 69480 9720 ) S ;
###savedef - EROM_ROMBIST_WORDADDR_R_REG_4 FQX2S + PLACED ( 67320 9720 ) FS ;
###savedef - EROM_ROMBIST_WORDADDR_R_REG_3 FQX2S + PLACED ( 56160 6480 ) FN ;
###savedef - EROM_ROMBIST_WORDADDR_R_REG_2 FQX2S + PLACED ( 55620 3240 ) S ;
```

ClockRoute2

```
###savedef - EROM_ROMBIST_WORDADDR_R_REG_1 FQX2S + PLACED ( 65520 3240 ) S ;
###savedef - EROM_ROMBIST_WORDADDR_R_REG_0 FQX2S + PLACED ( 66060 6480 ) N + REGION ( 523080 771120 ) ( 652500 771480 ) ;
###savedef - EROM_ROMBIST_WAITSTATE_R_REG FQX2S + PLACED ( 83700 3240 ) N ;
###savedef - EROM_RO-MBIST_SUB_297_U18 NAND2X2 + PLACED ( 60300 0 ) N ;
###savedef - EROM_ROMBIST_OBSERVWA_R_REG_8 FQX2S + PLACED ( 111420 3240 ) S ;
###savedef - EROM_ROMBIST_OBSERVWA_R_REG_7 FQX2S + PLACED ( 0 12960 ) FN ;
###savedef - EROM_ROMBIST_OBSERVWA_R_REG_6 FQX2S + PLACED ( 3960 12960 ) FN ;
###savedef - EROM_ROMBIST_OBSERVWA_R_REG_5 FQX2S + PLACED ( 3420 6480 ) FN ;
###savedef - EROM_ROMBIST_OBSERVWA_R_REG_4 FQX2S + PLACED ( 67860 3240 ) S ;
###savedef - EROM_ROMBIST_OBSERVWA_R_REG_3 FQX2S + PLACED ( 73980 12960 ) FN ;
###savedef - EROM_ROMBIST_OBSERVWA_R_REG_2 FQX2S + PLACED ( 60120 12960 ) FN ;
###savedef - EROM_ROMBIST_OBSERVWA_R_REG_1 FQX2S + PLACED ( 109080 12960 ) FN ;
###savedef - EROM_ROMBIST_OBSERVWA_R_REG_0 FQX2S + PLACED ( 27360 6480 ) FN ;
###savedef - EROM_ROMBIST_OBSERVROMEN_R_REG FQX2S + PLACED ( 90000 12960 ) FN ;
###savedef - EROM_ROMBIST_OBSERVBA_R_REG_2 FQX2S + PLACED ( 94860 12960 ) FN ;
###savedef - EROM_ROMBIST_OBSERVBA_R_REG_1 FQX2S + PLACED ( 35280 3240 ) S ;
###savedef - EROM_ROMBIST_OBSERVBA_R_REG_0 FQX2S + PLACED ( 95220 9720 ) S ;
###savedef - EROM_ROMBIST_MODEREG_R_REG_2 FQX2S + PLACED ( 86580 12960 ) FN ;
###savedef - EROM_ROMBIST_MODEREG_R_REG_1 FQX2S + PLACED ( 87480 6480 ) FN ;
###savedef - EROM_ROMBIST_MODEREG_R_REG_0 FQX2S + PLACED ( 82080 12960 ) FN ;
###savedef - EROM_ROMBIST_MISR_R_REG_99 FQX2S + PLACED ( 42840 0 ) FN ;
###savedef - EROM_ROMBIST_MISR_R_REG_98 FQX2S + PLACED ( 41220 3240 ) S ;
###savedef - EROM_ROMBIST_MISR_R_REG_97 FQX2S + PLACED ( 44820 3240 ) S ;
###savedef - EROM_ROMBIST_MISR_R_REG_96 FQX2S + PLACED ( 41760 6480 ) FN ;
###savedef - EROM_ROMBIST_MISR_R_REG_95 FQX2S + PLACED ( 31500 3240 ) N ;
###savedef - EROM_ROMBIST_MISR_R_REG_94 FQX2S + PLACED ( 39600 6480 ) S ;
###savedef - EROM_ROMBIST_MISR_R_REG_93 FQX2S + PLACED ( 36000 9720 ) S ;
###savedef - EROM_ROMBIST_MISR_R_REG_92 FQX2S + PLACED ( 34560 12960 ) FN ;
###savedef - EROM_ROMBIST_MISR_R_REG_91 FQX2S + PLACED ( 39420 12960 ) N ;
###savedef - EROM_ROMBIST_MISR_R_REG_90 FQX2S + PLACED ( 28260 12960 ) N ;
###savedef - EROM_ROMBIST_MISR_R_REG_9 FQX2S + PLACED ( 153180 9720 ) FN ;
###savedef - EROM_ROMBIST_MISR_R_REG_89 FQX2S + PLACED ( 27720 9720 ) S ;
###savedef - EROM_ROMBIST_MISR_R_REG_88 FQX2S + PLACED ( 30600 6480 ) N ;
###savedef - EROM_ROMBIST_MISR_R_REG_87 FQX2S + PLACED ( 26460 0 ) FN ;
###savedef - EROM_ROMBIST_MISR_R_REG_86 FQX2S + PLACED ( 33300 0 ) N ;
###savedef - EROM_ROMBIST_MISR_R_REG_85 FQX2S + PLACED ( 23220 0 ) N ;
###savedef - EROM_ROMBIST_MISR_R_REG_84 FQX2S + PLACED ( 38880 0 ) N ;
###savedef - EROM_ROMBIST_MISR_R_REG_83 FQX2S + PLACED ( 3420 3240 ) S ;
###savedef - EROM_ROMBIST_MISR_R_REG_82 FQX2S + PLACED ( 5940 6480 ) FN ;
###savedef - EROM_ROMBIST_MISR_R_REG_81 FQX2S + PLACED ( 11880 3240 ) FS ;
###savedef - EROM_ROMBIST_MISR_R_REG_80 FQX2S + PLACED ( 6660 0 ) FN ;
###savedef - EROM_ROMBIST_MISR_R_REG_8 FQX2S + PLACED ( 156240 6480 ) N ;
###savedef - EROM_ROMBIST_MISR_R_REG_79 FQX2S + PLACED ( 14220 3240 ) FS ;
###savedef - EROM_ROMBIST_MISR_R_REG_78 FQX2S + PLACED ( 16200 3240 ) S ;
###savedef - EROM_ROMBIST_MISR_R_REG_77 FQX2S + PLACED ( 18540 0 ) FN ;
###savedef - EROM_ROMBIST_MISR_R_REG_76 FQX2S + PLACED ( 22320 3240 ) FS ;
###savedef - EROM_ROMBIST_MISR_R_REG_75 FQX2S + PLACED ( 20520 6480 ) FN ;
###savedef - EROM_ROMBIST_MISR_R_REG_74 FQX2S + PLACED ( 18900 9720 ) S ;
###savedef - EROM_ROMBIST_MISR_R_REG_73 FQX2S + PLACED ( 23760 9720 ) S ;
###savedef - EROM_ROMBIST_MISR_R_REG_72 FQX2S + PLACED ( 19980 12960 ) FN ;
###savedef - EROM_ROMBIST_MISR_R_REG_71 FQX2S + PLACED ( 14040 12960 ) FN ;
###savedef - EROM_ROMBIST_MISR_R_REG_70 FQX2S + PLACED ( 13500 9720 ) S ;
```

FIG. 54

ClockRoute2

```
###savedef - EROM_ROMBIST_MISR_R_REG_7  FQX2S + PLACED ( 148500 3240  ) S ;
###savedef - EROM_ROMBIST_MISR_R_REG_69 FQX2S + PLACED ( 17280  6480  ) N ;
###savedef - EROM_ROMBIST_MISR_R_REG_68 FQX2S + PLACED ( 7920   6480  ) FN ;
###savedef - EROM_ROMBIST_MISR_R_REG_67 FQX2S + PLACED ( 7920   9720  ) S ;
###savedef - EROM_ROMBIST_MISR_R_REG_66 FQX2S + PLACED ( 5940   9720  ) FS ;
###savedef - EROM_ROMBIST_MISR_R_REG_65 FQX2S + PLACED ( 0      9720  ) S ;
###savedef - EROM_ROMBIST_MISR_R_REG_64 FQX2S + PLACED ( 0      0     ) N ;
###savedef - EROM_ROMBIST_MISR_R_REG_63 FQX2S + PLACED ( 3240   0     ) N ;
###savedef - EROM_ROMBIST_MISR_R_REG_62 FQX2S + PLACED ( 107100 9720  ) FS ;
###savedef - EROM_ROMBIST_MISR_R_REG_61 FQX2S + PLACED ( 128880 6480  ) N ;
###savedef - EROM_ROMBIST_MISR_R_REG_60 FQX2S + PLACED ( 127260 3240  ) N ;
###savedef - EROM_ROMBIST_MISR_R_REG_6  FQX2S + PLACED ( 145440 6480  ) FN ;
###savedef - EROM_ROMBIST_MISR_R_REG_59 FQX2S + PLACED ( 120060 9720  ) S ;
###savedef - EROM_ROMBIST_MISR_R_REG_58 FQX2S + PLACED ( 118800 12960 ) N ;
###savedef - EROM_ROMBIST_MISR_R_REG_57 FQX2S + PLACED ( 123120 12960 ) N ;
###savedef - EROM_ROMBIST_MISR_R_REG_56 FQX2S + PLACED ( 113400 12960 ) FN ;
###savedef - EROM_ROMBIST_MISR_R_REG_55 FQX2S + PLACED ( 110520 6480  ) FN ;
###savedef - EROM_ROMBIST_MISR_R_REG_54 FQX2S + PLACED ( 115200 6480  ) N ;
###savedef - EROM_ROMBIST_MISR_R_REG_53 FQX2S + PLACED ( 105480 6480  ) FN ;
###savedef - EROM_ROMBIST_MISR_R_REG_52 FQX2S + PLACED ( 107100 12960 ) N ;
###savedef - EROM_ROMBIST_MISR_R_REG_51 FQX2S + PLACED ( 112140 9720  ) S ;
###savedef - EROM_ROMBIST_MISR_R_REG_50 FQX2S + PLACED ( 116820 0     ) N ;
###savedef - EROM_ROMBIST_MISR_R_REG_5  FQX2S + PLACED ( 144900 9720  ) S ;
###savedef - EROM_ROMBIST_MISR_R_REG_49 FQX2S + PLACED ( 121500 0     ) N ;
###savedef - EROM_ROMBIST_MISR_R_REG_48 FQX2S + PLACED ( 121680 3240  ) S ;
###savedef - EROM_ROMBIST_MISR_R_REG_47 FQX2S + PLACED ( 115560 3240  ) N ;
###savedef - EROM_ROMBIST_MISR_R_REG_46 FQX2S + PLACED ( 122220 6480  ) S ;
###savedef - EROM_ROMBIST_MISR_R_REG_45 FQX2S + PLACED ( 51300  9720  ) S ;
###savedef - EROM_ROMBIST_MISR_R_REG_44 FQX2S + PLACED ( 58140  12960 ) N ;
###savedef - EROM_ROMBIST_MISR_R_REG_43 FQX2S + PLACED ( 97380  9720  ) S ;
###savedef - EROM_ROMBIST_MISR_R_REG_42 FQX2S + PLACED ( 100620 12960 ) N ;
###savedef - EROM_ROMBIST_MISR_R_REG_41 FQX2S + PLACED ( 133920 6480  ) N ;
###savedef - EROM_ROMBIST_MISR_R_REG_40 FQX2S + PLACED ( 127080 9720  ) S ;
###savedef - EROM_ROMBIST_MISR_R_REG_4  FQX2S + PLACED ( 149940 12960 ) FN ;
###savedef - EROM_ROMBIST_MISR_R_REG_39 FQX2S + PLACED ( 126720 12960 ) N ;
###savedef - EROM_ROMBIST_MISR_R_REG_38 FQX2S + PLACED ( 133020 12960 ) N ;
###savedef - EROM_ROMBIST_MISR_R_REG_37 FQX2S + PLACED ( 131580 9720  ) S ;
###savedef - EROM_ROMBIST_MISR_R_REG_36 FQX2S + PLACED ( 135180 12960 ) FN ;
###savedef - EROM_ROMBIST_MISR_R_REG_35 FQX2S + PLACED ( 141300 12960 ) N ;
###savedef - EROM_ROMBIST_MISR_R_REG_34 FQX2S + PLACED ( 142560 9720  ) FS ;
###savedef - EROM_ROMBIST_MISR_R_REG_33 FQX2S + PLACED ( 145800 3240  ) FS ;
###savedef - EROM_ROMBIST_MISR_R_REG_32 FQX2S + PLACED ( 150840 0     ) N ;
###savedef - EROM_ROMBIST_MISR_R_REG_31 FQX2S + PLACED ( 141480 0     ) FN ;
###savedef - EROM_ROMBIST_MISR_R_REG_30 FQX2S + PLACED ( 138420 6480  ) FN ;
###savedef - EROM_ROMBIST_MISR_R_REG_3  FQX2S + PLACED ( 144720 12960 ) FN ;
###savedef - EROM_ROMBIST_MISR_R_REG_29 FQX2S + PLACED ( 141300 3240  ) FS ;
###savedef - EROM_ROMBIST_MISR_R_REG_28 FQX2S + PLACED ( 124920 3240  ) S ;
###savedef - EROM_ROMBIST_MISR_R_REG_27 FQX2S + PLACED ( 108540 3240  ) S ;
###savedef - EROM_ROMBIST_MISR_R_REG_26 FQX2S + PLACED ( 107280 0     ) N ;
###savedef - EROM_ROMBIST_MISR_R_REG_25 FQX2S + PLACED ( 99990  3240  ) FS ;
###savedef - EROM_ROMBIST_MISR_R_REG_24 FQX2S + PLACED ( 102600 3240  ) FS ;
###savedef - EROM_ROMBIST_MISR_R_REG_23 FQX2S + PLACED ( 131040 0     ) N ;
```

ClockRoute2

```
###savedef - EROM_ROMBIST_MISR_R_REG_22 FQX2S + PLACED ( 135180 3240 ) FS ;
###savedef - EROM_ROMBIST_MISR_R_REG_21 FQX2S + PLACED ( 137160 3240 ) FS ;
###savedef - EROM_ROMBIST_MISR_R_REG_20 FQX2S + PLACED ( 45720 12960 ) FN ;
###savedef - EROM_ROMBIST_MISR_R_REG_2 FQX2S + PLACED ( 50580 12960 ) FN ;
###savedef - EROM_ROMBIST_MISR_R_REG_19 FQX2S + PLACED ( 192600 12960 ) N ;
###savedef - EROM_ROMBIST_MISR_R_REG_18 FQX2S + PLACED ( 198000 9720 ) FS ;
###savedef - EROM_ROMBIST_MISR_R_REG_17 FQX2S + PLACED ( 187200 12960 ) N ;
###savedef - EROM_ROMBIST_MISR_R_REG_167 FQX2S + PLACED ( 223020 12960 ) FN ;
###savedef - EROM_ROMBIST_MISR_R_REG_166 FQX2S + PLACED ( 223920 9720 ) S ;
###savedef - EROM_ROMBIST_MISR_R_REG_165 FQX2S + PLACED ( 225720 3240 ) S ;
###savedef - EROM_ROMBIST_MISR_R_REG_164 FQX2S + PLACED ( 236880 3240 ) S ;
###savedef - EROM_ROMBIST_MISR_R_REG_163 FQX2S + PLACED ( 237240 6480 ) FN ;
###savedef - EROM_ROMBIST_MISR_R_REG_162 FQX2S + PLACED ( 243180 3240 ) FS ;
###savedef - EROM_ROMBIST_MISR_R_REG_161 FQX2S + PLACED ( 239400 0 ) FN ;
###savedef - EROM_ROMBIST_MISR_R_REG_160 FQX2S + PLACED ( 246780 0 ) N ;
###savedef - EROM_ROMBIST_MISR_R_REG_16 FQX2S + PLACED ( 181260 9720 ) S ;
###savedef - EROM_ROMBIST_MISR_R_REG_159 FQX2S + PLACED ( 248400 12960 ) N ;
###savedef - EROM_ROMBIST_MISR_R_REG_158 FQX2S + PLACED ( 242100 12960 ) N ;
###savedef - EROM_ROMBIST_MISR_R_REG_157 FQX2S + PLACED ( 236880 9720 ) S ;
###savedef - EROM_ROMBIST_MISR_R_REG_156 FQX2S + PLACED ( 243540 9720 ) S ;
###savedef - EROM_ROMBIST_MISR_R_REG_155 FQX2S + PLACED ( 248220 3240 ) S ;
###savedef - EROM_ROMBIST_MISR_R_REG_154 FQX2S + PLACED ( 245340 6480 ) FN ;
###savedef - EROM_ROMBIST_MISR_R_REG_153 FQX2S + PLACED ( 251640 9720 ) S ;
###savedef - EROM_ROMBIST_MISR_R_REG_152 FQX2S + PLACED ( 252000 12960 ) FN ;
###savedef - EROM_ROMBIST_MISR_R_REG_151 FQX2S + PLACED ( 257940 9720 ) S ;
###savedef - EROM_ROMBIST_MISR_R_REG_150 FQX2S + PLACED ( 258300 3240 ) S ;
###savedef - EROM_ROMBIST_MISR_R_REG_15 FQX2S + PLACED ( 170460 9720 ) S ;
###savedef - EROM_ROMBIST_MISR_R_REG_149 FQX2S + PLACED ( 231660 3240 ) FN ;
###savedef - EROM_ROMBIST_MISR_R_REG_148 FQX2S + PLACED ( 233820 12960 ) FN ;
###savedef - EROM_ROMBIST_MISR_R_REG_147 FQX2S + PLACED ( 229860 12960 ) FN ;
###savedef - EROM_ROMBIST_MISR_R_REG_146 FQX2S + PLACED ( 406980 12960 ) N ;
###savedef - EROM_ROMBIST_MISR_R_REG_145 FQX2S + PLACED ( 284400 9720 ) S ;
###savedef - EROM_ROMBIST_MISR_R_REG_144 FQX2S + PLACED ( 279180 6480 ) FN ;
###savedef - EROM_ROMBIST_MISR_R_REG_143 FQX2S + PLACED ( 258660 0 ) FN ;
###savedef - EROM_ROMBIST_MISR_R_REG_142 FQX2S + PLACED ( 253980 3240 ) S ;
###savedef - EROM_ROMBIST_MISR_R_REG_141 FQX2S + PLACED ( 250740 3240 ) S ;
###savedef - EROM_ROMBIST_MISR_R_REG_140 FQX2S + PLACED ( 253620 0 ) N ;
###savedef - EROM_ROMBIST_MISR_R_REG_14 FQX2S + PLACED ( 1677580 9720 ) S ;
###savedef - EROM_ROMBIST_MISR_R_REG_139 FQX2S + PLACED ( 228600 0 ) FN ;
###savedef - EROM_ROMBIST_MISR_R_REG_138 FQX2S + PLACED ( 219240 9720 ) S ;
###savedef - EROM_ROMBIST_MISR_R_REG_137 FQX2S + PLACED ( 213120 12960 ) FN ;
###savedef - EROM_ROMBIST_MISR_R_REG_136 FQX2S + PLACED ( 216360 9720 ) S ;
###savedef - EROM_ROMBIST_MISR_R_REG_135 FQX2S + PLACED ( 228600 6480 ) N ;
###savedef - EROM_ROMBIST_MISR_R_REG_134 FQX2S + PLACED ( 210060 12960 ) S ;
###savedef - EROM_ROMBIST_MISR_R_REG_133 FQX2S + PLACED ( 211320 9720 ) S ;
###savedef - EROM_ROMBIST_MISR_R_REG_132 FQX2S + PLACED ( 221760 0 ) FN ;
###savedef - EROM_ROMBIST_MISR_R_REG_131 FQX2S + PLACED ( 165600 9720 ) S ;
###savedef - EROM_ROMBIST_MISR_R_REG_130 FQX2S + PLACED ( 175140 9720 ) S ;
###savedef - EROM_ROMBIST_MISR_R_REG_13 FQX2S + PLACED ( 164340 12960 ) FN ;
###savedef - EROM_ROMBIST_MISR_R_REG_129 FQX2S + PLACED ( 178740 12960 ) N ;
###savedef - EROM_ROMBIST_MISR_R_REG_128 FQX2S + PLACED ( 184680 12960 ) N ;
###savedef - EROM_ROMBIST_MISR_R_REG_127 FQX2S + PLACED ( 410940 12960 ) N ;
```

ClockRoute2

```
###savedef - EROM_ROMBIST_MISR_R_REG_126 FQX2S + PLACED ( 415260 9720 ) FS ;
###savedef - EROM_ROMBIST_MISR_R_REG_125 FQX2S + PLACED ( 429660 12960 ) N ;
###savedef - EROM_ROMBIST_MISR_R_REG_124 FQX2S + PLACED ( 432900 6480 ) N ;
###savedef - EROM_ROMBIST_MISR_R_REG_123 FQX2S + PLACED ( 436500 6480 ) N ;
###savedef - EROM_ROMBIST_MISR_R_REG_122 FQX2S + PLACED ( 432360 3240 ) S ;
###savedef - EROM_ROMBIST_MISR_R_REG_121 FQX2S + PLACED ( 435060 0 ) N ;
###savedef - EROM_ROMBIST_MISR_R_REG_120 FQX2S + PLACED ( 443700 0 ) N ;
###savedef - EROM_ROMBIST_MISR_R_REG_12 FQX2S + PLACED ( 159300 12960 ) FN ;
###savedef - EROM_ROMBIST_MISR_R_REG_119 FQX2S + PLACED ( 443700 6480 ) N ;
###savedef - EROM_ROMBIST_MISR_R_REG_118 FQX2S + PLACED ( 440820 6480 ) N ;
###savedef - EROM_ROMBIST_MISR_R_REG_117 FQX2S + PLACED ( 443700 9720 ) FS ;
###savedef - EROM_ROMBIST_MISR_R_REG_116 FQX2S + PLACED ( 443700 12960 ) N ;
###savedef - EROM_ROMBIST_MISR_R_REG_115 FQX2S + PLACED ( 439560 9720 ) FS ;
###savedef - EROM_ROMBIST_MISR_R_REG_114 FQX2S + PLACED ( 435780 12960 ) N ;
###savedef - EROM_ROMBIST_MISR_R_REG_113 FQX2S + PLACED ( 431640 12960 ) FN ;
###savedef - EROM_ROMBIST_MISR_R_REG_112 FQX2S + PLACED ( 350280 12960 ) N ;
###savedef - EROM_ROMBIST_MISR_R_REG_111 FQX2S + PLACED ( 314820 12960 ) FN ;
###savedef - EROM_ROMBIST_MISR_R_REG_110 FQX2S + PLACED ( 279540 12960 ) FN ;
###savedef - EROM_ROMBIST_MISR_R_REG_11 FQX2S + PLACED ( 160560 9720 ) S ;
###savedef - EROM_ROMBIST_MISR_R_REG_109 FQX2S + PLACED ( 279900 9720 ) S ;
###savedef - EROM_ROMBIST_MISR_R_REG_108 FQX2S + PLACED ( 288720 12960 ) N ;
###savedef - EROM_ROMBIST_MISR_R_REG_107 FQX2S + PLACED ( 393660 12960 ) N ;
###savedef - EROM_ROMBIST_MISR_R_REG_106 FQX2S + PLACED ( 399240 9720 ) S ;
###savedef - EROM_ROMBIST_MISR_R_REG_105 FQX2S + PLACED ( 398880 12960 ) N ;
###savedef - EROM_ROMBIST_MISR_R_REG_104 FQX2S + PLACED ( 37980 3240 ) FS ;
###savedef - EROM_ROMBIST_MISR_R_REG_103 FQX2S + PLACED ( 52380 6480 ) N ;
###savedef - EROM_ROMBIST_MISR_R_REG_102 FQX2S + PLACED ( 48240 3240 ) S ;
###savedef - EROM_ROMBIST_MISR_R_REG_101 FQX2S + PLACED ( 51480 3240 ) S ;
###savedef - EROM_ROMBIST_MISR_R_REG_100 FQX2S + PLACED ( 50400 0 ) FN ;
###savedef - EROM_ROMBIST_MISR_R_REG_10 FQX2S + PLACED ( 153180 12960 ) FN ;
###savedef - EROM_ROMBIST_MISR_R_REG_1 FQX2S + PLACED ( 41580 12960 ) FN ;
###savedef - EROM_ROMBIST_MISR_R_REG_0 FQX2S + PLACED ( 44460 9720 ) FS ;
###savedef - EROM_ROMBIST_LOADSIG_R_REG FQX2S + PLACED ( 92880 9720 ) S ;
###savedef - EROM_ROMBIST_HOLDMISR_R_REG FQX2S + PLACED ( 97380 3240 ) S ;
###savedef - EROM_ROMBIST_BITADDR_R_REG_2 FQX2S + PLACED ( 95400 3240 ) FS ;
###savedef - EROM_ROMBIST_BITADDR_R_REG_1 FQX2S + PLACED ( 95220 0 ) N ;
###savedef - EROM_ROMBIST_BITADDR_R_REG_0 FQX2S + PLACED ( 87480 0 ) N ;
###savedef - EROM_ROMBIST_ADD_294_U9 XNOR2X1 + PLACED ( 58860 3240 ) S ;
###savedef - ERMCTL_SUBRETADDR_R_REG_9 FQX2S + PLACED ( 204660 3240 ) S ;
###savedef - ERMCTL_SUBRETADDR_R_REG_8 FQX2S + PLACED ( 152460 3240 ) S ;
###savedef - ERMCTL_SUBRETADDR_R_REG_7 FQX2S + PLACED ( 187020 0 ) N ;
###savedef - ERMCTL_SUBRETADDR_R_REG_6 FQX2S + PLACED ( 187200 3240 ) FS ;
###savedef - ERMCTL_SUBRETADDR_R_REG_5 FQX2S + PLACED ( 195120 6480 ) N ;
###savedef - ERMCTL_SUBRETADDR_R_REG_4 FQX2S + PLACED ( 205200 6480 ) N ;
###savedef - ERMCTL_SUBRETADDR_R_REG_3 FQX2S + PLACED ( 210960 6480 ) N ;
###savedef - ERMCTL_SUBRETADDR_R_REG_2 FQX2S + PLACED ( 155160 3240 ) S ;
###savedef - ERMCTL_SUBRETADDR_R_REG_13 FQX2S + PLACED ( 161460 6480 ) N ;
###savedef - ERMCTL_SUBRETADDR_R_REG_12 FQX2S + PLACED ( 162900 0 ) FN ;
###savedef - ERMCTL_SUBRETADDR_R_REG_11 FQX2S + PLACED ( 202140 12960 ) N ;
###savedef - ERMCTL_SUBRETADDR_R_REG_10 FQX2S + PLACED ( 173340 6480 ) N ;
###savedef - ERMCTL_SUBRETADDR_R_REG_1 FQX2S + PLACED ( 181620 6480 ) N ;
###savedef - ERMCTL_SUBRETADDR_R_REG_0 FQX2S + PLACED ( 189180 9720 ) S ;
```

ClockRoute2

```
###savedef - ERMCTL_STATE_R_REG FQX2S + PLACED ( 293040 0 ) N ;
###savedef - ERMCTL_EMCFETCHADDR_R_REG_9 FQX2S + PLACED ( 199620 3240 ) N ;
###savedef - ERMCTL_EMCFETCHADDR_R_REG_8 FQX2S + PLACED ( 189540 0 ) FN ;
###savedef - ERMCTL_EMCFETCHADDR_R_REG_7 FQX2S + PLACED ( 191340 6480 ) FN ;
###savedef - ERMCTL_EMCFETCHADDR_R_REG_6 FQX2S + PLACED ( 180720 0 ) FN ;
###savedef - ERMCTL_EMCFETCHADDR_R_REG_5 FQX2S + PLACED ( 196560 0 ) N ;
###savedef - ERMCTL_EMCFETCHADDR_R_REG_4 FQX2S + PLACED ( 195660 3240 ) S ;
###savedef - ERMCTL_EMCFETCHADDR_R_REG_3 FQX2S + PLACED ( 209520 3240 ) FS ;
###savedef - ERMCTL_EMCFETCHADDR_R_REG_2 FQX2S + PLACED ( 154620 0 ) FN ;
###savedef - ERMCTL_EMCFETCHADDR_R_REG_13 FQX2S + PLACED ( 165780 0 ) FN ;
###savedef - ERMCTL_EMCFETCHADDR_R_REG_12 FQX2S + PLACED ( 174240 3240 ) S ;
###savedef - ERMCTL_EMCFETCHADDR_R_REG_11 FQX2S + PLACED ( 203580 9720 ) S ;
###savedef - ERMCTL_EMCFETCHADDR_R_REG_10 FQX2S + PLACED ( 174060 0 ) FN ;
###savedef - ERMCTL_EMCFETCHADDR_R_REG_1 FQX2S + PLACED ( 189180 6480 ) N ;
###savedef - ERMCTL_EMCFETCHADDR_R_REG_0 FQX2S + PLACED ( 199800 6480 ) N ;
###savedef - TCK1 DEFCONM3 ;
###savedef - TCK2_ DEFCONM3 ;
###savedef - BUF_Box2_PH1_0_0 L3CKBUF + FIXED ( 200000 0 ) N ;
###savedef - BUF_Box2_PH1_1_0 L3CKBUF + FIXED ( 200000 3240 ) S ;
###savedef - BUF_Box2_PH1_3_0 L3CKBUF + FIXED ( 200000 9720 ) N ;
###savedef - BUF_Box2_PH1_4_0 L3CKBUF + FIXED ( 200000 12960 ) N ;
###savedef - BUF_Box3_PH1_0_0 L3CKBUF + FIXED ( 370000 0 ) N ;
###savedef - BUF_Box1_PH1_0_0 L3CKBUF + FIXED ( 72000 0 ) N ;
###savedef - BUF_Box1_PH1_2_0 L3CKBUF + FIXED ( 72000 6480 ) N ;
###savedef - BUF_Box1_PH1_2_1 L3CKBUF + FIXED ( 73800 6480 ) N ;
###savedef - BUF_Box1_PH1_3_0 L3CKBUF + FIXED ( 72000 9720 ) S ;
###savedef - BUF_Box1_PH1_4_0 L3CKBUF + FIXED ( 72000 12960 ) N ;
###savedef - BUF_PH1_SP_127_0 L3CKBUF + FIXED ( 23000 0 ) N ;
###savedef - L2BUF_l2box1_PH1_2_1 L3CKBUF + FIXED ( 160000 6480 ) N ;
###savedef - L2BUF_l2box1_PH1_2_2 L3CKBUF + FIXED ( 161800 6480 ) N ;
###savedef - L2BUF_l2box1_PH1_2_3 L3CKBUF + FIXED ( 163600 6480 ) N ;
###savedef - L2BUF_l2box1_PH1_2_4 L3CKBUF + FIXED ( 165400 6480 ) N ;
###savedef - BUF_Box1_SC1_0_1 L3CKBUF + FIXED ( 73800 0 ) N ;
###savedef - L2BUF_l2box1_SC1_2_1 L3CKBUF + FIXED ( 167200 6480 ) N ;
###savedef END COMPONENTS
###savedef SPECIALNETS 2 ;
###savedef - VSS ( * VSS ) + USE GROUND ;
###savedef - VDD ( * VDD ) + USE POWER ;
###savedef END SPECIALNETS
###savedef NETS 1941 ;
###savedef - TCK1 ( TCK1 IO ) ;
###savedef - TCK2_ ( TCK2_ IO ) ;
###savedef - SC1_1 ( SC1_1 IO ) ;
###savedef - SC1_2 ( L2BUF_l2box1_SC1_2_1 CKI ) ;
###savedef ( L2BUF_l2box1_SC1_2_1 CKO )
###savedef - BUF_Box1_SC1_0_1 CKI ) ;
###savedef - SC1
```

ClockRoute2

```
###savedef ( BUF_Box1_SC1_0_1 CKO )       ( EROM_ROMBIST_WORDADDR_R_REG_8 SC1 )   ( EROM_ROMBIST_WORDADDR_R_REG_7 SC1 )
###savedef )  ( EROM_ROMBIST_WORDADDR_R_REG_6 SC1 )  ( EROM_ROMBIST_WORDADDR_R_REG_5 SC1 )  (
###savedef EROM_ROMBIST_WORDADDR_R_REG_4 SC1 )  ( EROM_ROMBIST_WORDADDR_R_REG_3 SC1 )  (
###savedef EROM_ROMBIST_WORDADDR_R_REG_2 SC1 )  ( EROM_ROMBIST_WORDADDR_R_REG_1 SC1 )  (
###savedef EROM_ROMBIST_WORDADDR_R_REG_0 SC1 )  ( EROM_ROMBIST_WAITSTATE_R_REG SC1 )  ;
###savedef - PH1_1 ( PH1_1 IO ) ;
###savedef ( L2BUF_l2box1_PH1_2_1 CKI )
###savedef ( L2BUF_l2box1_PH1_2_2 CKI )
###savedef ( L2BUF_l2box1_PH1_2_3 CKI )
###savedef ( L2BUF_l2box1_PH1_2_4 CKI )  ;
###savedef - PH1_2
###savedef ( BUF_Box2_PH1_0_0 CKI )
###savedef ( BUF_Box2_PH1_1_0 CKI )
###savedef ( BUF_Box2_PH1_3_0 CKI )
###savedef ( BUF_Box2_PH1_4_0 CKI )
###savedef ( BUF_Box3_PH1_0_0 CKI )
###savedef ( BUF_Box1_PH1_0_0 CKI )
###savedef ( BUF_Box1_PH1_2_0 CKI )
###savedef ( BUF_Box1_PH1_2_1 CKI )
###savedef ( BUF_Box1_PH1_3_0 CKI )
###savedef ( BUF_Box1_PH1_4_0 CKI )
###savedef ( BUF_PH1_SP_127_0 CKI )
###savedef ( L2BUF_l2box1_PH1_2_1 CKO )
###savedef ( L2BUF_l2box1_PH1_2_2 CKO )
###savedef ( L2BUF_l2box1_PH1_2_3 CKO )
###savedef ( L2BUF_l2box1_PH1_2_4 CKO ) ;
###savedef - PH1 ( EROM_ROM CK )                ( EROM_ROMBIST_MISR_R_REG_160 CK )
###savedef ( BUF_Box2_PH1_0_0 CKO )
###savedef ( BUF_Box2_PH1_1_0 CKO )
###savedef ( BUF_Box2_PH1_3_0 CKO )
###savedef ( BUF_Box2_PH1_4_0 CKO )
###savedef ( BUF_Box3_PH1_0_0 CKO )
###savedef ( BUF_Box1_PH1_0_0 CKO )
###savedef ( BUF_Box1_PH1_2_0 CKO )
###savedef ( BUF_Box1_PH1_2_1 CKO )
###savedef ( BUF_Box1_PH1_3_0 CKO )
###savedef ( BUF_Box1_PH1_4_0 CKO )
###savedef ( BUF_PH1_SP_127_0 CKO )             ( EROM_ROMBIST_MISR_R_REG_161 CK )   ( EROM_ROMBIST_MISR_R_REG_162 CK )
###savedef EROM_ROMBIST_MISR_R_REG_163 CK )     ( EROM_ROMBIST_MISR_R_REG_164 CK )   (
###savedef EROM_ROMBIST_MISR_R_REG_165 CK )     ( EROM_ROMBIST_MISR_R_REG_166 CK )   (
###savedef EROM_ROMBIST_MISR_R_REG_167 CK )     ( EROM_ROMBIST_MISR_R_REG_29 CK )    (
###savedef EROM_ROMBIST_MISR_R_REG_28 CK )      ( EROM_ROMBIST_MISR_R_REG_27 CK )    (
###savedef EROM_ROMBIST_MISR_R_REG_26 CK )      ( EROM_ROMBIST_MISR_R_REG_25 CK )    (
###savedef EROM_ROMBIST_MISR_R_REG_24 CK )      ( EROM_ROMBIST_MISR_R_REG_23 CK )    (
###savedef EROM_ROMBIST_MISR_R_REG_22 CK )      ( EROM_ROMBIST_MISR_R_REG_21 CK )    (
###savedef EROM_ROMBIST_MISR_R_REG_20 CK )      ( EROM_ROMBIST_OBSERVROMEN_R_REG CK )
###savedef EROM_ROMBIST_LOADSIG_R_REG CK )      ( EROM_ROMBIST_MODEREG_R_REG_0 CK )  (
###savedef EROM_ROMBIST_MODEREG_R_REG_1 CK )    ( EROM_ROMBIST_MODEREG_R_REG_2 CK )  (
###savedef EROM_ROMBIST_MISR_R_REG_130 CK )     ( EROM_ROMBIST_MISR_R_REG_131 CK )   (
###savedef EROM_ROMBIST_MISR_R_REG_132 CK )     ( EROM_ROMBIST_MISR_R_REG_133 CK )   (
###savedef EROM_ROMBIST_MISR_R_REG_134 CK )     ( EROM_ROMBIST_MISR_R_REG_135 CK )   (
```

FIG. 58

ClockRoute2

```
###savedef EROM_ROMBIST_MISR_R_REG_136 CK )  ( EROM_ROMBIST_MISR_R_REG_137 CK )
###savedef EROM_ROMBIST_MISR_R_REG_138 CK )  ( EROM_ROMBIST_MISR_R_REG_139 CK )
###savedef EROM_ROMBIST_BITADDR_R_REG_2 CK )  ( EROM_ROMBIST_BITADDR_R_REG_1 CK )
###savedef EROM_ROMBIST_BITADDR_R_REG_0 CK )  ( EROM_ROMBIST_MISR_R_REG_59 CK )
###savedef EROM_ROMBIST_MISR_R_REG_58 CK )  EROM_ROMBIST_MISR_R_REG_57 CK )
###savedef EROM_ROMBIST_MISR_R_REG_56 CK )  EROM_ROMBIST_MISR_R_REG_55 CK )
###savedef EROM_ROMBIST_MISR_R_REG_54 CK )  EROM_ROMBIST_MISR_R_REG_53 CK )
###savedef EROM_ROMBIST_MISR_R_REG_52 CK )  EROM_ROMBIST_MISR_R_REG_51 CK )
###savedef EROM_ROMBIST_MISR_R_REG_50 CK )  EROM_ROMBIST_OBSERVBA_R_REG_2 CK )
###savedef EROM_ROMBIST_OBSERVBA_R_REG_1 CK )  ( EROM_ROMBIST_OBSERVBA_R_REG_0 CK )
###savedef EROM_ROMBIST_MISR_R_REG_100 CK )  EROM_ROMBIST_MISR_R_REG_101 CK )
###savedef EROM_ROMBIST_MISR_R_REG_102 CK )  EROM_ROMBIST_MISR_R_REG_103 CK )
###savedef EROM_ROMBIST_MISR_R_REG_104 CK )  EROM_ROMBIST_MISR_R_REG_105 CK )
###savedef EROM_ROMBIST_MISR_R_REG_106 CK )  EROM_ROMBIST_MISR_R_REG_107 CK )
###savedef EROM_ROMBIST_MISR_R_REG_108 CK )  EROM_ROMBIST_MISR_R_REG_109 CK )
###savedef EROM_ROMBIST_MISR_R_REG_89 CK )  EROM_ROMBIST_MISR_R_REG_88 CK )
###savedef EROM_ROMBIST_MISR_R_REG_87 CK )  EROM_ROMBIST_MISR_R_REG_86 CK )
###savedef EROM_ROMBIST_MISR_R_REG_85 CK )  EROM_ROMBIST_MISR_R_REG_84 CK )
###savedef EROM_ROMBIST_MISR_R_REG_83 CK )  EROM_ROMBIST_MISR_R_REG_82 CK )
###savedef EROM_ROMBIST_MISR_R_REG_81 CK )  EROM_ROMBIST_MISR_R_REG_80 CK )
###savedef EROM_ROMBIST_HOLDMISR_R_REG CK )  EROM_ROMBIST_MISR_R_REG_150 CK )
###savedef EROM_ROMBIST_MISR_R_REG_151 CK )  EROM_ROMBIST_MISR_R_REG_152 CK )
###savedef EROM_ROMBIST_MISR_R_REG_153 CK )  EROM_ROMBIST_MISR_R_REG_154 CK )
###savedef EROM_ROMBIST_MISR_R_REG_155 CK )  EROM_ROMBIST_MISR_R_REG_156 CK )
###savedef EROM_ROMBIST_MISR_R_REG_157 CK )  EROM_ROMBIST_MISR_R_REG_158 CK )
###savedef EROM_ROMBIST_MISR_R_REG_159 CK )  EROM_ROMBIST_MISR_R_REG_39 CK )
###savedef EROM_ROMBIST_MISR_R_REG_38 CK )  EROM_ROMBIST_MISR_R_REG_37 CK )
###savedef EROM_ROMBIST_MISR_R_REG_36 CK )  EROM_ROMBIST_MISR_R_REG_35 CK )
###savedef EROM_ROMBIST_MISR_R_REG_34 CK )  EROM_ROMBIST_MISR_R_REG_33 CK )
###savedef EROM_ROMBIST_MISR_R_REG_32 CK )  EROM_ROMBIST_MISR_R_REG_31 CK )
###savedef EROM_ROMBIST_MISR_R_REG_30 CK )  EROM_ROMBIST_MISR_R_REG_120 CK )
###savedef EROM_ROMBIST_MISR_R_REG_121 CK )  EROM_ROMBIST_MISR_R_REG_122 CK )
###savedef EROM_ROMBIST_MISR_R_REG_123 CK )  EROM_ROMBIST_MISR_R_REG_124 CK )
###savedef EROM_ROMBIST_MISR_R_REG_125 CK )  EROM_ROMBIST_MISR_R_REG_126 CK )
###savedef EROM_ROMBIST_MISR_R_REG_127 CK )  EROM_ROMBIST_MISR_R_REG_128 CK )
###savedef EROM_ROMBIST_MISR_R_REG_129 CK )  EROM_ROMBIST_MISR_R_REG_69 CK )
###savedef EROM_ROMBIST_MISR_R_REG_68 CK )  EROM_ROMBIST_MISR_R_REG_67 CK )
###savedef EROM_ROMBIST_MISR_R_REG_66 CK )  EROM_ROMBIST_MISR_R_REG_65 CK )
###savedef EROM_ROMBIST_MISR_R_REG_64 CK )  EROM_ROMBIST_MISR_R_REG_63 CK )
###savedef EROM_ROMBIST_MISR_R_REG_62 CK )  EROM_ROMBIST_MISR_R_REG_61 CK )
###savedef EROM_ROMBIST_MISR_R_REG_60 CK )  EROM_ROMBIST_MISR_R_REG_19 CK )
###savedef EROM_ROMBIST_MISR_R_REG_18 CK )  EROM_ROMBIST_MISR_R_REG_17 CK )
###savedef EROM_ROMBIST_MISR_R_REG_16 CK )  EROM_ROMBIST_MISR_R_REG_15 CK )
###savedef EROM_ROMBIST_MISR_R_REG_14 CK )  EROM_ROMBIST_MISR_R_REG_13 CK )
###savedef EROM_ROMBIST_MISR_R_REG_12 CK )  EROM_ROMBIST_MISR_R_REG_11 CK )
###savedef EROM_ROMBIST_MISR_R_REG_10 CK )  EROM_ROMBIST_MISR_R_REG_99 CK )
###savedef EROM_ROMBIST_MISR_R_REG_98 CK )  EROM_ROMBIST_MISR_R_REG_97 CK )
###savedef EROM_ROMBIST_MISR_R_REG_96 CK )  EROM_ROMBIST_MISR_R_REG_95 CK )
###savedef EROM_ROMBIST_MISR_R_REG_94 CK )  EROM_ROMBIST_MISR_R_REG_93 CK )
###savedef EROM_ROMBIST_MISR_R_REG_92 CK )  EROM_ROMBIST_MISR_R_REG_91 CK )
###savedef EROM_ROMBIST_MISR_R_REG_90 CK )  EROM_ROMBIST_MISR_R_REG_140 CK )
###savedef EROM_ROMBIST_MISR_R_REG_141 CK )  ( EROM_ROMBIST_MISR_R_REG_142 CK )
```

Fig. 60

ClockRoute2

```
###savedef EROM_ROMBIST_MISR_R_REG_143 CK ) ( EROM_ROMBIST_MISR_R_REG_144 CK ) (
###savedef EROM_ROMBIST_MISR_R_REG_145 CK ) ( EROM_ROMBIST_MISR_R_REG_146 CK ) (
###savedef EROM_ROMBIST_MISR_R_REG_147 CK ) ( EROM_ROMBIST_MISR_R_REG_148 CK ) (
###savedef EROM_ROMBIST_MISR_R_REG_149 CK ) ( EROM_ROMBIST_TESTMODE_R_REG  CK ) (
###savedef EROM_ROMBIST_MISR_R_REG_49  CK ) ( EROM_ROMBIST_MISR_R_REG_48  CK ) (
###savedef EROM_ROMBIST_MISR_R_REG_47  CK ) ( EROM_ROMBIST_MISR_R_REG_46  CK ) (
###savedef EROM_ROMBIST_MISR_R_REG_45  CK ) ( EROM_ROMBIST_MISR_R_REG_44  CK ) (
###savedef EROM_ROMBIST_MISR_R_REG_43  CK ) ( EROM_ROMBIST_MISR_R_REG_42  CK ) (
###savedef EROM_ROMBIST_MISR_R_REG_41  CK ) ( EROM_ROMBIST_MISR_R_REG_40  CK ) (
###savedef EROM_ROMBIST_MISR_R_REG_110 CK ) ( EROM_ROMBIST_MISR_R_REG_111 CK ) (
###savedef EROM_ROMBIST_MISR_R_REG_112 CK ) ( EROM_ROMBIST_MISR_R_REG_113 CK ) (
###savedef EROM_ROMBIST_MISR_R_REG_114 CK ) ( EROM_ROMBIST_MISR_R_REG_115 CK ) (
###savedef EROM_ROMBIST_MISR_R_REG_116 CK ) ( EROM_ROMBIST_MISR_R_REG_117 CK ) (
###savedef EROM_ROMBIST_MISR_R_REG_118 CK ) ( EROM_ROMBIST_MISR_R_REG_119 CK ) (
###savedef EROM_ROMBIST_MISR_R_REG_0   CK ) ( EROM_ROMBIST_MISR_R_REG_1   CK ) (
###savedef EROM_ROMBIST_MISR_R_REG_2   CK ) ( EROM_ROMBIST_MISR_R_REG_3   CK ) (
###savedef EROM_ROMBIST_MISR_R_REG_4   CK ) ( EROM_ROMBIST_WAITSTATE_R_REG CK ) (
###savedef EROM_ROMBIST_MISR_R_REG_5   CK ) ( EROM_ROMBIST_MISR_R_REG_6   CK ) (
###savedef EROM_ROMBIST_MISR_R_REG_7   CK ) ( EROM_ROMBIST_MISR_R_REG_8   CK ) (
###savedef EROM_ROMBIST_MISR_R_REG_9   CK ) ( EROM_ROMBIST_OBSERVWA_R_REG_0 CK ) (
###savedef EROM_ROMBIST_OBSERVWA_R_REG_1 CK ) ( EROM_ROMBIST_OBSERVWA_R_REG_2 CK ) (
###savedef EROM_ROMBIST_OBSERVWA_R_REG_3 CK ) ( EROM_ROMBIST_OBSERVWA_R_REG_4 CK ) (
###savedef EROM_ROMBIST_OBSERVWA_R_REG_5 CK ) ( EROM_ROMBIST_OBSERVWA_R_REG_6 CK ) (
###savedef EROM_ROMBIST_OBSERVWA_R_REG_7 CK ) ( EROM_ROMBIST_OBSERVWA_R_REG_8 CK ) (
###savedef EROM_ROMBIST_WORDADDR_R_REG_0 CK ) ( EROM_ROMBIST_WORDADDR_R_REG_1 CK ) (
###savedef EROM_ROMBIST_WORDADDR_R_REG_2 CK ) ( EROM_ROMBIST_WORDADDR_R_REG_3 CK ) (
###savedef EROM_ROMBIST_WORDADDR_R_REG_4 CK ) ( EROM_ROMBIST_WORDADDR_R_REG_5 CK ) (
###savedef EROM_ROMBIST_WORDADDR_R_REG_6 CK ) ( EROM_ROMBIST_WORDADDR_R_REG_7 CK ) (
###savedef EROM_ROMBIST_WORDADDR_R_REG_8 CK ) ( EROM_ROMBIST_MISR_R_REG_79  CK ) (
###savedef EROM_ROMBIST_MISR_R_REG_78  CK ) ( EROM_ROMBIST_MISR_R_REG_77  CK ) (
###savedef EROM_ROMBIST_MISR_R_REG_76  CK ) ( EROM_ROMBIST_MISR_R_REG_75  CK ) (
###savedef EROM_ROMBIST_MISR_R_REG_74  CK ) ( EROM_ROMBIST_MISR_R_REG_73  CK ) (
###savedef EROM_ROMBIST_MISR_R_REG_72  CK ) ( EROM_ROMBIST_MISR_R_REG_71  CK ) (
###savedef EROM_ROMBIST_MISR_R_REG_70  CK ) ( EROM_ROMBIST_MISR_R_REG_13  CK ) ( ERMCTL_EMCFETCHADDR_R_REG_12 CK ) (
###savedef ERMCTL_EMCFETCHADDR_R_REG_13 CK ) ( ERMCTL_EMCFETCHADDR_R_REG_11 CK ) ( ERMCTL_EMCFETCHADDR_R_REG_10 CK )
###savedef ERMCTL_SUBRETADDR_R_REG_9 CK ) ( ERMCTL_SUBRETADDR_R_REG_8 CK ) (
###savedef ERMCTL_SUBRETADDR_R_REG_7 CK ) ( ERMCTL_SUBRETADDR_R_REG_6 CK ) (
###savedef ERMCTL_SUBRETADDR_R_REG_5 CK ) ( ERMCTL_SUBRETADDR_R_REG_4 CK ) (
###savedef ERMCTL_SUBRETADDR_R_REG_3 CK ) ( ERMCTL_SUBRETADDR_R_REG_2 CK ) (
###savedef ERMCTL_SUBRETADDR_R_REG_1 CK ) ( ERMCTL_SUBRETADDR_R_REG_0 CK ) (
###savedef ERMCTL_SUBRETADDR_R_REG_13 CK ) ( ERMCTL_SUBRETADDR_R_REG_12 CK ) (
###savedef ERMCTL_SUBRETADDR_R_REG_11 CK ) ( ERMCTL_SUBRETADDR_R_REG_10 CK ) (
###savedef ERMCTL_EMCFETCHADDR_R_REG_0 CK ) ( ERMCTL_EMCFETCHADDR_R_REG_1 CK ) (
###savedef ERMCTL_EMCFETCHADDR_R_REG_2 CK ) ( ERMCTL_STATE_R_REG CK ) (
###savedef ERMCTL_EMCFETCHADDR_R_REG_3 CK ) ( ERMCTL_EMCFETCHADDR_R_REG_4 CK )
###savedef ERMCTL_EMCFETCHADDR_R_REG_5 CK ) ( ERMCTL_EMCFETCHADDR_R_REG_6 CK )
###savedef ERMCTL_EMCFETCHADDR_R_REG_7 CK ) ( ERMCTL_EMCFETCHADDR_R_REG_8 CK )
###savedef ERMCTL_EMCFETCHADDR_R_REG_9 CK ) ;
###savedef - EDR_N4181 ( EDR_U1243 Z ) ( EDR_U1241 A ) ;
###savedef END NETS
###savedef END DESIGN
```

ClockRoute2

Appendix F

```
###savewire add wire nodrc short noviasat nosnap
###savewire special net SC2_2 1 M4 width 360 ( 0 5175 ) ( 446580 5175 ) ;
###savewire add wire nodrc short noviasat nosnap
###savewire special net SC1_2 1 M4 width 360 ( 0 4185 ) ( 446580 4185 ) ;
###savewire add wire nodrc short noviasat nosnap
###savewire special net SC2_1 1 M4 width 360 ( 0 1710 ) ( 446580 1710 ) ;
###savewire add wire nodrc short noviasat nosnap
###savewire special net SC1_1 1 M4 width 360 ( 0 720 ) ( 446580 720 ) ;
###savewire add wire nodrc short noviasat nosnap
###savewire special net PH1_2 1 M4 width 450 ( 0 4680 ) ( 446580 4680 ) ;
###savewire add wire nodrc short noviasat nosnap
###savewire special net PH1_1 1 M4 width 450 ( 0 1215 ) ( 446580 1215 ) ;
###savewire add wire nodrc short noviasat special net PH1 1 M4 Y 0 14850 ) ( 150000 14850 ) ;
###savewire add wire nodrc short noviasat special net PH1 1 M4 ( 153540 14850 ) ( 288360 14850 ) ;
###savewire add wire nodrc short noviasat special net PH1 1 M4 ( 300000 14850 ) ( 446580 14850 ) ;
###savewire add wire nodrc short noviasat special net PH1 1 M4 ( 71800 7830 ) ( 75060 7830 ) ;
###savewire add wire nodrc short noviasat special net PH1_2 1 M4 ( 71800 14490 ) ( 73260 14490 ) ;
###savewire add wire nodrc short noviasat special net PH1_2 1 M4 ( 200540 14490 ) ( 201260 14490 ) ;
###savewire add wire nodrc short noviasat special net PH1 1 M4 ( 0 11610 ) ( 148140 11610 ) ;
###savewire add wire nodrc short noviasat special net PH1 1 M4 ( 153540 11610 ) ( 284040 11610 ) ;
###savewire add wire nodrc short noviasat special net PH1 1 M4 ( 300000 11610 ) ( 446580 11610 ) ;
###savewire add wire nodrc short noviasat special net PH1_2 1 M4 ( 71800 11250 ) ( 73260 11250 ) ;
###savewire add wire nodrc short noviasat special net PH1_2 1 M4 ( 200540 11250 ) ( 201260 11250 ) ;
###savewire add wire nodrc short noviasat special net SC1 1 M4 ( 55980 6210 ) ( 83340 6210 ) ;
###savewire add wire nodrc short noviasat special net PH1 1 M4 ( 152820 6210 ) ( 257940 6210 ) ;
###savewire add wire nodrc short noviasat special net PH1 1 M4 ( 390000 6210 ) ( 432000 6210 ) ;
###savewire add wire nodrc short noviasat special net SC1_2 1 M4 ( 70800 270 ) ( 75060 270 ) ;
###savewire add wire nodrc short noviasat special net PH1_2 1 M4 ( 71800 90 ) ( 73260 90 ) ;
###savewire add wire nodrc short noviasat special net PH1_2 1 M4 ( 200540 90 ) ( 201260 90 ) ;
###savewire add wire nodrc short noviasat special net PH1_2 1 M4 ( 360100 90 ) ( 371260 90 ) ;
###savewire add wire nodrc short noviasat special net SC1 1 M4 ( 56520 8550 ) ( 78860 8550 ) ;
###savewire add wire nodrc short noviasat special net PH1 1 M4 ( 72360 8370 ) ( 77860 8370 ) ;
###savewire add wire nodrc short noviasat special net PH1 1 M4 ( 156600 8370 ) ( 278820 8370 ) ;
###savewire add wire nodrc short noviasat special net PH1 1 M4 ( 300000 8370 ) ( 446580 8370 ) ;
###savewire add wire nodrc short noviasat special net PH1_2 1 M4 ( 71800 8010 ) ( 73260 8010 ) ;
###savewire add wire nodrc short noviasat special net SC1 1 M4 ( 74160 2430 ) ( 78860 2430 ) ;
###savewire add wire nodrc short noviasat special net PH1_2 1 M4 ( 200260 3330 ) ( 201260 3330 ) ;
###savewire add wire nodrc short noviasat special net PH1 1 M4 ( 72360 2970 ) ( 77860 2970 ) ;
###savewire add wire nodrc short noviasat special net PH1 1 M4 ( 151200 2970 ) ( 292680 2970 ) ;
###savewire add wire nodrc short noviasat special net PH1 1 M4 ( 370360 2970 ) ( 443340 2970 ) ;
###savewire add wire nodrc short noviasat special net SC1 1 M4 ( 67680 11790 ) ( 79020 11790 ) ;
###savewire add wire nodrc short noviasat special net OUTSIDEBOX 1 M3 ( 20000 0 ) ( 20000 9720 ) ;
###savewire add wire nodrc short noviasat special net INBOX1 1 M3 ( 20100 0 ) ( 20100 9720 ) ;
###savewire add wire nodrc short viasat special net INEROMBOX 1 M3 ( 20200 0 ) ( 20200 9720 ) ;
```

ClockRoute2

```
###savever module HEDRM(
###savever    // Inputs;
###savever    IC_Op_I,
###savever    IC_OpV_I,
###savever    IC_ERET_I,
###savever    DEC_FmReg_I,
```

FIG. 62

ClockRoute2

```
###saver    DEC_EmRegm_I,
###saver    DEC_EmDSz_I,
###saver    DEC_EmASz_I,
###saver    DEC_EmOprSeg_I,
###saver    DEC_EmLock_I,
###saver    DEC_ExtEmc_I,
###saver    RUX_B_I,
###saver    RUX_WrSR5_I,
###saver    .RUX_SRWrData_18_I(RUX_SRWrData_I[18]),
###saver    SC_Vec2ROM_I,
###saver    SC_Vec2RAM_I,
###saver    SC_Vec2Dec_I,
###saver    SC_SchedFull_I,
###saver    SC_TermMOVS_I,
###saver    SC_VecAddr_I,
###saver    DEC_Vec2ROM_I,
###saver    DEC_VecAddr_I,
###saver    IO_BISTEn_I,
###saver    IO_Reset_I,
###saver    // Outputs;
###saver    EDR_Op0_O,
###saver    EDR_Op1_O,
###saver    EDR_Op2_O,
###saver    EDR_Op3_O,
###saver    EDR_ERET_O,
###saver    EDR_OpQV_O,
###saver    ERM_DoERET_O,
###saver    ERM_StopIF_O,
###saver    // Clocks;
###saver    Ph1_1
###saver    );
###saver    // Input Declarations;
###saver    input [37:0] IC_Op_I;
###saver    input IC_OpV_I;
###saver    input IC_ERET_I;
###saver    input [2:0] DEC_EmRegm_I;
###saver    input [2:0] DEC_EmRegm_I;
###saver    input DEC_EmDSz_I;
###saver    input DEC_EmASz_I;
###saver    input [2:0] DEC_EmOprSeg_I;
###saver    input DEC_EmLock_I;
###saver    input DEC_ExtEmc_I;
###saver    input RUX_B_I;
###saver    input RUX_WrSR5_I;
###saver    input [19:18] RUX_SRWrData_I;
###saver    input SC_Vec2ROM_I;
###saver    input SC_Vec2RAM_I;
###saver    input SC_Vec2Dec_I;
###saver    input SC_SchedFull_I;
```

ClockRoute2

```
###savever    input SC_TermMOVS_I;
###savever    input ['EmcOpAddrSz] SC_VecAddr_I;
###savever    input DEC_Vec2ROM_I;
###savever    input ['EmcOpAddrSz] DEC_VecAddr_I;
###savever    input IO_BISTEn_I;
###savever    input IO_Reset_I;
###savever
###savever    // Output Declarations;
###savever    output [37:0] EDR_Op0_O;
###savever    output [37:0] EDR_Op1_O;
###savever    output [37:0] EDR_Op2_O;
###savever    output [37:0] EDR_Op3_O;
###savever    output EDR_ERET_O;
###savever    output EDR_OpV_O;
###savever    output ERM_DoERET_O;
###savever    output ERM_StopIF_O;
###savever
###savever    // Clock Declaration;
###savever    input Ph1_I;
###savever
###savever    //- dummyfilter
###savever
###savever    // Wire Declaration;
###savever    wire ['EmcOpAddrSz] EmcAddr_W;
###savever    wire ['EmcOpActionSz] EmcAction_W;
###savever    wire [13:2] ERM_FetchAddr_W;
###savever    wire ERM_ROMEn_W;
###savever    wire [37:0] Op0_W;
###savever    wire [37:0] Op1_W;
###savever    wire [37:0] Op2_W;
###savever    wire [37:0] Op3_W;
###savever    wire [1:0] EmcFetchAddr_W;
###savever    wire ERET_W;
###savever    wire ERM_RTM_W;
###savever
###savever    // Instantiate EDR;
###savever    HEDR EDR (
###savever      // Inputs;
###savever      .IC_Op_I(IC_Op_I),
###savever      .IC_OpV_I(IC_OpV_I),
###savever      .IC_ERET_I(IC_ERET_I),
###savever      .ERM_Op0_I(Op0_W),
###savever      .ERM_Op1_I(Op1_W),
###savever      .ERM_Op2_I(Op2_W),
###savever      .ERM_Op3_I(Op3_W),
###savever      .ERM_EmcFetchAddr_I(EmcFetchAddr_W),
###savever      .ERM_ERET_I(ERET_W),
###savever      .DEC_EmReg_I(DEC_EmReg_I),
###savever      .DEC_EmRegm_I(DEC_EmRegm_I),
###savever      .DEC_EmDSz_I(DEC_EmDSz_I),
###savever      .DEC_EmASz_I(DEC_EmASz_I),
###savever      .DEC_EmOprSeg_I(DEC_EmOprSeg_I),
```

ClockRoute2

```
###saveever     .DEC_EmLock_I(DEC_EmLock_I),
###saveever     .DEC_ExtEmc_I(DEC_ExtEmc_I),
###saveever     .RUX_B_I(RUX_B_I),
###saveever
###saveever     // Outputs:
###saveever     .EDR_Op0_O(EDR_Op0_O),
###saveever     .EDR_Op1_O(EDR_Op1_O),
###saveever     .EDR_Op2_O(EDR_Op2_O),
###saveever     .EDR_Op3_O(EDR_Op3_O),
###saveever     .EDR_ERET_O(EDR_ERET_O),
###saveever     .EDR_OpQV_O(EDR_OpQV_O)
###saveever     );
###saveever
###saveever     // Instantiate ERM Control:
###saveever     HERMCtl ERMCtl (
###saveever     // Inputs:
###saveever     .ERM_Op3_37to30_I(Op3_W[37:30]),
###saveever     .ERM_Op3_13to0_I(Op3_W[13:0]),
###saveever     .ERM_Addr_I(EmcAddr_W),
###saveever     .ERM_Action_I(EmcAction_W),
###saveever     .SC_Vec2ROM_I(SC_Vec2ROM_I),
###saveever     .SC_Vec2RAM_I(SC_Vec2RAM_I),
###saveever     .SC_Vec2Dec_I(SC_Vec2Dec_I),
###saveever     .SC_SchedFull_I(SC_SchedFull_I),
###saveever     .SC_TermMOVS_I(SC_TermMOVS_I),
###saveever     .SC_VecAddr_I(SC_VecAddr_I),
###saveever     .DEC_Vec2ROM_I(DEC_Vec2ROM_I),
###saveever     .DEC_VecAddr_I(DEC_VecAddr_I),
###saveever     .IO_Reset_I(IO_Reset_I),
###saveever     .RUX_WrSR5_I(RUX_WrSR5_I),
###saveever     .RUX_SRWrData_18_I(RUX_SRWrData_I[18]),
###saveever
###saveever     // Outputs:
###saveever     .ERM_ERET_O(ERET_W),
###saveever     .ERM_FetchAddr_O(ERM_FetchAddr_W),
###saveever     .ERM_ROMEn_O(ERM_ROMEn_W),
###saveever     .ERM_EmcFetchAddr_O(EmcFetchAddr_W),
###saveever     .ERM_DoERET_O(ERM_DoERET_O),
###saveever     .ERM_StopIF_O(ERM_StopIF_O),
###saveever     .ERM_RTM_O(ERM_RTM_W),
###saveever
###saveever     // Clocks:
###saveever     .Clk(Ph1)
###saveever     );
###saveever
###saveever     // Instantiate ROM Wrapper:
###saveever     HEROM EROM (
###saveever     // Inputs:
###saveever     .ERM_FetchAddr_I(ERM_FetchAddr_W),
###saveever     .ERM_ROMEn_I(ERM_ROMEn_W),
###saveever     .ERM_RTM_I(ERM_RTM_W),
```

ClockRoute2

```
###savever          IO_BISTEn_I_(IO_BISTEn_I),
###savever
###savever          // Outputs;
###savever          .ERM_Op0_O(Op0_W),
###savever          .ERM_Op1_O(Op1_W),
###savever          .ERM_Op2_O(Op2_W),
###savever          .ERM_Op3_O(Op3_W),
###savever          .ERM_Addr_O(EmcAddr_W),
###savever          .ERM_Action_O(EmcAction_W),
###savever
###savever          // Clocks;
###savever          .Clk(Ph1)
###savever       );
###savever       l3ckbuf L2BUF_l2box1_PH1_2_1(.CKO(PH1_2),  .CKI(PH1_1));
###savever       l3ckbuf L2BUF_l2box1_PH1_2_2(.CKO(PH1_2),  .CKI(PH1_1));
###savever       l3ckbuf L2BUF_l2box1_PH1_2_3(.CKO(PH1_2),  .CKI(PH1_1));
###savever       l3ckbuf L2BUF_l2box1_PH1_2_4(.CKO(PH1_2),  .CKI(PH1_1));
###savever
###savever       l3ckbuf BUF_Box2_PH1_0_0(.CKO(PH1),  .CKI(PH1_2));
###savever       l3ckbuf BUF_Box2_PH1_1_0(.CKO(PH1),  .CKI(PH1_2));
###savever       l3ckbuf BUF_Box2_PH1_3_0(.CKO(PH1),  .CKI(PH1_2));
###savever       l3ckbuf BUF_Box2_PH1_4_0(.CKO(PH1),  .CKI(PH1_2));
###savever       l3ckbuf BUF_Box3_PH1_0_0(.CKO(PH1),  .CKI(PH1_2));
###savever       l3ckbuf BUF_Box1_PH1_0_0(.CKO(PH1),  .CKI(PH1_2));
###savever       l3ckbuf BUF_Box1_PH1_2_0(.CKO(PH1),  .CKI(PH1_2));
###savever       l3ckbuf BUF_Box1_PH1_2_1(.CKO(PH1),  .CKI(PH1_2));
###savever       l3ckbuf BUF_Box1_PH1_3_0(.CKO(PH1),  .CKI(PH1_2));
###savever       l3ckbuf BUF_Box1_PH1_4_0(.CKO(PH1),  .CKI(PH1_2));
###savever       l3ckbuf BUF_PH1_SP_127_0(.CKO(PH1),  .CKI(PH1_2));
###savever
###savever       l3ckbuf BUF_Box1_SC1_0_1(.CKO(SC1),  .CKI(SC1_2));
###savever
###savever       l3ckbuf L2BUF_l2box1_SC1_2_1(.CKO(SC1_2), .CKI(SC1_1));
###savever
###savever
###savever
###savever
###savever       /*
###savever endmodule
```

ClockRoute2

Appendix H

```
###savelog Control File: test25664.clkctl
###savelog orientation is N
###savelog Effective M4 capacitance 0.000220 pF/um
###savelog Effective M5 capacitance 0.000510 pF/um
###savelog Input Def File: test25664.indef
###savelog PINS count incorrect in DEF file. Expected 244, found 3
###savelog VIAS count incorrect in DEF file. Expected 6, found 1
###savelog COMPONENTS count incorrect in DEF file. Expected 1929, found 237
###savelog NETS count incorrect in DEF file. Expected 1941, found 9
###savelog Skipping Master BUF_MASTER_CLK3
###savelog Skipping Master BUF_MASTER_SC13
###savelog Found 231 devices on clock nets
###savelog
###savelog Process Box2 PH1
###savelog   assign 1 buffer at row 0
###savelog   assign 1 buffer at row 3240
###savelog   assign 1 buffer at row 9720
###savelog   assign 1 buffer at row 12960
###savelog   excess capacitance -0.1833 pF
###savelog   average capacitance 0.6542 pF per buffer
###savelog   maximum distance from buffer to latch 880.4 um
###savelog   total of 4 buffers
###savelog WARNING Box2 contains no devices on net SC1
###savelog Process Box3 PH1
###savelog   assign 1 buffer at row 0
###savelog   excess capacitance 0.0248 pF
###savelog   average capacitance 0.7248 pF per buffer
###savelog   maximum distance from buffer to latch 751.8 um
###savelog   total of 1 buffer
###savelog WARNING Box3 contains no devices on net SC1
###savelog Process Box1 PH1
###savelog   assign 1 buffer at row 0 (without stdcell prewire)
###savelog   WARNING: Need 1 buffer. Allowed 0 at row Y=3240
```

ClockRoute2

```
###savelog  assign 2 buffers at row 6480 (without stdcell prewire)
###savelog  assign 1 buffer at row 9720
###savelog  assign 1 buffer at row 12960
###savelog  excess capacitance 0.2794 pF
###savelog  average capacitance 0.7559 pF per buffer
###savelog  maximum distance from buffer to latch 776.0 um
###savelog  total of 5 buffers
###savelog  Process Box1 SC1
###savelog  assign 1 buffer at row 0 (without stdcell prewire)
###savelog  excess capacitance -2.6459 pF
###savelog  average capacitance 0.1541 pF per buffer
###savelog  maximum distance from buffer to latch 229.8 um
###savelog  total of 1 buffer
###savelog  WARNING Box4 contains no devices on net PH1
###savelog  WARNING Box4 contains no devices on net SC1
###savelog
```

| Box  | Clock | Y     | Cap pF | Bufs | Devices | Wire from | to     |
|------|-------|-------|--------|------|---------|-----------|--------|
| Box2 | PH1   | 0     | 0.4997 | 1    | 16      | 150840    | 293040 |
| Box2 | PH1   | 3240  | 0.4989 | 1    | 16      | 152460    | 258300 |
| Box2 | PH1   | 6480  | 0.4392 |      | 14      | 156240    | 279180 |
| Box2 | PH1   | 9720  | 0.6194 | 1    | 20      | 153180    | 284400 |
| Box2 | PH1   | 12960 | 0.5595 | 1    | 18      | 153180    | 298720 |
| Box3 | PH1   | 0     | 0.0781 | 1    | 2       | 370000    | 443700 |
| Box3 | PH1   | 3240  | 0.0475 |      | 1       | 390000    | 432360 |
| Box3 | PH1   | 6480  | 0.1397 |      | 4       | 300000    | 446580 |
| Box3 | PH1   | 9720  | 0.1397 |      | 4       | 300000    | 446580 |
| Box3 | PH1   | 12960 | 0.3197 |      | 10      | 300000    | 446580 |
| Box1 | PH1   | 0     | 0.5267 | 1    | 17      | 72000     | 77860  |
| Box1 | PH1   | 3240  | 1.0065 |      | 33      |           |        |
| Box1 | PH1   | 6480  | 0.6467 | 2    | 21      | 72000     | 77860  |
| Box1 | PH1   | 9720  | 0.7098 | 1    | 23      | 0         | 148500 |
| Box1 | PH1   | 12960 | 0.8898 | 1    | 29      | 0         | 150000 |
| Box1 | SC1   | 0     | 0.0166 | 1    |         | 73800     | 78860  |
| Box1 | SC1   | 3240  | 0.0521 |      | 5       | 55620     | 83700  |
| Box1 | SC1   | 6480  | 0.0310 |      | 2       | 56160     | 78860  |
| Box1 | SC1   | 9720  | 0.0378 |      | 3       | 67320     | 79380  |

| SPBox  | Clock | Cap pF | Bufs | Devices |
|--------|-------|--------|------|---------|
| EromBox | PH1  | 0.0300 | 1    | 1       |

| L2Box   | Clock | Cap pF | Bufs | L3 buffers |
|---------|-------|--------|------|------------|
| l2box1  | PH1_2 | 2.7040 | 4    | 11         |
| l2box1  | SC1_2 | 0.5640 | 1    | 1          |

We claim:

1. A method for assigning clock buffers to an integrated circuit, said integrated circuit including an area in which is placed a plurality of rows of standard cells, some of said standard cells receiving a clock signal as an input signal, said method comprising the steps of:

allocating within said area of said integrated circuit an assigned buffer area in which a plurality of clock buffers driving said clock signal can be placed, each of said clock buffers being associated with a preferred load;

for each row of said standard cells: (a) identifying those standard cells receiving said clock signal, (b) associating an input capacitance with each of said identified standard cells, (c) for each identified standard cell, deriving a wire capacitance associated with said identified standard cell by estimating a length of wire necessary to electrically couple said clock signal from said assigned buffer area to said identified standard cell, and (d) deriving a row capacitance by summing all of said input capacitances and said wire capacitances within said row of standard cells; and selecting, in a predetermined order, each row of said standard cells, and for said selected row of standard cells: (a) determining a window capacitance by summing row capacitances for selected rows of standard cells neighboring said selected row of standard cells, (c) determining a number of clock buffers to assign to said selected row of standard cells by dividing said window capacitance by said preferred load and a number derived from the number of said neighboring rows of standard cells, and (d) placing said number of clock buffers within said assigned buffer area.

2. A method as in claim 1, wherein said neighboring rows of standard cells are rows of standard cells within a predetermined window in which said selected row of standard cells is included.

3. A method as in claim 1, further comprising the step of providing a second wire running in the vicinity of said assigned buffer area, said second wire being provided to couple together output terminals of said clock buffer within said assigned buffer area, wherein said step of deriving a row capacitance includes a contribution by said second wire.

4. A method as in claim 1, wherein said integrated circuit includes a second area, said second area including a plurality of logic circuits receiving said clock signal, said method further comprising the steps of:

allocating within said second area a second assigned buffer area;

for each logic circuit within said second area: (a) estimating an input capacitance associated with said clock signal, and (b) estimating a wire capacitance of said logic circuit based on a length of wire needed to couple said clock signal from said second assigned buffer area to said logic circuit; and placing a number of clock buffer in said second assigned buffer area based on a quotient obtained by (a) obtaining a sum of said input capacitances of all said logic circuits and said wire capacitances of all said logic circuits, and (b) dividing said sum by said preferred load.

5. A method as in claim 1, wherein each of said clock buffers assigned in said assigned buffer area has an input capacitance, said method further including the steps of:

allocating in said integrated circuit a second assigned buffer area;

estimating a second wire capacitance based on a length of wire needed to couple said second assigned buffer area to said clock buffers; and placing a second number of clock buffers in said second assigned buffer area based on a quotient obtained by dividing the sum of said wire capacitance and said input capacitances of said clock buffers in said first assigned buffer area by said preferred load.

6. A method as in claim 5, wherein output terminals of said clock buffers in said second assigned buffer area are strapped together by wires.

7. A method as in claim 5, applied to a first clock signal and a second clock signal, such that a first set of clock buffers, corresponding to said first clock signal, and a second set of clock buffers, corresponding to said second clock signal, are placed in said first assigned buffer area, further comprising the step of routing a first wire and a second wire to couple said first clock signal and said second clock signal, respectively, from said second assigned clock buffer area to said first set of clock buffers, said first wire and said second wire being positioned in a predetermined order relative to a power rail of a row of standard cells in said first area.

8. An integrated circuit comprising:

a first set of clock buffers, each clock buffer of said first set of clock buffers having an input terminal and an output terminal;

a second set of clock buffers, each clock buffer of said second set of clock buffers having an input terminal and an output terminal, said output terminals of said first set of clock buffers being strapped by a wire to said input terminals of said second set of clock buffers; and a plurality of logic circuits, each logic circuit coupled to receive a clock signal from output terminals of said second set of clock buffers.

9. An integrated circuit as in claim 8, wherein said output terminals of said second set of clock buffers are strapped together by a second wire.

* * * * *